(«12») United States Patent
Buethe et al.

(10) Patent No.: US 12,057,133 B2
(45) Date of Patent: Aug. 6, 2024

(54) MULTI-MODE CHANNEL CODING

(71) Applicant: Fraunhofer-Gesellschaft zur Foerderung der angewandten Forschung e.V., Munich (DE)

(72) Inventors: Jan Buethe, Erlangen (DE); Conrad Benndorf, Erlangen (DE); Manfred Lutzky, Erlangen (DE); Markus Schnell, Erlangen (DE); Maximilian Schlegel, Erlangen (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

(21) Appl. No.: 18/312,853

(22) Filed: May 5, 2023

(65) Prior Publication Data

US 2023/0274750 A1 Aug. 31, 2023

Related U.S. Application Data

(63) Continuation of application No. 17/402,285, filed on Aug. 13, 2021, now Pat. No. 11,875,806, which is a
(Continued)

(30) Foreign Application Priority Data

Feb. 13, 2019 (EP) ..................................... 19156997
Feb. 13, 2019 (EP) ..................................... 19157036
(Continued)

(51) Int. Cl.
H03M 13/00 (2006.01)
G10L 19/022 (2013.01)
(Continued)

(52) U.S. Cl.
CPC .......... G10L 19/035 (2013.01); G10L 19/022 (2013.01); G10L 21/0324 (2013.01);
(Continued)

(58) Field of Classification Search
None
See application file for complete search history.

(56) References Cited

U.S. PATENT DOCUMENTS 5,148,271 A  9/1992 Kato et al.
5,712,861 A  1/1998 Inoue et al.
(Continued)

FOREIGN PATENT DOCUMENTS

CN  1343390 A  4/2002
CN  1732512 A  2/2006
(Continued)

OTHER PUBLICATIONS

3GPP, "Codec for Enhanced Voice Services (EVS)", General Overview. Technical specification, 2015.
(Continued)

*Primary Examiner* — Mujtaba M Chaudry
(74) *Attorney, Agent, or Firm* — Perkins Coie LLP; Michael A. Glenn

(57) ABSTRACT

A channel encoder for encoding a frame includes a multi-mode redundancy encoder for redundancy encoding the frame in accordance with a certain coding mode from a set of different coding modes, wherein the coding modes are different from each other with respect to an amount of redundancy added to the frame, wherein the multi-mode redundancy encoder is configured to output a coded frame including at least one code word; and a colorator for applying a coloration sequence to the at least one code word; wherein the coloration sequence is such that at least one bit of the code word is changed by the application of the at least
(Continued)

one of coloration sequence, wherein the specific coloration sequence is selected in accordance with the certain coding mode.

19 Claims, 23 Drawing Sheets

Related U.S. Application Data continuation of application No. PCT/EP2020/053614, filed on Feb. 12, 2020.

(30) Foreign Application Priority Data

| Feb. 13, 2019 | (EP) | ................................... 19157042 |
| Feb. 13, 2019 | (EP) | ................................... 19157047 |
| Jun. 11, 2019 | (WO) | ................ PCT/EP2019/065172 |
| Jun. 11, 2019 | (WO) | ................ PCT/EP2019/065205 |
| Jun. 11, 2019 | (WO) | ................ PCT/EP2019/065209 |

(51) Int. Cl.
 *G10L 19/035* (2013.01)
 *G10L 21/0324* (2013.01)
 *H03M 13/07* (2006.01)
 *H03M 13/15* (2006.01)
 *H04B 17/309* (2015.01)
 *H04L 1/00* (2006.01)

(52) U.S. Cl.
 CPC ....... *H03M 13/07* (2013.01); *H03M 13/1515* (2013.01); *H04B 17/309* (2015.01); *H04L 1/0009* (2013.01); *H04L 1/0032* (2013.01); *H04L 1/0042* (2013.01); *H04L 1/0045* (2013.01); *H04L 1/0046* (2013.01); *H04L 1/0084* (2013.01)

(56) References Cited

U.S. PATENT DOCUMENTS

| 5,852,469 | A | 12/1998 | Nagai et al. |
| 5,862,518 | A | 1/1999 | Nomura et al. |
| 6,256,064 | B1 | 7/2001 | Chujoh et al. |
| 6,256,487 | B1 | 7/2001 | Bruhn |
| 6,279,133 | B1* | 8/2001 | Vafai ............... G06F 11/1072 |
| | | | 714/763 |
| 6,301,558 | B1 | 10/2001 | Isozaki |
| 6,405,338 | B1 | 6/2002 | Sinha et al. |
| 6,975,254 | B1 | 12/2005 | Sperschneider et al. |
| 7,058,132 | B1 | 6/2006 | Sebire et al. |
| 7,266,750 | B1* | 9/2007 | Patapoutian ...... H03M 13/6325 |
| | | | 714/758 |
| 7,356,748 | B2 | 4/2008 | Taleb |
| 7,596,489 | B2 | 9/2009 | Kovesi et al. |
| 8,391,373 | B2 | 3/2013 | Virette et al. |
| 8,462,702 | B2 | 6/2013 | Jax et al. |
| 8,798,172 | B2 | 8/2014 | Oh et al. |
| 9,026,434 | B2 | 5/2015 | Greer et al. |
| 9,823,745 | B1* | 11/2017 | Fateh ..................... G06T 11/206 |
| 10,762,907 | B2 | 9/2020 | Tomasek et al. |
| 10,984,804 | B2 | 4/2021 | Lecomte et al. |
| 2002/0026616 | A1 | 2/2002 | Kikuchi et al. |
| 2002/0030612 | A1 | 3/2002 | Hetherington et al. |
| 2002/0072901 | A1 | 6/2002 | Bruhn |
| 2002/0080725 | A1 | 6/2002 | Bradley |
| 2002/0178418 | A1* | 11/2002 | Ramprashad ......... H03M 13/29 |
| | | | 714/790 |
| 2003/0106009 | A1 | 6/2003 | Jarchi et al. |
| 2004/0128128 | A1 | 7/2004 | Wang et al. |
| 2005/0163234 | A1 | 7/2005 | Taleb |
| 2006/0104366 | A1 | 5/2006 | Huang et al. |
| 2006/0271355 | A1 | 11/2006 | Wang et al. |
| 2007/0065425 | A1 | 3/2007 | Behrens et al. |
| 2007/0086058 | A1* | 4/2007 | Ordentlich ............. G06V 10/30 |
| | | | 358/3.26 |
| 2007/0121721 | A1 | 5/2007 | Kim et al. |
| 2007/0140359 | A1 | 6/2007 | Ehret et al. |
| 2007/0258651 | A1 | 11/2007 | Shin et al. |
| 2007/0271480 | A1 | 11/2007 | Oh et al. |
| 2007/0282600 | A1 | 12/2007 | Ojanpera |
| 2008/0071530 | A1 | 3/2008 | Ehara |
| 2008/0111719 | A1 | 5/2008 | Sperschneider et al. |
| 2008/0126096 | A1 | 5/2008 | Oh et al. |
| 2008/0126904 | A1 | 5/2008 | Sung et al. |
| 2008/0133242 | A1 | 6/2008 | Sung et al. |
| 2008/0301536 | A1 | 12/2008 | Shin et al. |
| 2009/0030675 | A1 | 1/2009 | Liebchen |
| 2009/0076807 | A1 | 3/2009 | Xu et al. |
| 2009/0209636 | A1 | 8/2009 | Raederstorff et al. |
| 2009/0281797 | A1 | 11/2009 | Zopf et al. |
| 2010/0023830 | A1 | 1/2010 | Wengerter et al. |
| 2010/0040153 | A1 | 2/2010 | Imanaka et al. |
| 2010/0080305 | A1 | 4/2010 | Guo et al. |
| 2010/0115370 | A1 | 5/2010 | Laaksonen et al. |
| 2011/0026848 | A1* | 2/2011 | Ordentlich ........... G06V 10/764 |
| | | | 382/275 |
| 2011/0075753 | A1 | 3/2011 | Jung et al. |
| 2011/0138258 | A1 | 6/2011 | Okamura et al. |
| 2011/0170711 | A1 | 7/2011 | Rettelbach et al. |
| 2011/0173009 | A1 | 7/2011 | Fuchs et al. |
| 2011/0191111 | A1 | 8/2011 | Chu et al. |
| 2011/0320901 | A1 | 12/2011 | Sato et al. |
| 2012/0271644 | A1 | 10/2012 | Bessette et al. |
| 2013/0187798 | A1 | 7/2013 | Marpe et al. |
| 2013/0254615 | A1 | 9/2013 | Vijayasankar et al. |
| 2013/0332152 | A1 | 12/2013 | Lecomte et al. |
| 2014/0012589 | A1 | 1/2014 | Oh et al. |
| 2014/0063062 | A1* | 3/2014 | Fateh ................... G02B 27/017 |
| | | | 345/633 |
| 2014/0142957 | A1 | 5/2014 | Sung et al. |
| 2014/0310010 | A1 | 10/2014 | Seo et al. |
| 2015/0142452 | A1 | 5/2015 | Sung et al. |
| 2015/0181194 | A1* | 6/2015 | Izawa .................. H04N 13/211 |
| | | | 348/49 |
| 2016/0171740 | A1 | 6/2016 | Yerli |
| 2016/0247506 | A1 | 8/2016 | Lecomte et al. |
| 2016/0266699 | A1 | 9/2016 | Zhao et al. |
| 2016/0285718 | A1 | 9/2016 | Bruhn |
| 2016/0322060 | A1 | 11/2016 | Riedmiller et al. |
| 2017/0004835 | A1 | 1/2017 | Schnabel et al. |
| 2017/0094295 | A1 | 3/2017 | Gu |
| 2017/0169833 | A1 | 6/2017 | Lecomte et al. |
| 2018/0026663 | A1 | 1/2018 | Wu et al. |
| 2018/0122386 | A1 | 5/2018 | Sung et al. |
| 2018/0234115 | A1* | 8/2018 | Noh ....................... H04L 1/0064 |
| 2018/0358023 | A1 | 12/2018 | Sasaki |
| 2019/0005965 | A1 | 1/2019 | Lecomte et al. |
| 2019/0005966 | A1 | 1/2019 | Lecomte et al. |
| 2019/0005967 | A1 | 1/2019 | Lecomte et al. |
| 2019/0051311 | A1 | 2/2019 | Sung et al. |

FOREIGN PATENT DOCUMENTS

| CN | 101174931 A | 5/2008 |
| CN | 101218630 A | 7/2008 |
| CN | 101261833 A | 9/2008 |
| CN | 101331733 A | 12/2008 |
| CN | 101569198 A | 10/2009 |
| CN | 102034478 A | 4/2011 |
| CN | 102057424 A | 5/2011 |
| CN | 102163430 A | 8/2011 |
| CN | 102165782 A | 8/2011 |
| CN | 103597544 A | 2/2014 |
| CN | 103688306 A | 3/2014 |
| CN | 104021769 A | 9/2014 |
| CN | 104885149 A | 9/2015 |
| CN | 107077851 A | 8/2017 |
| CN | 108711431 A | 10/2018 |
| CN | 108885875 A | 11/2018 |
| CN | 109155133 A | 1/2019 |

(56) References Cited

FOREIGN PATENT DOCUMENTS

| | | |
|---|---|---|
| CN | 109313905 A | 2/2019 |
| EP | 0170328 A1 | 2/1986 |
| EP | 0732855 A2 | 9/1996 |
| EP | 0798888 A2 | 10/1997 |
| EP | 0936772 A2 | 8/1999 |
| EP | 1155498 B1 | 3/2004 |
| EP | 2270777 A2 | 1/2011 |
| EP | 3011559 B1 | 7/2017 |
| EP | 3230980 A1 | 10/2017 |
| GB | 2253123 A | 8/1992 |
| IN | 201637013771 A | 8/2016 |
| JP | H04219033 A | 8/1992 |
| JP | H06202696 A | 7/1994 |
| JP | H06204983 A | 7/1994 |
| JP | H1022937 A | 1/1998 |
| JP | H11317675 A | 11/1999 |
| JP | 2998254 B2 | 1/2000 |
| JP | 2000123083 A | 4/2000 |
| JP | 2000227756 A | 8/2000 |
| JP | 3328093 B2 | 9/2002 |
| JP | 2003289539 A | 10/2003 |
| JP | 2005006289 A | 1/2005 |
| JP | 2006287551 A | 10/2006 |
| JP | 2009276890 A | 11/2009 |
| JP | 2009538460 A | 11/2009 |
| JP | 2010503352 A | 1/2010 |
| JP | 2010511201 A | 4/2010 |
| JP | 4841789 B2 | 10/2011 |
| JP | 2012242785 A | 12/2012 |
| JP | 5186054 B2 | 1/2013 |
| JP | 2017097326 A | 6/2017 |
| KR | 10-2001-0108051 A | 12/2001 |
| KR | 20060094105 A | 8/2006 |
| KR | 20060101889 A | 9/2006 |
| KR | 10-2007-0110311 A | 11/2007 |
| KR | 10-2015-0099615 A | 8/2015 |
| RU | 2239950 C2 | 11/2004 |
| RU | 2408089 C9 | 4/2011 |
| RU | 2610588 C2 | 2/2017 |
| TW | 200743838 A | 11/2007 |
| TW | 201116058 A | 5/2011 |
| TW | 201248616 A | 12/2012 |
| TW | 201521016 A | 6/2015 |
| TW | 201528255 A | 7/2015 |
| TW | 201539433 A | 10/2015 |
| TW | 201724085 A | 7/2017 |
| TW | 201813322 A | 4/2018 |
| WO | 9711535 A1 | 3/1997 |
| WO | 03065755 A1 | 8/2003 |
| WO | 2005086436 A1 | 9/2005 |
| WO | 2007008007 A1 | 1/2007 |
| WO | 2007084475 A2 | 7/2007 |
| WO | 2010000303 A1 | 1/2010 |
| WO | 2010088625 A1 | 8/2010 |
| WO | 2010103607 A1 | 9/2010 |
| WO | 2011103678 A1 | 9/2011 |
| WO | 2012141486 A2 | 10/2012 |
| WO | 2012158159 A1 | 11/2012 |
| WO | 2014072260 A2 | 5/2014 |
| WO | 2016091893 A1 | 6/2016 |
| WO | 2017153006 A1 | 9/2017 |
| WO | 2017153299 A2 | 9/2017 |

OTHER PUBLICATIONS

3GPP TS 26.441, "Codec for Enhanced Voice Services (EVS); General Overview", 3GPP TS 26.441 V13.0.0 (Dec. 2015), Dec. 2015, 12 pp.
Boltze, Thomas, et al., "Audio services and applications 1 of 2", International Symposium on Digital Audio Broadcasting, No. ED. 2, XP003011836, pp. 75-125.
Boltze, Thomas, et al., "Audio services and applications 2 of 2", International Symposium on Digital Audio Broadcasting, No. ED. 2, XP003011836, pp. 75-125.
ETSI ES, "Digital Radio Mondiale; System Specification", ETSI ES 201 980 v.4.1.1 (Jan. 2014), Jan. 2014, 195 pp.
ETSI Standard, "[Uploaded in 13 parts] Digital Radio Mondiale; System Specification", ETSI ES 201 980 V4.1.1 (Jan. 2014) (195 pp.), Jan. 2014, pp. 1-14.
ETSI TR, "ETSI TR 103590 V1.1.1 (Sep. 2018), "Digital Enhanced Cordless Telecommunications (DECT)", Study of Super Wideband Codec in DECT for narrowband, wideband and super-wideband audio communication including options of low delay audio connections (lower than 10 ms framing)", Sep. 2018.
ETSI TS 102 563, "Digital Audio Broadcasting (DAB)", Transport of Advanced Audio Coding (AAC) Audio, ETSI vol. BROADCAS, No. V1.2.1, May 1, 2010, XP014046351, May 2010.
Fairhurst, G, et al., "Smart Codec: an Adaptive Packet Data Link", IEE Proceedings: Communications, Institution of Electrical Engineers, GB, (Jun. 1, 1998), XP000766291, vol. 145, No. 3, pp. 180-185.
Hoeve, H, et al., "Fehlerkorrektur im Compact Disc Digital Audio-System", NTZ Nachrichtentechnische Zeitschrift, VDE Verlag GmbH, vol. 36, No. 7, XP009521920, pp. 446-448.
ISO/IEC, "Part 1 of 3—Information technology Coding of audio-visual objects, Part 3: Audio", ISO/IEC 14496-3—MPEG-4 Information technology, Standard, International Organization for Standardization, Geneva, CH, 2009, 1416 pp.
ISO/IEC, "Part 2 of 3—Information technology Code of audio-visual objects, Part 3: Audio", ISO/IEC 14496-3—MPEG-4 Information technology, Standard, International Organization for Standardization, Geneva, CH, 2009.
ISO/IEC, "Part 3 of 3—Information technology Coding of audio-visual objects, Part 3: Audio", ISO/IEC 14496-3—MPEG-Information technology, Standard, International Organization for Standardization, Geneva, CH, 2009.
Jacaba, Joebert S, "Audio Compression Using Modified Discrete Cosine Transform—The MP3 Coding Standard—1 of 2", Undergraduate research paper, XP055359704, 2001, pp. 1-83.
Jacaba, Joebert S, "Audio Compression Using Modified Discrete Cosine Transform—The MP3 Coding Standard—2 of 2", Undergraduate research paper, XP055359704, 2001, pp. 1-83.
Kamamoto, Yutaka, et al., "Trend of High sound quality audio coding technology for VOLTE", Journal of the Acoustic Society of Japan, vol. 74, No. 2, with English translation, pp. 83-92.
Lauber, Pierre, et al., "Error Concealment for Compressed Digital Audio", in Audio Engineering Society, XP008075936.
Moon, Todd K, "Error Correction Coding: Mathematical Methods and Algorithms", Wiley-Interscience, 2005, 2005, 39 pp.
Perkins, Colin, et al., "A Survey of Packet Loss Recovery Techniques for Streaming Audio", IEEE vol. 12, No. 5, XP000875014, pp. 40-48.
RäMö, Anssi, et al., "EVS Channel Aware Mode Robustness to Frame Erasures", in Interspeech 2016, San Francisco, CA, USA.
Rose, Kenneth, et al., "A Frame Loss Concealment Technique for MPEG-AAC", AES Convention 120, XP040507556.
Rose, Kenneth, et al., "Frame Loss Concealment for Audio Decoders Employing Spectral Band Replication", AEL Convention 121, XP040507885.
Sperschneider, Ralph, et al., "Error Resilient Source Coding with Differential Variable Length Codes and its Application to MPEG Advance Audio Coding", Audio Engineering Socieety, Munich, 2002, 19 pp.
Taleb, Anisse, et al., "Partial Spectral Loss Concealment in Transform Coders", IEEE Conference on Acoustics, Speech, And Signal Processing, vol. 3, XP010792360, pp. 185-188.
Venkatraman, A, et al., "Improved Error Resilience for VoLTE and VoIP with 3GPP EVS Channel Aware Coding", in ICASSP.
ETSI TS 102 563 V1.1.1, Digital Audio Broadcasting (DAB) Transport of Advanced Audio Coding (AAC) audio (Feb. 2007) (26 pages).
ETSI TS 102 563 digital audio broadcasting DAB: transport of advanced audio coding (AAC) audio Technical Specification; May 2010.
ETSI TS 102 563 V1.1.1, Digital Audio Broadcasting (DAB) Transport of Advanced Audio Coding (AAC) audio (Feb. 2007).

(56) References Cited

OTHER PUBLICATIONS

"Digital Audio Broadcasting (DAB) Transport of Advanced Audio Coding (AAC) audio", ETSI TS 102 563 V1.1.1, Feb. 2007.
Dun, Yujie, et al., "An extrapolation method for MDCT domain frame loss concealment", 2014 IEEE China Summit & International Conference on Signal and Information Processing (ChinaSIP). IEEE, 2014, pp. 650-654 (Year: 2014).

* cited by examiner

MULTI-MODE CHANNEL CODING

CROSS-REFERENCES TO RELATED APPLICATIONS

This application is a continuation of copending U.S. patent application Ser. No. 17/402,285 filed Aug. 13, 2021, which claims priority to International Application No. PCT/EP2020/053614, filed Feb. 12, 2020, which is incorporated herein by reference in its entirety, and additionally claims priority from European Applications Nos. EP 19156997.9, filed Feb. 13, 2019, EP 19157036.5, filed Feb. 13, 2019, EP 19157042.3, filed Feb. 13, 2019, EP 19157047.2, filed Feb. 13, 2019, International Application Nos. PCT/EP2019/065205, filed Jun. 11, 2019, PCT/EP2019/065209, filed Jun. 11, 2019, and PCT/EP2019/065172, filed Jun. 11, 2019, all of which are incorporated herein by reference in their entirety.

The present application is concerned with multi-mode channel coding.

BACKGROUND OF THE INVENTION

In a digital communication, a channel coding (also referred to as error correction coding) is used for controlling errors in data over unreliable or noisy communication channels, and therefore, channel coding has become an essential part in digital communication. The aim of channel coding is to protect the information against disturbances during transmission. Thereby redundancy is added for error correction and for error detection, i.e., redundancy is added to a sequence of data packets, e.g., frames of an audio/video coder, that are sent over an error-prone channel to allow for a certain amount of transmission error correction at the receiver side. The error correction capability correlates with the redundancy rate, meaning that a higher error correction capability usually comes with a higher amount of redundancy.

In the context of audio data frames three effects have to be considered:
1. The same frame of audio data can usually be encoded with a flexible amount of bits, where the audio quality scales with the bitrate.
2. Lost frames can be concealed as the transmitted data exhibits a temporal structure, which comes with a certain amount of degradation that grows with the frame error rate (FER).
3. Packet Loss Concealment (PLC) methods usually give much better results than decoding of undetected bad frames.

Hence, channel coding is therefore very attractive for audio data as it may increase the audio quality by
  detecting bad frames (PLC instead of bad frame decoding),
  correcting bad frames (reducing the FER).

However, the positive effects are only observed in the presence of errors while the negative impact of the reduced data rate is present at all times. Furthermore, the signal strength of wireless networks such as the DECT (Digital Enhanced Cordless Telecommunication) system usually varies during the duration of a connection, i.e., for a phone call where the speaker moves around while speaking or due to external temporal disturbances. It is therefore suboptimal to apply a fixed forward error correction (FEC) scheme over the course of a connection. Instead, it is rather desirable to have a flexible channel coder providing a multitude of FEC modes varying from low protection and high data rate to high protection and low data rate (assuming the total rate, i.e., sum of data rate and redundancy rate, to be fixed).

From the audio codec perspective, such a switchable system does not impose a big challenge, as modern audio codecs usually support on the fly bitrate switching for speech and audio signals. But it imposes the technical problem of signaling the FEC mode on a frame basis. For easy integration into existing systems, the FEC mode should be signaled in-band. If this is done explicitly, this also reduces the data rate. Furthermore, the mode signaling will also be exposed to transmission errors and will not be protected by the error correcting codes as the channel decoder involves the knowledge of the mode before being able to decode the encoded data. It would therefore be useful to protect the FEC mode separately in order to avoid having an Achilles' heel to the FEC scheme, which again decreases the data rate for the audio frame.

A well-known channel coder for audio data is the EP (Error Protection) tool specified in MPEG-4 Part 3 (Information technology—Coding of audio-visual objects—Part 3: Audio Standard, International Organization for Standardization, Geneva, CH 2009). It features a multitude of protection classes ranging from error detection to the FEC schemes of different strengths. It also features flexible frame architectures and unequal error protection (UEP). The basic idea of UEP is to divide the frame into sub-frames according to the bit error sensitivities, and to protect these sub-frames with appropriate strength of FEC and/or cyclic redundancy check (CRC). In order to apply UEP to audio frames, information, at least a) number of classes, b) number of bits each class contains, c) the CRC code to be applied for each class, which can be presented as a number of CRC bits, and d) the FEC code to be applied for each class as frame configuration parameters is useful. As explained above, UEP involves both out-of-bands signaling of the basic configuration as well as a significant amount of configuration parameters that are signaled in-band. The in-band configuration parameters are furthermore protected separately from the data as they are needed prior to data decoding.

SUMMARY

According to an embodiment, a channel encoder for encoding a frame may have: a multi-mode redundancy encoder for redundancy encoding the frame in accordance with a certain coding mode from a set of different coding modes, wherein the multi-mode redundancy encoder is configured to be capable of encoding the frame using each coding mode in the set, wherein the coding modes are different from each other with respect to an amount of redundancy added to the frame, wherein the multi-mode redundancy encoder is configured to output a coded frame having at least one code word; and a colorator for applying a coloration sequence to the at least one code word; wherein the coloration sequence is such that at least one bit of the code word is changed by the application of the at least one of coloration sequence, wherein the colorator is configured to select the specific coloration sequence in accordance with the certain coding mode, wherein the channel encoder may further have: a data splitter for splitting the frame into a plurality of data words, wherein the multi-mode redundancy encoder is configured to encode each of the plurality of data words according to the certain coding mode to acquire a plurality of code words, wherein the colorator is configured to apply the specific coloration sequence to each code word in a predefined number of the code words or in a predefined subset of the plurality of code words.

According to another embodiment, a channel decoder for channel decoding at least one transmitted code word may have: a colorator for applying at least one coloration sequence to the at least one transmitted code word or to an error corrected at least one transmitted code word to acquire at least one colored code word, wherein the coloration sequence is such that at least one bit of the code word is changed by the application of the at least one coloration sequence, and wherein the at least one coloration sequence is associated to a certain decoding mode as a specific coloration sequence; a redundancy decoder for redundancy decoding the at least one colored code word to acquire a decoded output code word; and a decoding mode detector for generating a decoding mode indicator indicating the certain decoding mode to be used by the redundancy decoder to acquire the decoded output code word, wherein the decoding mode indicator is associated to the at least one coloration sequence as the specific coloration sequence used for the coloration of the transmitted code word, wherein the colorator is configured to use, in addition to the coloration sequence, at least a further coloration sequence, or wherein the channel decoder is configured to bypass the colorator in a further decoding mode without any coloration; wherein the redundancy decoder is configured to redundancy decode an additional at least one colored code word colored using the further coloration sequence, to acquire a further decoded code word, the further colored code word which acquired from the transmitted code word using the further coloration sequence, or the transmission code word without coloration to acquire an even further decoded code word, and wherein the redundancy decoder is configured to output a reliability measure for the decoded code word, a further reliability measure for the further decoded code word or an even further reliability measure for the even further code word, wherein the decoding mode detector is configured to determine, based on the reliability measures, the decoding mode indicator, and wherein the redundancy decoder is configured to receive the decoding mode indicator and to output as the decoded output code word, either the decoded code word, the further decoded code word, or the even further decoded code word, wherein the colorator is configured to perform the coloration operation with the same coloration sequence to a predetermined number of the transmitted code words to acquire a predetermined number of the colored code words, and to perform the further coloration operation with the same further coloration sequence to a further predetermined number of the transmitted code words to acquire a predetermined number of the further colored code words, wherein the redundancy decoder is configured to determine the reliability measure deriving the predetermined number of the decoded code word, the further reliability measure deriving the predetermined number of the further decoded code word, or the even further reliability measure deriving the predetermined number of the decoded code word.

According to yet another embodiment, a channel decoder for channel decoding at least one transmitted code word may have: a colorator for applying at least one coloration sequence to the at least one transmitted code word or to an error corrected at least one transmitted code word to acquire at least one colored code word, wherein the coloration sequence is such that at least one bit of the code word is changed by the application of the at least one coloration sequence, and wherein the at least one coloration sequence is associated to a certain decoding mode as a specific coloration sequence; a redundancy decoder for redundancy decoding the at least one colored code word to acquire a decoded output code word; and a decoding mode detector for generating a decoding mode indicator indicating the certain decoding mode to be used by the redundancy decoder to acquire the decoded output code word, wherein the decoding mode indicator is associated to the at least one coloration sequence as the specific coloration sequence used for the coloration of the transmitted code word, wherein the decoding mode detector is configured to store a candidate list indicating a predetermined number of candidate decoding modes, wherein one candidate decoding mode is indicated without any coloration sequence and the other respective candidate decoding modes are indicated in association with a coloration sequence, and to select one candidate decoding mode as a certain decoding mode to be used by the redundancy decoder to acquire the decoded output code word to be used, wherein the decoding mode detector is configured to perform a first decoding mode operation and a second decoding mode operation, wherein the decoding mode detector for performing the first decoding mode operation is configured to estimate the certain decoding mode being the candidate decoding mode without coloration sequence, to calculate syndromes of the code word, to check whether the calculated syndromes have value zero, when the calculated syndromes have value zero, to calculate a hash value of the transmitted code word, to compare the calculated hash value and a hash value included in the transmitted code word, and when the calculated hash value is equal to the included hash value, to generate the decoding mode indicator to indicate the candidate coding mode without coloration sequence as the certain decoding mode, or when the calculated hash value is different from the included hash value, to exclude the candidate decoding mode without coloration sequence from the candidate list, and to proceed further with the second decoding mode operation.

According to still another embodiment, a method for encoding a frame may have the steps of: multi-mode redundancy encoding the frame in accordance with a certain coding mode from a set of different coding modes, wherein the coding modes are different from each other with respect to an amount of redundancy added to the frame, outputting at least one code word; applying a coloration sequence to the at least one code word; wherein the coloration sequence is such that at least one bit of the code word is changed by the application of the at least one coloration sequence, wherein a colorator is configured to select the specific coloration sequence in accordance with the certain coding mode, and splitting the frame into a plurality of data words, wherein the multi-mode redundancy encoder is configured to encode each of the plurality of data words according to the certain coding mode to acquire a plurality of code words, wherein the specific coloration sequence is applied to each code word in a predefined number of the code words or in a predefined subset of the plurality of code words.

According to still another embodiment, a method for channel decoding at least one transmitted code word may have the steps of: applying at least one coloration sequence to the at least one transmitted code word to acquire at least one colored code word, wherein the coloration sequence is such that at least one bit of the code word is changed by the application of the at least one coloration sequence, wherein the at least one coloration sequence is associated to a certain decoding mode, redundancy decoding the at least one colored code word to acquire a decoded output code word, generating a decoding mode indicator indicating a certain decoding mode to be used by the redundancy decoder to acquire the decoded output code word, wherein the decoding mode indicator is associated to the at least one coloration sequence used for the coloration of the colored code word, using, in addition to the coloration sequence, at least a further coloration sequence, or wherein the channel decoder is configured to bypass the colorator in a further decoding mode without any coloration; redundancy decoding an additional at least one colored code word colored using the further coloration sequence, to acquire a further decoded code word, the further colored code word which acquired from the transmitted code word using the further coloration sequence, or the transmission code word without coloration to acquire an even further decoded code word, outputting a reliability measure for the decoded code word, a further reliability measure for the further decoded code word or an even further reliability measure for the even further code word, determining the decoding mode indicator based on the reliability measures, and outputting as the decoded output code word, either the decoded code word, the further decoded code word, or the even further decoded code word based on the reliability measure.

According to another embodiment, a method for channel decoding at least one transmitted code word may have the steps of: applying at least one coloration sequence to the at least one transmitted code word to acquire at least one colored code word, wherein the coloration sequence is such that at least one bit of the code word is changed by the application of the at least one coloration sequence, wherein the at least one coloration sequence is associated to a certain decoding mode, redundancy decoding the at least one colored code word to acquire a decoded output code word, generating a decoding mode indicator indicating a certain decoding mode to be used by the redundancy decoder to acquire the decoded output code word, wherein the decoding mode indicator is associated to the at least one coloration sequence used for the coloration of the colored code word, storing a candidate list indicating a predetermined number of candidate decoding modes, wherein one candidate decoding mode is indicated without any coloration sequence and the other respective candidate decoding modes are indicated in association with a coloration sequence, and to select one candidate decoding mode as a certain decoding mode to be used by the redundancy decoder to acquire the decoded output code word to be used, wherein determining process includes a first decoding mode operation and a second decoding mode operation, wherein a first decoding mode operation includes: estimating the certain decoding mode being the candidate decoding mode without coloration sequence, calculating syndromes of the code word, checking whether the calculated syndromes have value zero, and when the calculated syndromes have value zero, calculating a hash value of the transmitted code word, comparing the calculated hash value and a hash value included in the transmitted code word, wherein the determining process includes: receiving a result of the comparison between the calculated hash value and the included hash value, when the calculated hash value is equal to the included hash value, generating the decoding mode indicator to indicate the candidate coding mode without coloration sequence as the certain decoding mode, or when the calculated hash value is different from the included hash value, excluding the candidate decoding mode without coloration sequence from the candidate list, and to proceed further with the second decoding mode operation.

According to yet another embodiment, a non-transitory digital storage medium may have a computer program stored thereon to perform any of the inventive methods, when said computer program is run by a computer.

Still another embodiment may have a data stream generated by any of the inventive methods.

According to the present invention, a channel encoder comprises a colorator for applying a coloration sequence to at least one code word, i.e., the code word includes information/indication of the coding mode. Therefore, transmission bits used for indicating the coding mode to a channel decoder is not necessary, and hence, the transmission rate is improved and it is possible to transmit the code word efficiently. In addition, the information/indication of the coding mode is included in the code word by applying the coloration sequence which is selected in accordance with the coding mode, and hence, it is possible to provide error resilient mode signaling.

According to the present invention, a channel decoder receives at least one transmitted code word, i.e., the code word including the information/indication of the coding mode (decoding mode). That is, the information/indication of the coding mode is distributed in the code word by applying the coloration sequence, and therefore, the information/indication of the coding mode is received at the channel decoder in the error resilient way. In addition, the channel decoder comprises a decoding mode detector for generating a decoding mode indicator indicating the certain decoding mode to be used for redundancy decoding, and the decoding mode indicator is associated to the at least one coloration sequence as the specific coloration sequence used for the coloration of the transmitted code word. Therefore, it is possible to detect the decoding mode by determining the specific coloration sequence, i.e., the channel decoder is able to determine the decoding mode without separately receiving specific information of the decoding mode. Hence, data transmission ratio is improved.

In accordance with embodiments of the present application, a channel encoder for encoding a frame, comprising: a multi-mode redundancy encoder for redundancy encoding the frame in accordance with a certain coding mode from a set of different coding modes, wherein the coding modes are different from each other with respect to an amount of redundancy added to the frame, wherein the multi-mode redundancy encoder is configured to output a coded frame including at least one code word; and a colorator for applying a coloration sequence to the at least one code word; wherein the coloration sequence is such that at least one bit of the code word is changed by the application of the at least one of coloration sequence, wherein the specific coloration sequence is selected in accordance with the certain coding mode.

In accordance with embodiments of the present application, the channel coding may be changed each frame based on an indication of a mode selection. The indication includes mode selection and coloration sequence to be applied or indication of bypassing the coloration sequence.

In accordance with embodiments of the present application, the channel encoder further comprises a data splitter for splitting the frame into a plurality of data words, wherein the multi-mode redundancy encoder is configured to encode each of the plurality of data words according to the certain coding mode to obtain a plurality of code words, wherein the colorator is configured to apply the specific coloration sequence to each code word in a predefined subset of the plurality of code words. That is, the redundancy rate can be different for different data words, i.e., redundancy rate can be different for each data word. In addition, a length of the data word included in the code word is changed based on the calculated number of the code words and also based on the code word index.

In accordance with embodiments of the present application, a channel decoder for channel decoding at least one transmitted code word, comprising: a colorator for applying at least one coloration sequence to the at least one transmitted code word or to at least one error corrected transmitted code word to obtain at least one colored code word, wherein the coloration sequence is such that at least one bit of the code word is changed by the application of the at least one coloration sequence, and wherein the at least one coloration sequence is associated to a certain decoding mode as a specific coloration sequence; a redundancy decoder for redundancy decoding the at least one colored code word to obtain a decoded output code word; and a decoding mode detector for generating a decoding mode indicator indicating the certain decoding mode to be used by the redundancy decoder to obtain the decoded output code word, wherein the decoding mode indicator is associated to the at least one coloration sequence as the specific coloration sequence used for the coloration of the transmitted code word. That is, to a plurality of transmitted code words are applied different coloration sequences (de-coloration) and (de)colored words are decoded by using different decoding modes and one of the used decoding modes is selected as a certain decoding mode based on the test result.

In accordance with embodiments of the present application, the redundancy decoder comprises a bit number reducer for reducing the bit number of the colored code word and an error corrector for correcting an error of the colored word, or the channel decoder further comprises an error corrector for correcting an error of the transmitted code word. That is, in case there is an error in the transmitted code words, the error correction process is operated in a part of the decoding process at the redundancy decoder, or error correction process is operated before applying the (de) coloration independently from the redundancy decoder.

In accordance with embodiments of the present application, the colorator is configured to use, in addition to the coloration sequence, at least a further coloration sequence, or wherein the channel decoder is configured to bypass the colorator in a further decoding mode without any coloration, e.g., the coloration sequence has only zero as values; wherein the redundancy decoder is configured to redundancy decode an additional at least one colored code word colored using the further coloration sequence, to obtain a further decoded code word, the further colored code word which obtained from the transmitted code word using the further coloration sequence, or the transmission code word without coloration to obtain an even further decoded code word, and wherein the redundancy decoder is configured to output a reliability measure for the decoded code word, a further reliability measure for the further decoded code word or an even further reliability measure for the even further code word, e.g., the reliability measure is calculated for each decoded code word using a different coloration sequence and decoding mode, wherein the decoding mode detector is configured to determine, based on the reliability measures, the decoding mode indicator, and wherein the redundancy decoder is configured to receive the decoding mode indicator and to output as the decoded output code word, either the decoded code word, the further decoded code word, or the even further decoded code word. That is, in case there is an error in the transmitted code word, then, the reliability measure, e.g., risk value (reliability measure) is calculated and the decoded mode used for the decoded code word having the smallest risk value is selected as the certain decoding mode.

In accordance with embodiments of the present application, the decoding mode detector is configured to store a candidate list indicating a predetermined number of candidate decoding modes, wherein one candidate decoding mode may be indicated without any coloration sequence or all candidate decoding modes are associated with a coloration sequence, and to select one candidate decoding mode as a certain decoding mode to be used by the redundancy decoder to obtain the decoded output code word to be used, wherein the decoding mode detector is configured to perform a first decoding mode operation and a second decoding mode operation, wherein the decoding mode detector for performing the first decoding mode operation is configured to estimate the certain decoding mode being the candidate decoding mode without coloration sequence, i.e., before the hash is evaluated whether the first code word is un-colored, to calculate syndromes of the code word, to check whether the calculated syndromes have value zero, and when the calculated syndromes have value zero, to calculate a hash value of the transmitted code word, to compare the calculated hash value and a hash value included in the transmitted code word, when the calculated hash value is equal to the included hash value, to generate the decoding mode indicator to indicate the candidate coding mode without coloration sequence as the certain decoding mode, or when the calculated hash value is different from the included hash value, to exclude the candidate decoding mode without coloration sequence from the candidate list, and to proceed further with the second decoding mode operation. That is, the decoding mode detector performs two operations, e.g., the decoding mode detector comprises a first decoding mode detector for performing the first decoding mode operation and a second decoding mode detector for performing the second decoding mode operation, and in case the certain decoding mode is not selected in the first decoding mode operation, the selection process proceeds further with the second decoding mode operation. Therefore, if there is no error in the transmitted code words and the mode associated with no coloration sequence was used at the encoder, it is not necessary to proceed further, and hence, the certain decoding mode is efficiently selected.

In accordance with embodiments of the present application, in the second decoding mode operation, an error of the transmitted code word is detected by using a syndrome, an error symbol is calculated using an error locator polynomial, and the error symbol is corrected. During the procedure, in case the detected errors are not correctable, then the decoding mode associated with the coloration sequence applied to the transmitted word including the uncorrectable error is excluded from the candidate list. In addition, in case the error locator polynomial for the transmitted word having the correctable error is not able to be determined, then, the further decoding mode is excluded from the candidate list. That is, the listed candidate decoding modes are excluded step by step and the remaining decoding mode on the list is selected as the certain decoding mode at the end. Hence, the certain decoding mode is reliably selected when considering the risk of error occurrence.

In advantageous embodiments of the present application, the FEC mode is signaled by modifying well-known linear codes in such a way that the redundancy rate is efficient while the decoder is able to determine the FEC mode by partial trial decoding. This zero byte implicit signaling is deterministic if no transmission errors occur and otherwise finds the correct mode with high probability, i.e., the frame loss due to signaling errors is negligible compared to the frame loss due to uncorrectable frames. More specifically, it is concerned with a (FEC) scheme that provides a multitude of $N_{mode}$ modes for encoding data sequences into code sequences of a given length $N_{target}$. Here, for simplicity binary sequences are assumed, but a similar scheme would also apply to the general case where data symbols are elements in any field, for example, finite Galois field.

BRIEF DESCRIPTION OF THE DRAWINGS

Embodiments of the present invention will be detailed subsequently referring to the appended drawings, in which.

DETAILED DESCRIPTION OF THE INVENTION

Figure 1:
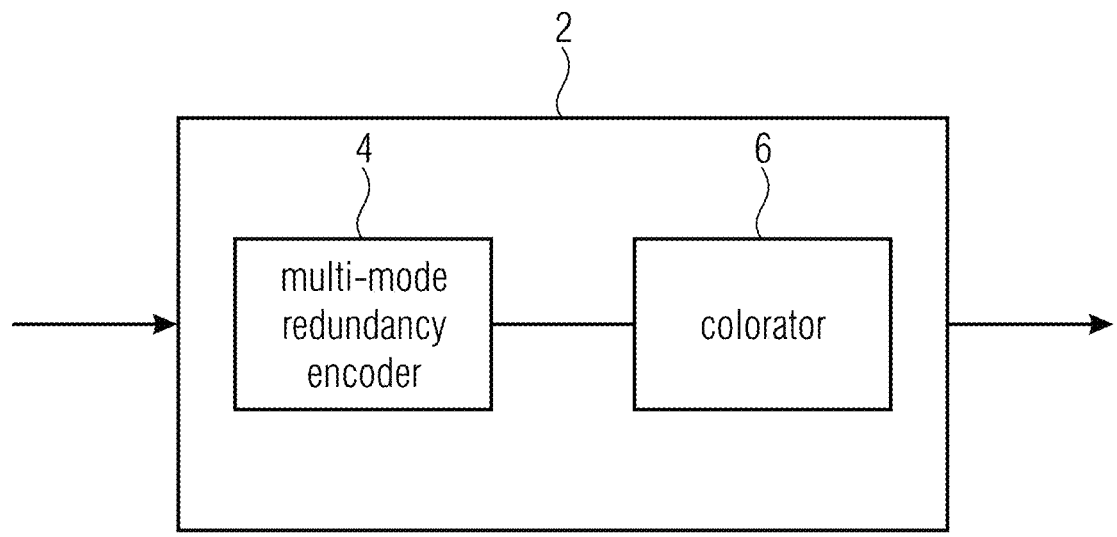
FIG. 1 shows a block diagram illustrating an example of a channel encoder for encoding a frame to be transmitted according to embodiments of the present application.

Equal or equivalent elements or elements with equal or equivalent functionality are denoted in the following description by equal or equivalent reference numerals.

In the following description, a plurality of details is set forth to provide a more thorough explanation of embodiments of the present application. However, it will be apparent to one skilled in the art that embodiments of the present application may be practiced without these specific details. In other instances, well-known structures and devices are shown in block diagram form rather than in detail in order to avoid obscuring embodiments of the present application. In addition, features of the different embodiments described hereinafter may be combined with each other, unless specifically noted otherwise.

Figure 2:
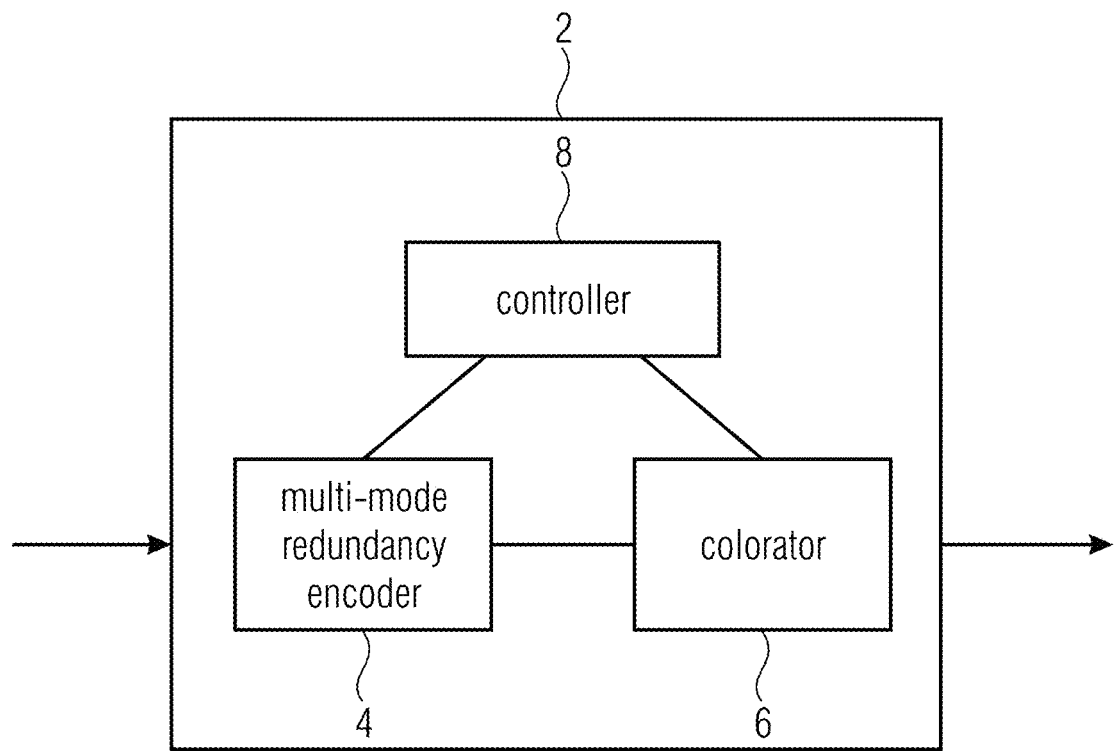
FIG. 2 shows a block diagram illustrating an example of another channel encoder for encoding a frame to be transmitted according to embodiments of the present application.

FIG. 1 illustrates an embodiment of channel encoder 2 for encoding a frame, comprising a multi-mode redundancy encoder 4 for redundancy encoding the frame in accordance with a certain coding mode from a set of different coding modes, and a colorator 6 for applying a coloration sequence to the at least one code word. FIG. 2 illustrates another example of channel encoder 2 further comprising a controller 8 for providing coding criteria, e.g., redundancy rate of the frame, useful data protection (certain coding mode, data length, target size $N_{target}$, number of data words consisting the frame and so on. In case the channel encoder 2 does not include the controller 8 as indicated in FIG. 1, the coding criteria is provided associated with the frame to the multi-mode redundancy encoder 4. As an option, the channel encoder 2 also includes hash extension to calculate a hash value of the frame to be transmitted.

In a further embodiment, for example, a frame of an audio data is provided to the channel encoder 2. In case the controller 8 is not included in the channel encoder 2 (as shown in FIG. 1), the frame of the audio data is associated with an indication of the target size $N_{target}$ and the certain coding mode $m_{fec}$. Then, the provided frame is encoded at the multi-mode redundancy encoder 4, and a plurality of code words is outputted from the multi-mode redundancy encoder 4. The outputted code words are provided to the colorator 6 and at least one code word of the outputted code words is colored by applying a specific coloration sequence $\text{sig}_m$ which is selected in accordance with the certain coding mode $m_{fec}$. Regarding the coloration sequence, when the value of the coloration sequence is zero, then coloration is bypassed for the code words. That is, for example, a coding mode $m_{fec}=1$ is associated to the coloration sequence $\text{sig}_1$ having the zero value, i.e., the coloration sequence $\text{sig}_1$ is a zero sequence, and therefore, the coloration for the code words encoded by the coding mode $m_{fec}=1$ is bypassed.

Figure 3:
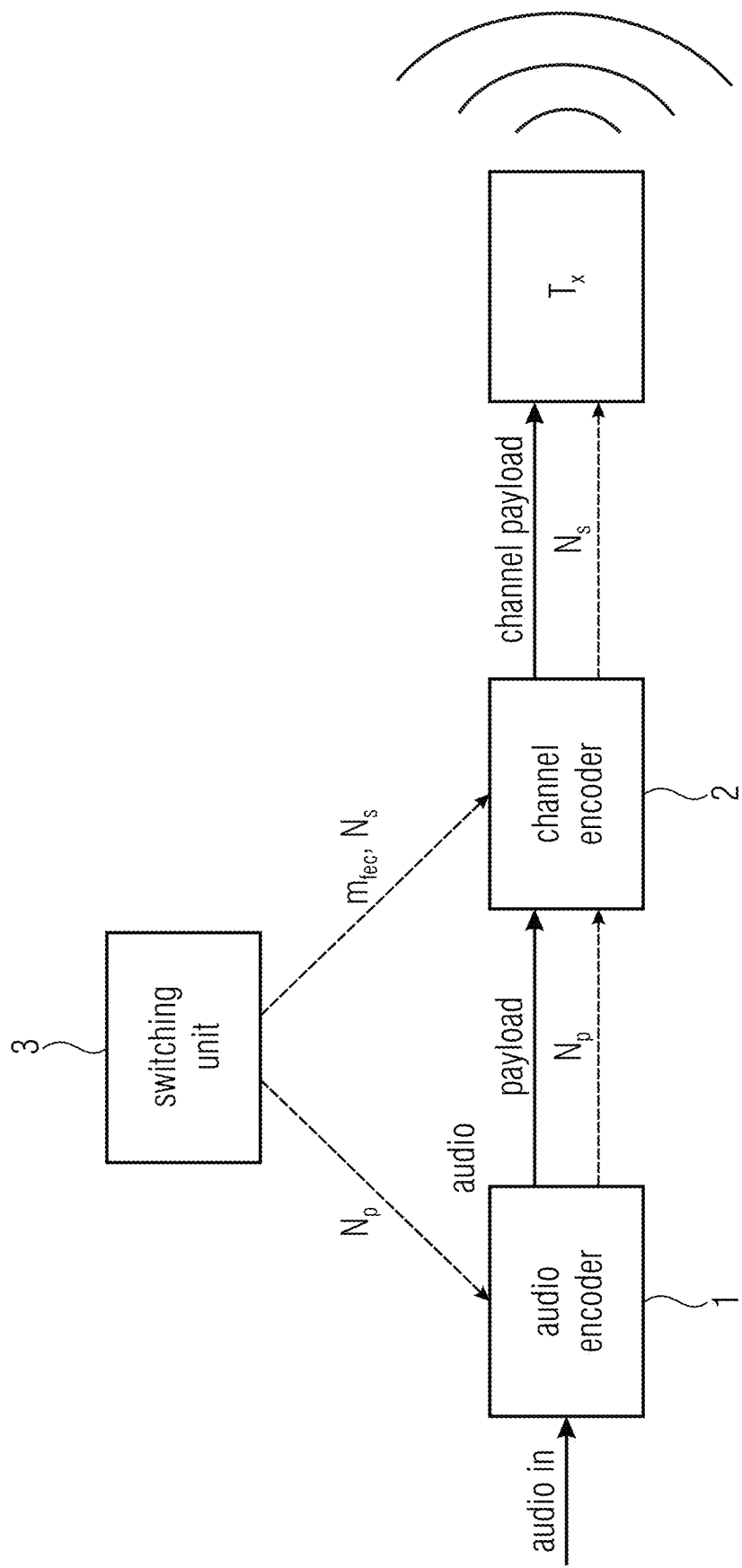
FIG. 3 shows a block diagram illustrating an example of an encoder including a channel encoder for encoding a frame to be transmitted according to embodiments of the present application.

FIG. 3 shows an example of an encoder including a channel encoder according to an embodiment of the present application. The encoder comprises an audio encoder 1, the channel encoder 2 and a switching unit 3. The audio encoder 1 is configured to encode input audio data and the channel encoder 2 is configured to encode the channel according to the indicated mode. The switching unit 3 provides the audio encoder 1 with payload size $N_p$ and the channel encoder 2 with FEC mode and slot size $N_s$. As shown in FIG. 3, the encoder outputs the encoded frame.

Figure 4:
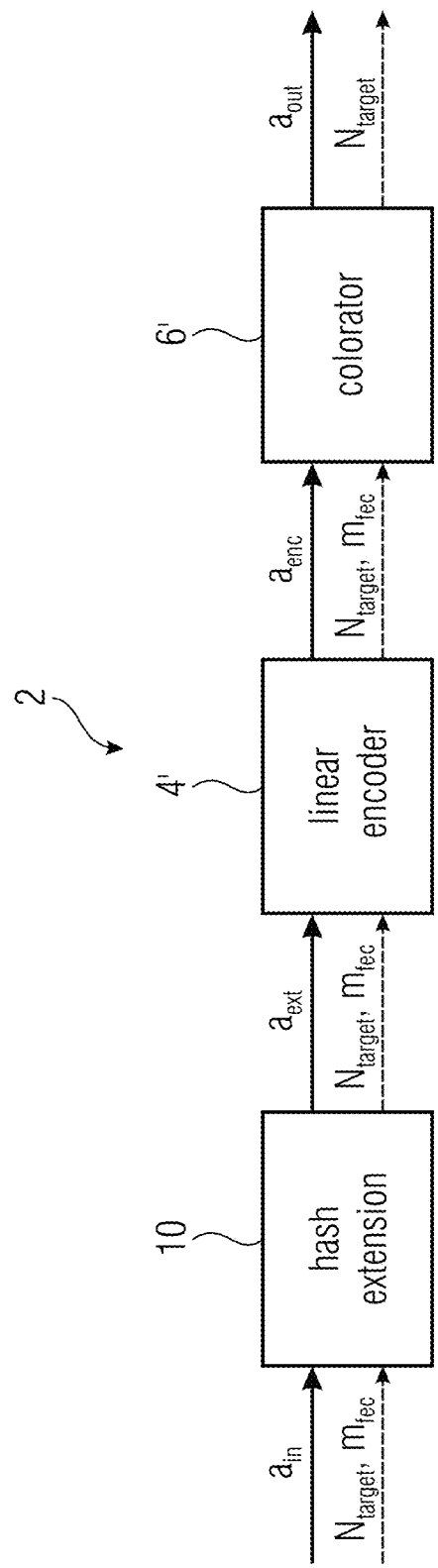
FIG. 4 shows a block diagram illustrating an example of a further channel encoder shown in FIG. 3.

FIG. 4 shows a further example of the channel encoder shown in FIG. 3. The channel encoder 2 comprises a hash extension 10, a linear encoder 4' and a colorator 6'. The audio data encoded at the audio encoder 1 is input as input data $a_{in}$, and the hash extension 10 generates an extension data $a_{ext}$ by adding the hash data. The extension data $a_{ext}$ is provided to the linear encoder 4' and the linear encoder 4' generates a code word $a_{enc}$ in linear code. The code word $a_{enc}$ is provided to the colorator 6' and the colorator 6' generates colored code word $a_{out}$ to be transmitted.

The channel encoder 2 in FIG. 4 performs an implicit mode signaling, i.e., transmitting an encoded frame to a decoder without explicitly indicating the coding mode. In particular, no metadata other than the target size $N_{target}$ needs to be transmitted to the decoder (e.g., as shown, for example, in FIGS. 5A and 5B). To each of the $N_{mode}$ mode, a linear code word $\mathcal{C}_m$ of length $N_{target}$ is assigned, meaning $\mathcal{C}_m \subset \mathcal{C}_0 := \{0, 1\}^{N_{target}}$. The first stage of data encoding thus consists of mapping a given data word in $\mathcal{D}_m := \{0, 1\}^{N_m}$ to a code word in $\mathcal{C}_m$.

The implicit mode signaling is based on the fact that it can be tested efficiently whether a given word $c \in \mathcal{C}_0$ lies in $\mathcal{C}_k$. However, since the codes are linear, the intersections $\mathcal{C}_m \cap \mathcal{C}_n$ are not empty. In particular, many families of codes, such as primitive narrow-sense BCH codes or Reed-Solomon codes with the same base field, will even produce inclusions between the different codes when ordered according Hamming distance, i.e., $$\mathcal{C}_{N_{mode}} \subset \mathcal{C}_{N_{mode}-1} \subset \ldots \subset \mathcal{C}_1 \quad (1)$$

It may therefore happen that a code word cm obtained by encoding a data word in mode m also lies in $\mathcal{C}_n$ for an $n \neq m$, whence it is generally not possible to determine the mode based on such a test alone. This problem is solved by applying a mode dependent transformation $$T_m: \mathcal{C}_0 \to \mathcal{C}_0 \quad (2)$$

after encoding. These transformations are designed such that $T_m(\mathcal{C}_m) \cap T_n(\mathcal{C}_n) = \emptyset$ for $m \neq n$ which resolves the aforementioned ambiguity. Since the transformations do not change the length of the code words, this method effectively signals the mode of the channel coder with zero bits.

In the present embodiment these transformations are given by calculating the bit-wise XOR of the encoded code word c and a signaling sequence $\text{sig}_m \in \mathcal{C}_0$. So when encoding in mode m the channel encoder outputs the colored code word $$\tilde{c} := c \oplus \text{sig}_m. \quad (3)$$

Receiving $\tilde{c}$ and being ignorant of the representation in (3), the decoder can then test efficiently whether $$\tilde{c} \oplus \text{sig}_k \in \mathcal{C}_k. \quad (4)$$

Since $\text{sig}_m \oplus \text{sig}_m$ is the zero sequence, the decoder will be able to verify that $$\tilde{c} \oplus \text{sig}_m = c \oplus \text{sig}_m \oplus \text{sig}_m = c \quad (5)$$

lies in $\mathcal{C}_m$. Furthermore, on the condition $$N_{mode} \leq \frac{|\mathcal{C}_0|}{|\mathcal{C}_1 + \mathcal{C}_2 + \ldots + \mathcal{C}_{N_{mode}}|}, \quad (6)$$

the signaling sequences $\text{sig}_k$ can be chosen such that $$\text{sig}_k \oplus \text{sig}_l \notin \mathcal{C}_1 \cup \mathcal{C}_2 \cup \ldots \cup \mathcal{C}_{N_{mode}} \quad (7)$$

for $k \neq l$ allowing for deterministic mode detection at the decoder if no transmission errors occur. Hence, it is not necessary to separately transmit the data to indicate the certain coding mode and the parameters to the channel decoder.

Figure 5A:
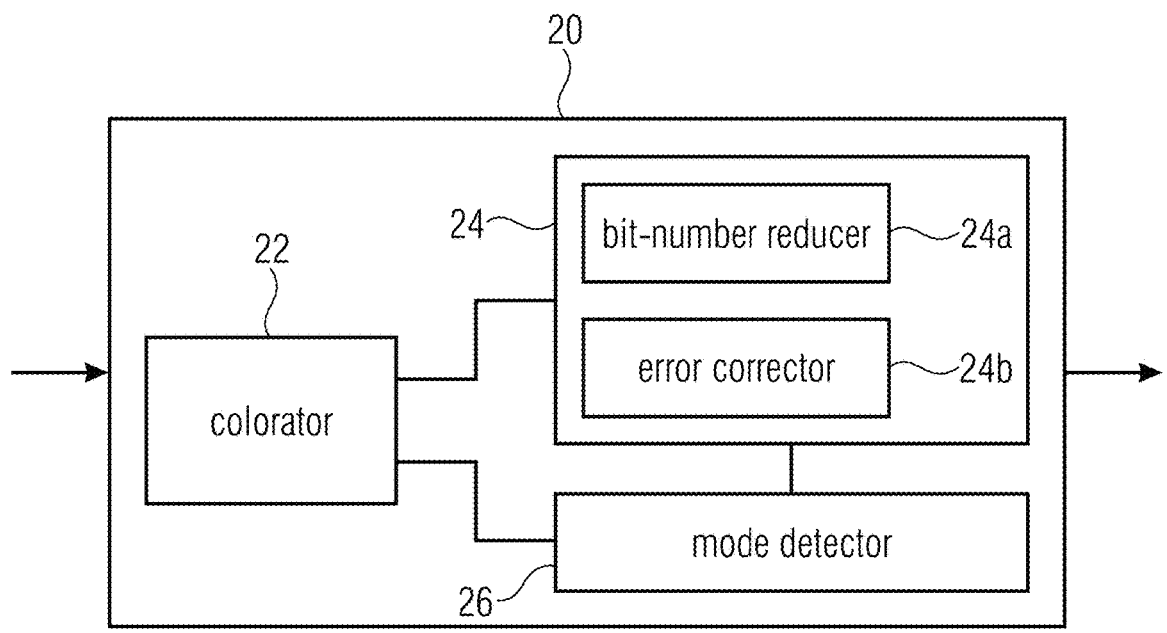
FIGS. 5A, 5B show a block diagram illustrating examples of a channel decoder for channel decoding at least one transmitted code word according to embodiments of the present application.
Figure 5B:
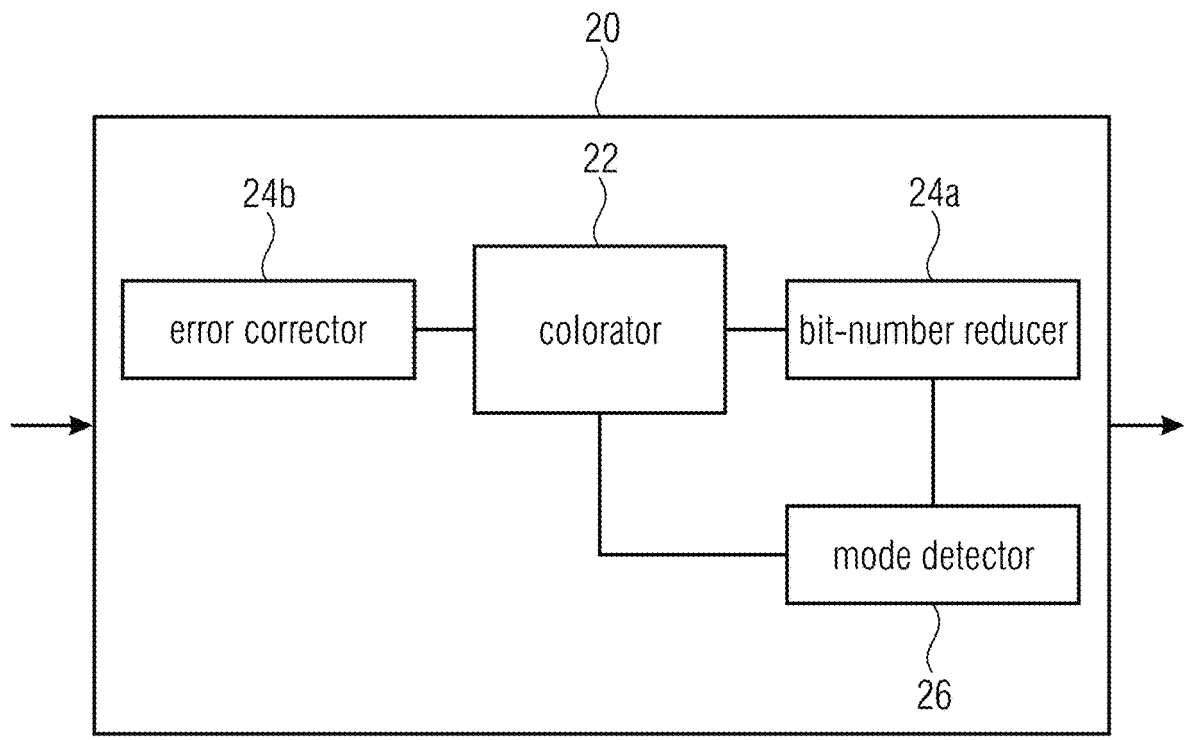

As shown in FIG. 5A, the channel decoder 20 comprises a colorator (de-colorator) 22, a redundancy decoder 24 and a mode detector 26. The redundancy decoder 24 comprises a bit-number reducer 24a and an error corrector 24b, however, it is not necessary that the bit-number reducer 24a and the error corrector 24b are provided in the redundancy decoder 24. That is, as shown in FIG. 5B, the error corrector 24b may be connected to the colorator 22, and the bit-number reducer 24b may be located between the colorator 22 and the mode detector 26. The mode detector 26 is connected to the redundancy decoder 24 (bit-number reducer 24a) and the colorator 22. At the channel decoder 20, more specific, at the decoding mode detector 26, a decoding mode indicator indicating the certain decoding mode to be used by the redundancy decoder 24 (the bit-number reducer 24a) to obtain the decoded output code word, and the specific coloration sequence used for the coloration of the transmitted code word at the colorator 22 is determined.

The channel decoder 20 receives transmitted code words transmitted from the channel encoder 2. Then, a predetermined number of transmitted code words are used/tested for generating the decoding mode indicator at the decoding mode detector 26 as explained below. The decoding mode detector 26 has information regarding decoding modes which could be used by the channel encoder 2, e.g., a list of candidate decoding modes.

Figure 6:
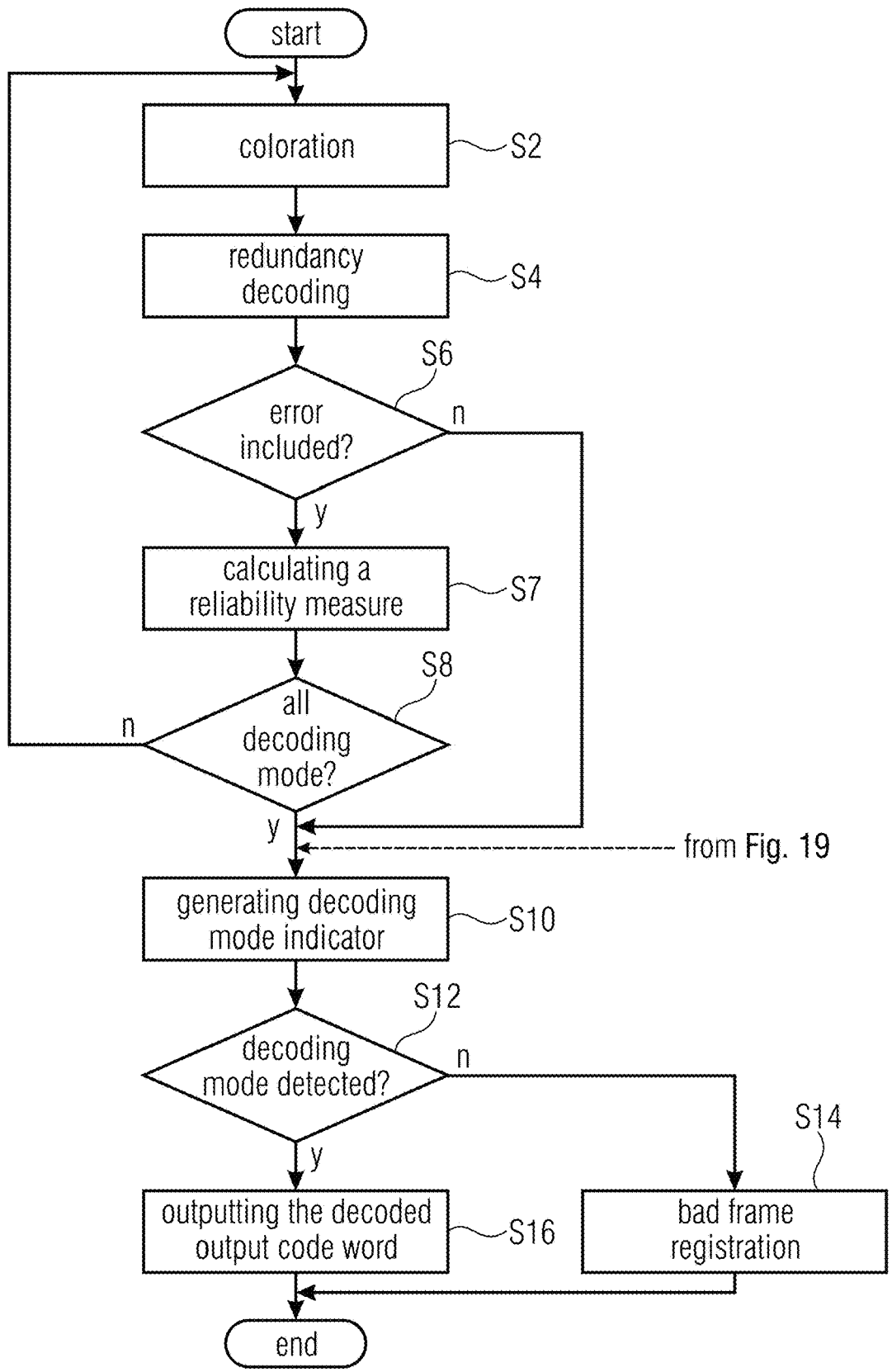
FIG. 6 shows a flowchart for an example of a channel decoding operation implemented by the claimed channel decoder shown in FIG. 5A or FIG. 5B according to the embodiments of the present application.

FIG. 6 is a flowchart for an example of a channel decoding operation implemented by the claimed channel decoder shown in FIG. 5A or FIG. 5B. The predetermined number of the transmitted code words is de-colorated by applying a coloration sequence (S2), for example, the coloration sequence $\text{sig}_1$ associates to a decoding mode $m_{fec}=1$ in the candidate list. Then, colored (de-colored) code words are decoded at the bit-number reducer 24a (S4) and the predetermined number of decoded output code words is obtained. In case no transmission errors have occurred (S6), the decoding mode indicator is generated at the decoding mode detector 26 based on the decoded output code words (S10). The generated decoding mode indicator is provided to the colorator 22 and the redundancy decoder 24 (bit-number reducer 24a), i.e., in case the decoding mode indicator indicates the certain decoding mode, it is defined that the decoding mode is detected (S12). Then, the transmitted code words decoded by using the certain decoding mode are outputted as the decoding output code words (S16).

As indicated at S6, if errors are detected, a reliability measure (a risk value) is calculated at the decoding mode detector 26 (S7). That is, in case the transmitted errors are occurred, the errors are detected and attempted to be corrected by calculating and using syndromes at the error corrector 24b and the result of the error correction is provided to the decoding mode detector 26 from the error corrector 24b. In case the error corrector 24b is independent, as shown in FIG. 5B, the result of the error correction is associated with the transmitted code word. The detailed procedure of the error detection and the error correction will be explained later.

Then, in case all the candidate decoding modes on the list are tested (S8), it proceeds further to S10 as described above. If there is a remaining candidate decoding mode on the list (S8), S2 to S7 are repeated until the entire candidate decoding modes are tested. In case the certain decoding mode is not determined (S12), although all of the candidate decoding modes are tested, the frame, which consists of the transmitted code word used/tested for determining the certain decoding mode, is registers as a bad frame.

Figure 7A:
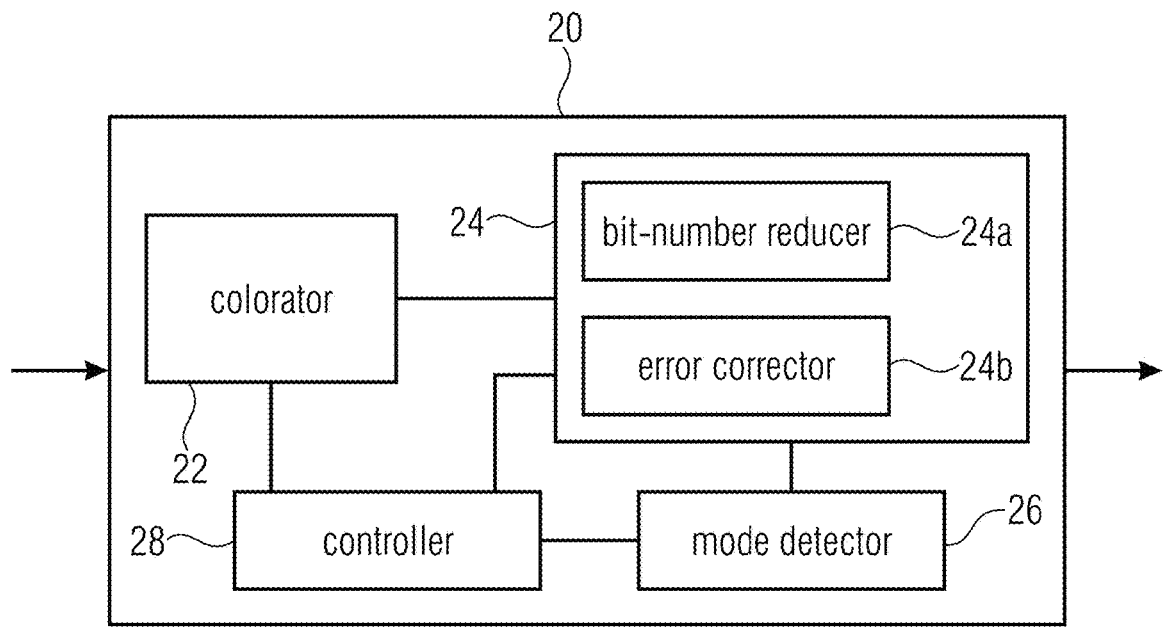
FIGS. 7A, 7B show a block diagram illustrating variations of a channel decoder for channel decoding at least one transmitted code word according to the present application as indicated by FIGS. 5A and 5B.
Figure 7B:
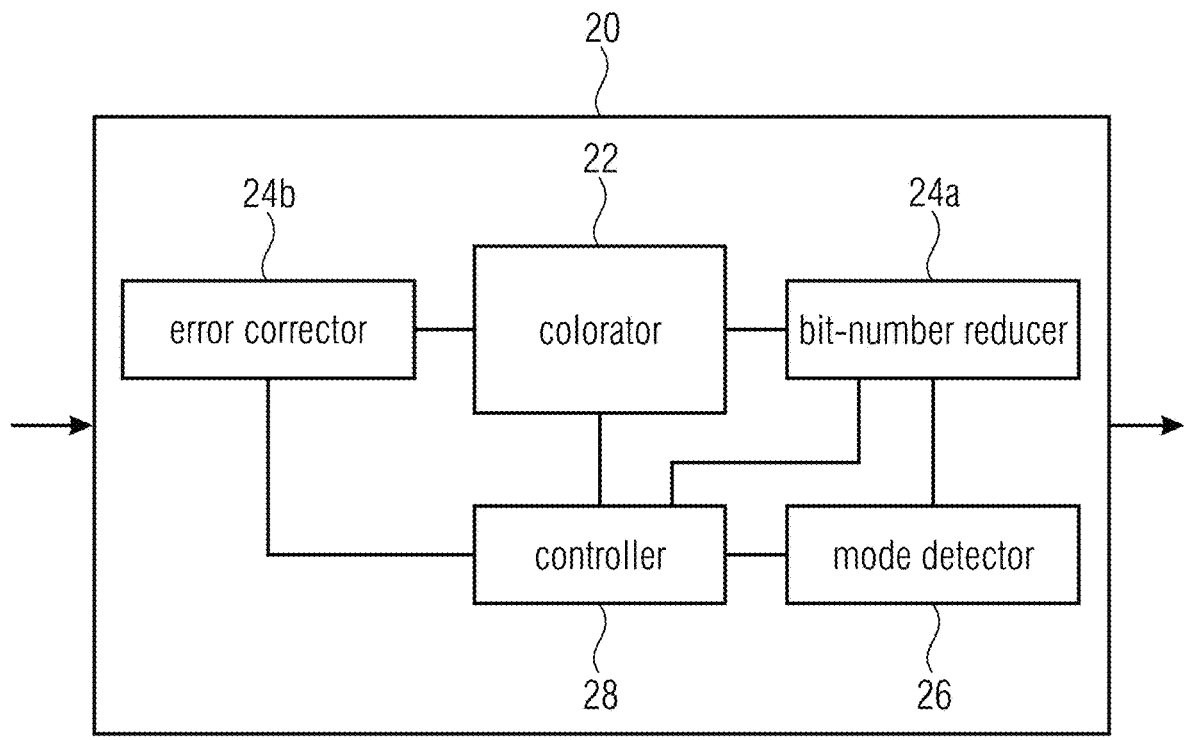

FIGS. 7A and 7B show variations of the channel decoder 20 as shown in FIGS. 5A and 5B. As shown in FIG. 7A, the channel decoder 20 further comprises the controller 28 which is connected to the colorator 22, the redundancy decoder 24 and the mode detector 26. Also, the channel decoder 20 in FIG. 7B corresponding to the channel decoder 20 described in FIG. 5B, further comprises the controller 28 which is connected to the error corrector 24b, the colorator 22, the bit-number reducer 24a and the mode detector 26.

At the channel decoder 20 in FIG. 7A as well as in FIG. 7B, a plurality of mode tests may be processed in parallel. For example, if there are four candidate modes on the candidate list, the mode test is performed for each candidate mode, i.e., candidate 1: a coloration sequence $sig_1$ and a decoding mode $m_{fec}=1$, candidate 2: a coloration sequence $sig_2$ and a decoding mode $m_{fec}=2$, candidate 3: a coloration sequence $sig_3$ and a decoding mode $m_{fec}=3$, and candidate 4: a coloration sequence $sig_4$ and a decoding mode $m_{fec}=4$ are performed in parallel as described below (S2 to S8 in FIG. 6 are performed for each candidate in parallel). The mode detector 26 then generates the decoding mode indicator and the controller 28 instructs to the redundancy decoder 24 (the bit-number reducer 24a) to output the decoded code words decoded using the indicated decoding mode as the outputted decoded code words.

Figure 8:
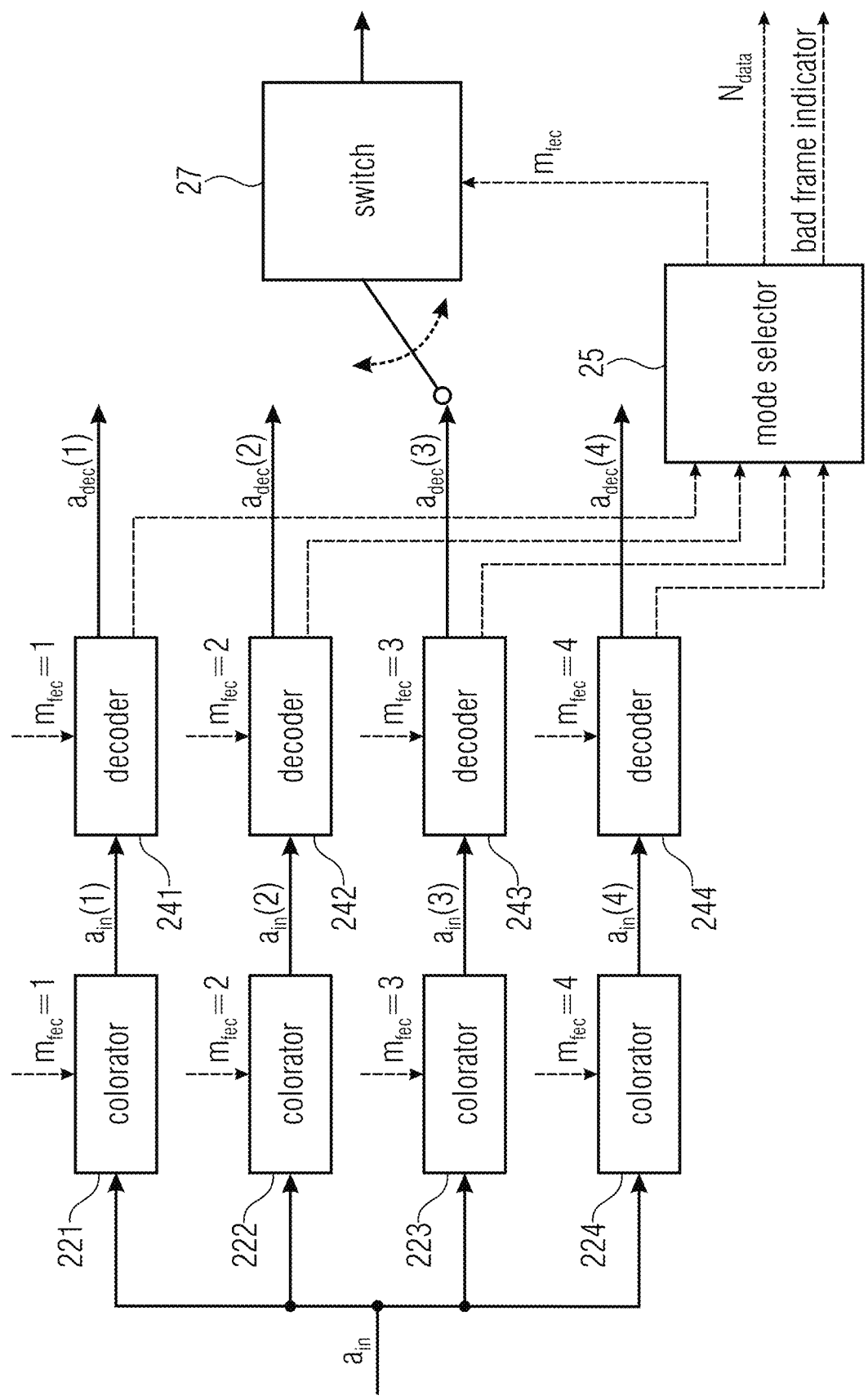
FIG. 8 shows a block diagram illustrating further variation of a channel decoder for channel decoding at least one transmitted code word according to the present application as indicated by FIG. 7A or 7B.

FIG. 8 shows a variation of the channel decoder comprising a plurality of colorators 221 to 224, a plurality of decoders (redundancy decoders) 241 to 244, mode selector (detector) 25 and a switch 27. As described in FIG. 8, transmitted code word, i.e., encoded data $a_{in}$ is input to the channel decoder and copied for providing to the plurality of the colorators 221 to 224. A coloration sequence $sig_1$ is applied to the copied encoded data $a_{in}$ at the colorator 221 and a decoding mode $m_{fec}=1$ is applied to the colored code word $a_{in}(1)$ at the decoder 241 to obtain a decoded code word $a_{dec}(1)$. In this embodiment, the coloration sequence $sig_1$ is zero sequence, i.e., the coloration operation is bypassed. A coloration sequence $sig_2$ is applied to the copied encoded data $a_{in}$ at the colorator 222 and a decoding mode $m_{fec}=2$ is applied to the colored code word $a_{in}(2)$ at the decoder 242 to obtain a decoded code word $a_{dec}(2)$. A coloration sequence $sig_3$ is applied to the copied encoded data $a_{in}$ at the colorator 223 and a decoding mode $m_{fec}=3$ is applied to the colored code word $a_{in}(3)$ at the decoder 243 to obtain a decoded code word $a_{dec}(3)$. A coloration sequence $sig_4$ is applied to the copied encoded data $a_{in}$ at the colorator 224 and a decoding mode $m_{fec}=4$ is applied to the colored code word $a_{in}(4)$ at the decoder 244 to obtain a decoded code word $a_{dec}(4)$.

Although it is not depicted in FIG. 8, the decoder includes an error corrector and decoding statistical information, e.g., the number of corrected bits or symbols, and number of corrected symbols in sub code words, if code is constructed from smaller codes, is provided from each decoder 241 to 244 to the mode selector 25 as indicated by a dotted line. Then, the mode selector 25 generates a decoding mode indicator indicating the certain decoding mode to be used by the decoder to obtain the decoded output code word. The mode selector 25 selects the decoding mode as the certain decoding mode based on the decoding statistic information, i.e., if a mode decodes without error correction, this mode is selected as the certain decoding mode. In this case, it should be noted that no miss-selection can happen if no errors have occurred. If errors occurred, a risk value (reliability measure) is computed for the decoding modes based on the likelihood to produce a code word with a similar number of errors by a random guess. The mode detector then decides for the decoding mode with the lowest risk value. In addition, the mode detector may also involve that the risk value of the selected mode is smaller than a pre-determined threshold. Hence, if there is no decoding mode having the risk value less than the predetermined threshold, a bad frame indicator is generated instead of the decoding mode indicator. The bad frame indicator is provided to the encoder together with the data size/length $N_{data}$.

The decoder determines/calculates/computes the risk value (reliability measure) of the decoding mode based on the number of the corrected symbols during a decoding operation of the colored code word. If a predetermined number of code words are colored, e.g., 6 code words are colored, then, the risk value (reliability measure) for decoding mode $m_{fec}=2$ is calculated based on the number of the corrected symbols during a decoding operation of the 6 colored code words. In the same manner, the risk value (further reliability measure) for decoding mode $m_{fec}=3$ is calculated based on the number of the corrected symbols during a decoding operation of the 6 colored code words, or the risk value (even further reliability measure) for decoding mode $m_{fec}=1$ is calculated based on the number of the corrected symbols during a decoding operation of the 6 code words without coloration.

When the certain decoding mode is selected, then, the decoding mode indicator is provided from the mode selector 25 to the switch 27. The switch 27 switches the connection to the decoder to obtain the decoded output code word based on the decoding mode indicator. That is, for example, if the decoding mode $m_{fec}=3$ is indicated as the certain decoding mode, then the switch 27 connects to the decoder 243 to obtain the decoded output code word.

In case transmission errors occurred, the decoder 20 receives $$\tilde{c} \oplus \varepsilon \qquad (8)$$

with an error sequence ε. This can lead to ambiguities in the sense that $$\tilde{c} \oplus \varepsilon \oplus \mathrm{sig}_k \in \mathcal{C}_k^{(c)} \qquad (9)$$

for different k, where $\mathcal{C}_k^{(c)}$ denotes the sets of all sequences that can be corrected by the FEC scheme (for example, at the error corrector 24b shown in FIGS. 7a and 7b) to produce a code word in $\mathcal{C}_k$. If k≠m is such a mode, then the decoding strategy is to regard the error term $$\mathrm{sig}_m \oplus \mathrm{sig}_k \oplus \varepsilon \qquad (10)$$

as a random guess and estimate the mode from a list of candidate modes according to a risk value, i.e., the reliability measure. This risk value is derived from decoding statistics such as the number of corrected symbols and reflects the likelihood that the decoder input is a random guess in $\mathcal{C}_0$ (i.e. a sequence of fair coin tosses).

This way, the risk of selecting the wrong mode is limited by the risk of erroneously decoding a code word that has been damaged beyond the error correction capability of the underlying code. In cases where this risk is considered too large, a hash value may be added as an option to the data before encoding and taken into account in the mode detection procedure. While this, similarly to an explicit signaling, reduces the data rate, it improves mode selection risk and wrong decoding risk alike. Therefore, the proposed FEC scheme is very well-suited for the application, where undetected corrupted frames usually lead to stronger degradations than detected and concealed corrupted frames.

Further details regarding the channel encoder 2 and the channel decoder 20 according to the present application are explained below.

Channel Encoder

The envisioned channel encoder operates on bytes and utilizes Reed-Solomon codes over GF(16) to construct a family of linear codes. It takes as input the target size in bytes denoted $N_s$, also referred to as slot size, a mode number $m_{fec}$ between 1 and 4 and an input sequence of data bytes $a(k)$, $k=0, 1, \ldots, N_p-1$, which are interpreted in the following as integers between 0 and 255. The input size $N_p$ is derived from the parameters $N_s$ and $m_{fec}$ as will be specified later. In the following, the target size is assumed to be at least 40 bytes.

Figure 9:
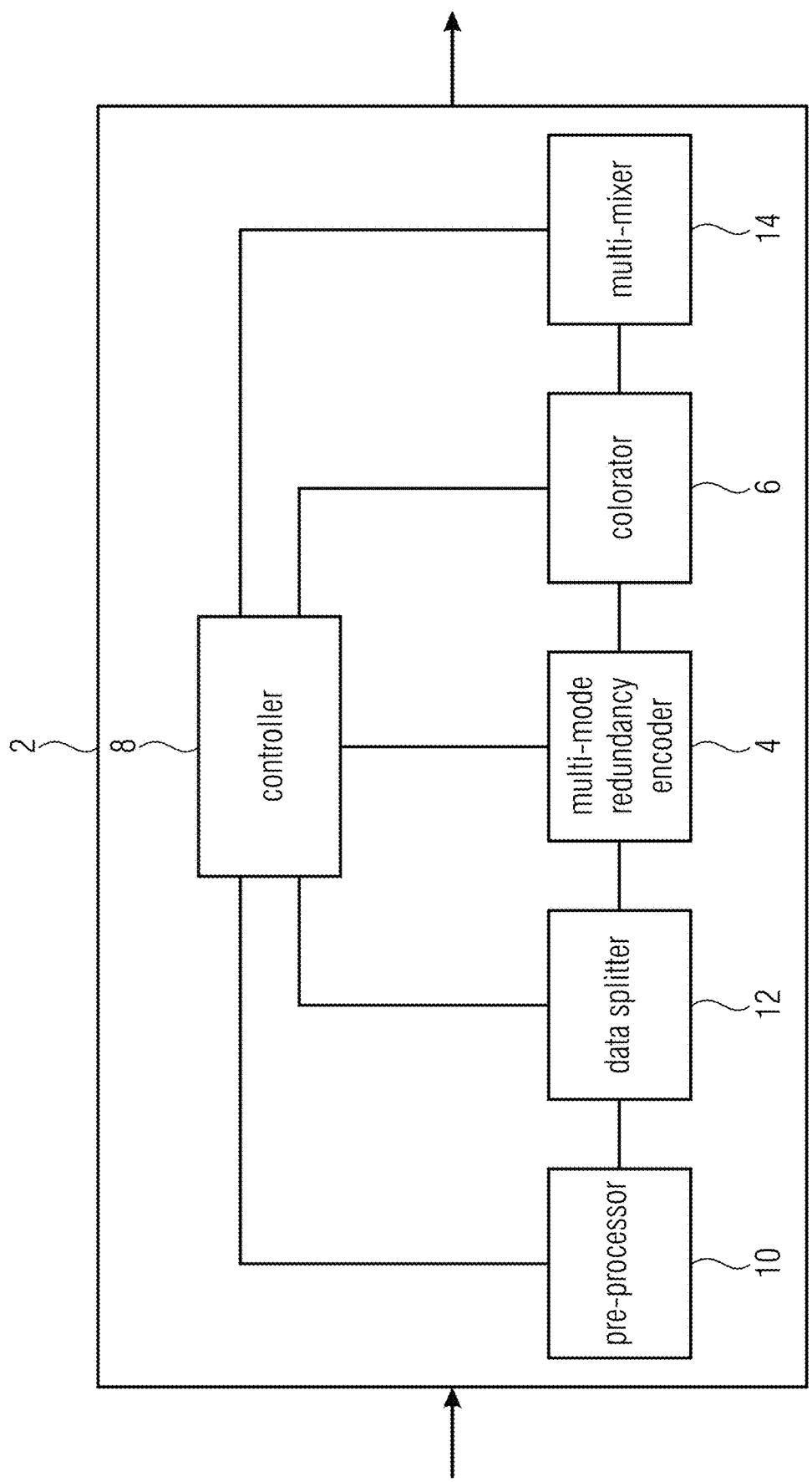
FIG. 9 shows a block diagram illustrating another example of a channel encoder for encoding a frame to be transmitted according to the embodiments of the present application.

FIG. 9 shows a block diagram illustrating another example of a channel encoder 2 for encoding a frame to be transmitted according to the embodiments of the present application. The channel encoder 2 comprises a controller 8, a pre-processor 10, data splitter 12, a multi-mode redundancy encoder 4, a colorator 6 and a multi-mixer 14.

Figure 10:
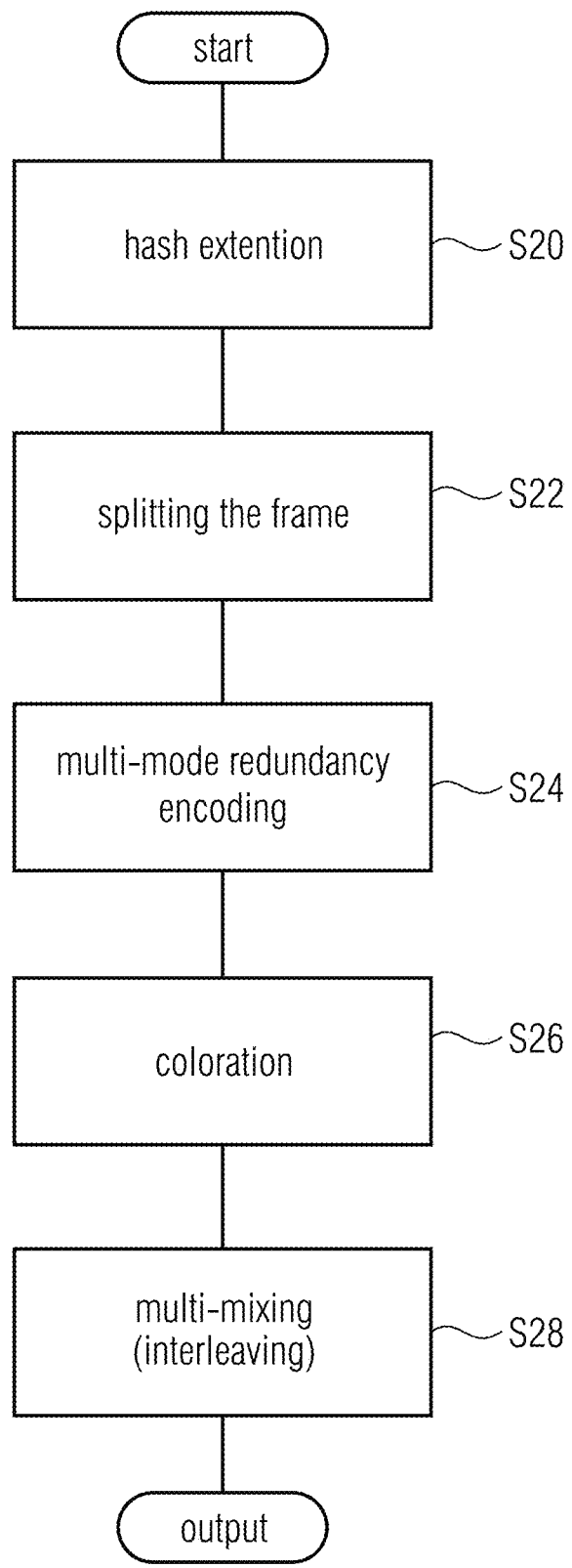
FIG. 10 shows a flowchart for an example of a channel encoding operation implemented by the channel encoder shown in FIG. 9 according to the embodiments of the present application.

FIG. 10 shows a flowchart for an example of a channel encoding operation implemented by the channel encoder shown in FIG. 9. As shown in FIG. 10, hash value of the input data, i.e., input frame data, is calculated and added to the input data (S20). The frame including the input data and the added hash value is split by the data splitter 12 into a plurality of data words (S22). The number of the data words is calculated based on a target size of the frame. A plurality of the data words is encoded by the multi-mode redundancy encoder 4 (S24), and the encoded data words, i.e., code words are provided to the colorator 6 for applying a coloration sequence (S26). Then colored code words are interleaved at the multi-mixer 14 (S28).

Figure 11:
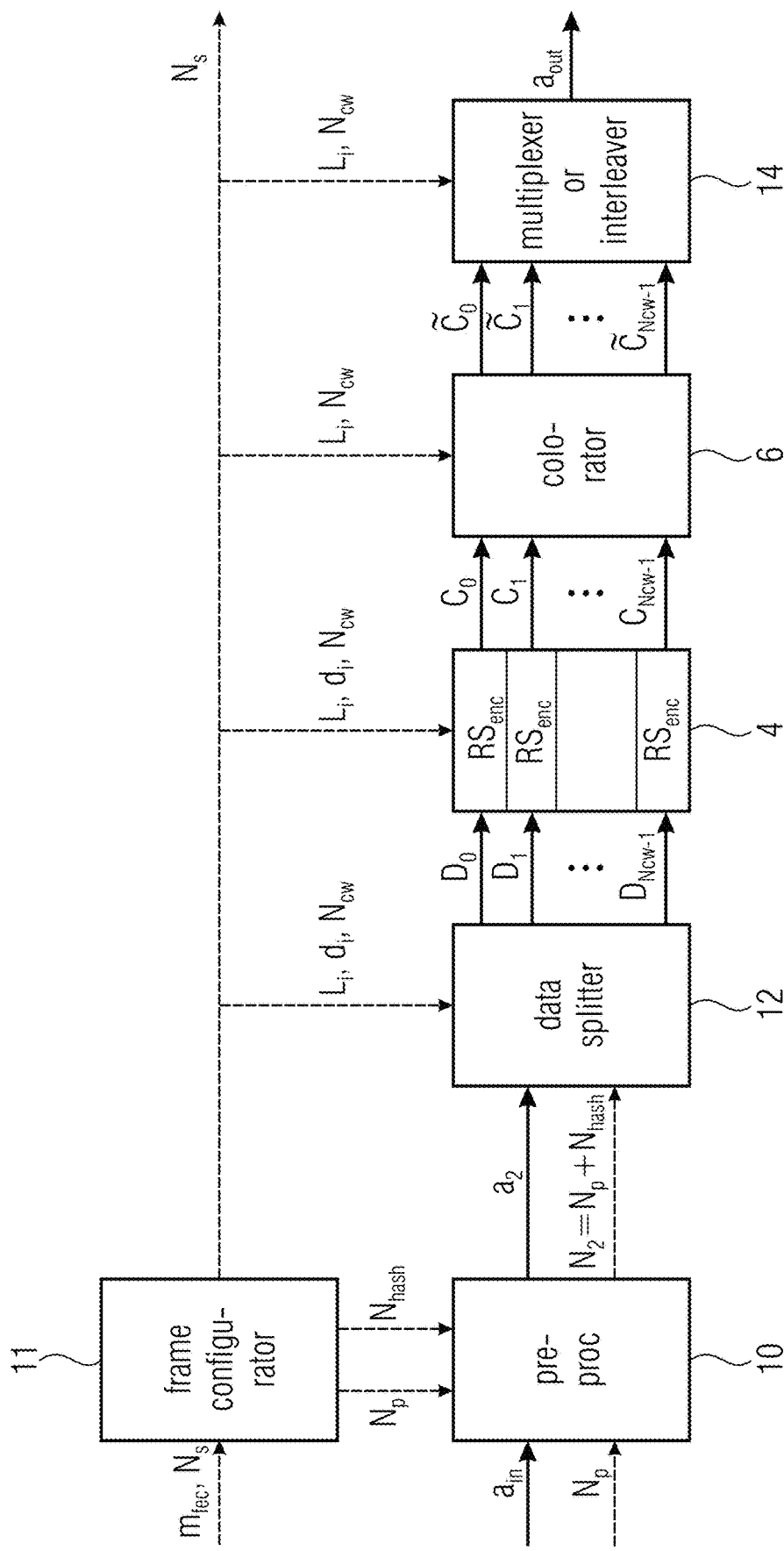
FIG. 11 shows a block diagram illustrating a variation of a channel encoder for encoding a frame to be transmitted according to the embodiments of the present application shown in FIG. 9.

FIG. 11 shows a block diagram illustrating a variation of the channel encoder depicted in FIG. 9. The channel encoder in FIG. 11 further comprises a frame configurator 11 for providing information to other devices. For example, the frame configurator 11 receives parameters, e.g., target size of the code word $N_s$ and the coding mode $m_{fec}$. In addition, a size of a hash value $N_{hash}$ of the frame and the Hamming distance are calculated at the frame configurator 11. As depicted in FIG. 11, an input data $a_{in}$ and data length $N_p$ information, and the calculated hash size $N_{hash}$ and the Hamming distance are provided to the pre-processor 10. In addition, the lengths of the code words $L_i$, Hamming distances $d_i$ and the number of code words $N_{cw}$ are provided to the data splitter 12, the Read-Solomon (RS) encoder 4, the colorator 6 and the multiplexer (interleaver) 14. From the pre-processor 10, for example, the data $a_2$ having the size $N_2 = N_p + N_{hash}$ is provided to the data splitter 12. The data splitter 12 splits the frame into a plurality of code words $D_0$, $D_1$ to $D_{Ncw-1}$ which are provided to the RS encoder 4. The RS encoder 4 encodes the data words to obtain code words $C_0$, $C_1$ to $C_{Ncw-1}$ which are provided to the colorator 6. The colorator 6 applies a coloration sequence to the code words to obtain colored code words and the colored code words are interleaved at the multiplexer and outputted as $a_{out}$. Detail procedure is explained below.

Data Pre-Processing

In the pre-processing step, a hash value of $N_{hash}$ bytes is calculated on the input data, e.g. a CRC (Cycle Redundancy Check) hash, where $N_{hash} = N_{hash}(N_s, m_{fec})$ is a number depending only on the slot size $N_s$ and the FEC mode $m_{fec}$. In the advantageous embodiment, the number is given by $$N_{hash} := \begin{cases} 2 & m_{fec} > 1 \text{ and } N_s = 40 \\ 3 & \text{else} \end{cases} \qquad (11)$$

The hash value is used for data validation, as the error detection of the Reed-Solomon codes is not very strong.

Let the hash bytes be denoted $h(k)$, $k=0, 1, \ldots, N_{hash}-1$ and let rem(n,m) denote the remainder in the long division of n by m. Hash and data are concatenated and split into a sequence of numbers from 0 to 15 (in the following referred to as unit4 numbers), e.g. according to $$a_2(2k) := \mathrm{rem}(h(k), 16) \qquad (12)$$

and $$a_2(2k+1) := \lfloor h(k)/16 \rfloor \qquad (13)$$

for $k=0, 1, \ldots, N_{hash}-1$, and $$a_2(2k) := \mathrm{rem}(a(k-N_{hash}), 16) \qquad (14)$$

and $$a_2(2k+1) := \lfloor a(k-N_{hash})/16 \rfloor. \qquad (15)$$

for $k = N_{hash}, N_{hash}+1, \ldots, N_p + N_{hash}-1$.

The input data extended with the calculated hash, i.e., the frame including the hash value is split into a plurality of data words. The number of the data words is calculated, for example, based on a target size for the frame and code word index.

Figure 12:
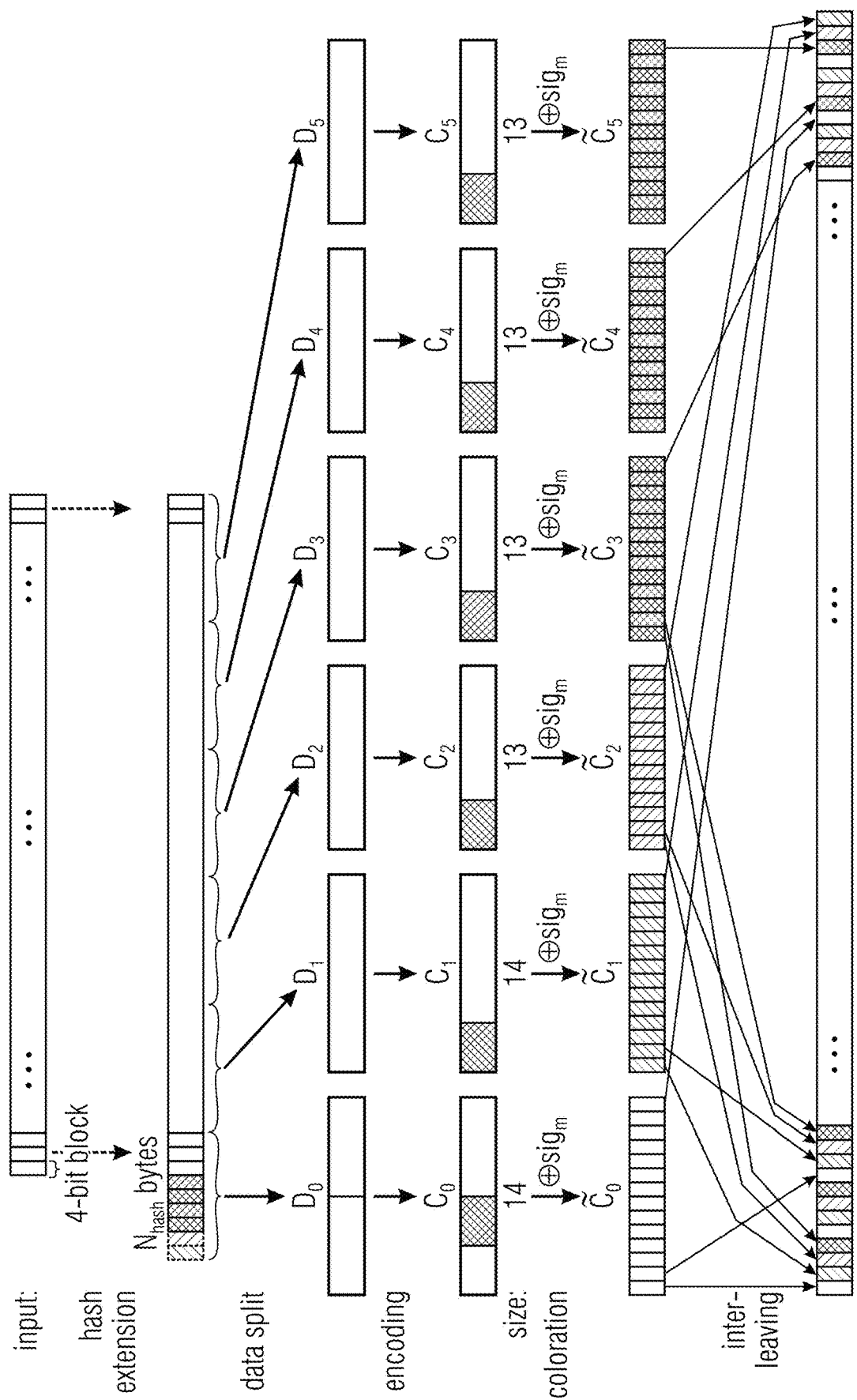
FIG. 12 shows a schematic illustration of an example for frame architecture in the channel encoding operation shown in FIG. 11 according to the embodiments of the present application.

FIG. 12 shows a schematic illustration of an example for frame architecture in the channel encoding operation performed by the channel encoder shown in FIG. 11. The input data, i.e., input frame including the hash value is split into the calculated number of data words (also the number of code words), e.g., 6 data words $D_1$ to $D_5$.

Reed-Solomon Encoding (Reference to "*Error Correction Coding: Mathematical Methods and Algorithms*", Todd K. Moon, 2005.)

The linear codes are constructed from a multitude of Reed-Solomon codes over GF(16) with Hamming distances 1, 3, 5 and 7. The number of code words is calculated from the slot size as $$N_{cw} := \left\lceil \frac{2N_s}{15} \right\rceil \quad (16)$$

and the length of code word i in data symbols is given by $$L_i := \left\lfloor \frac{N_s - i - 1}{N_{cw}} \right\rfloor + 1, \quad (17)$$

where i ranges from 0 to $N_{cw}-1$. The condition $N_{cw} \geq 40$ implies that $L_i \in \{13,14,15\}$. The Hamming distances for the different code words are mode and code word dependent and are given by $$\delta_i(m_{fec}) := \begin{cases} m_{fec} - 1 & m_{fec} > 1, \\ 3 & m_{fec} = 1 \text{ and } i = 0, \\ 1 & \text{else.} \end{cases} \quad (18)$$

The data array is split into $N_{cw}$ data words according to $$D_i(k) := a_2(S_i + k), \, k = 0, 1, \ldots L_i - \delta_i((m_{fec})), \quad (19)$$

where the sequence of split points is inductively defined by $S_0 := 0$ and $S_{i+1} := S_i + L_i - \delta_i(m_{fec}) + 1$.

This constraints the input length to $$N_p = N_s - N_{hash}(N_s, m_{fec}) - \sum_{i=0}^{N_{cw}(N_s, m_{fec})-1} \frac{\delta_i(m_{fec}) - 1}{2}, \quad (20)$$

which depends on $N_s$ and $m_{fec}$ alone.

Subsequently, the data words $D_i$ are encoded into $RS(L_i, L_i - \delta_i(m_{fec}) + 1)$ codes $C_i$. Reed-Solomon encoding depends on a generator for the base field and a generator for the unit group of that base field (see e.g. "*Error Correction Coding: Mathematical Methods and Algorithms*", Todd K. Moon, 2005) as well as a data-to-symbol mapping. In the following, the field GF(16) is assumed to be generated by $x^4 + x + 1$ and the unit group generator $\alpha$ is assumed to be the residual class of x in $GF(16) = GF(2)/(x^4 + x + 1)$. Furthermore, the data-to-symbol mapping (mapping unit4 numbers to elements of GF(16)) is taken to be $$n^C[n] := bit_0(n) + bit_1(n)\alpha + bit_2(n)\alpha^2 + bit_3(n)\alpha^3, \quad (21)$$

where $bit_k(n)$ denotes the k-th bit in the binary representation of n given by $$bit_k(n) := \left\lfloor \frac{n}{2^k} \right\rfloor - 2 \left\lfloor \frac{n}{2^{k+1}} \right\rfloor. \quad (22)$$

The code word $C_i$ is then the uniquely determined sequence satisfying $$C_i(\delta_i(m_{fec}) - 1 + k) = D_i(k) \quad (23)$$

for k=0, 1, . . . , $L_i - \delta_i(m_{fec})$ and also satisfying that the polynomial $$\Sigma_{k=0}^{L_i - 1}[C_i(k)]x^k \quad (24)$$

is divisible by the RS generator polynomial $$\Pi_{k=1}^{\delta_i(m_{fec})-1}(x - a^k). \quad (25)$$

As explained above, the data words are encoded and the code words are output as also indicated in FIG. 12. The length of each code words is not necessarily the same, e.g., the length of code words $C_0$ and $C_1$ is 14 nibbles and the length of code words $C_2$ to $C_5$ is 13 nibbles, and therefore, the length of the frame including code words $C_0$ to $C_5$ is 40 bytes. It should be noted that the redundancy rate can be different for different data words, since the length of the data words are not exactly the same.

Figure 13:
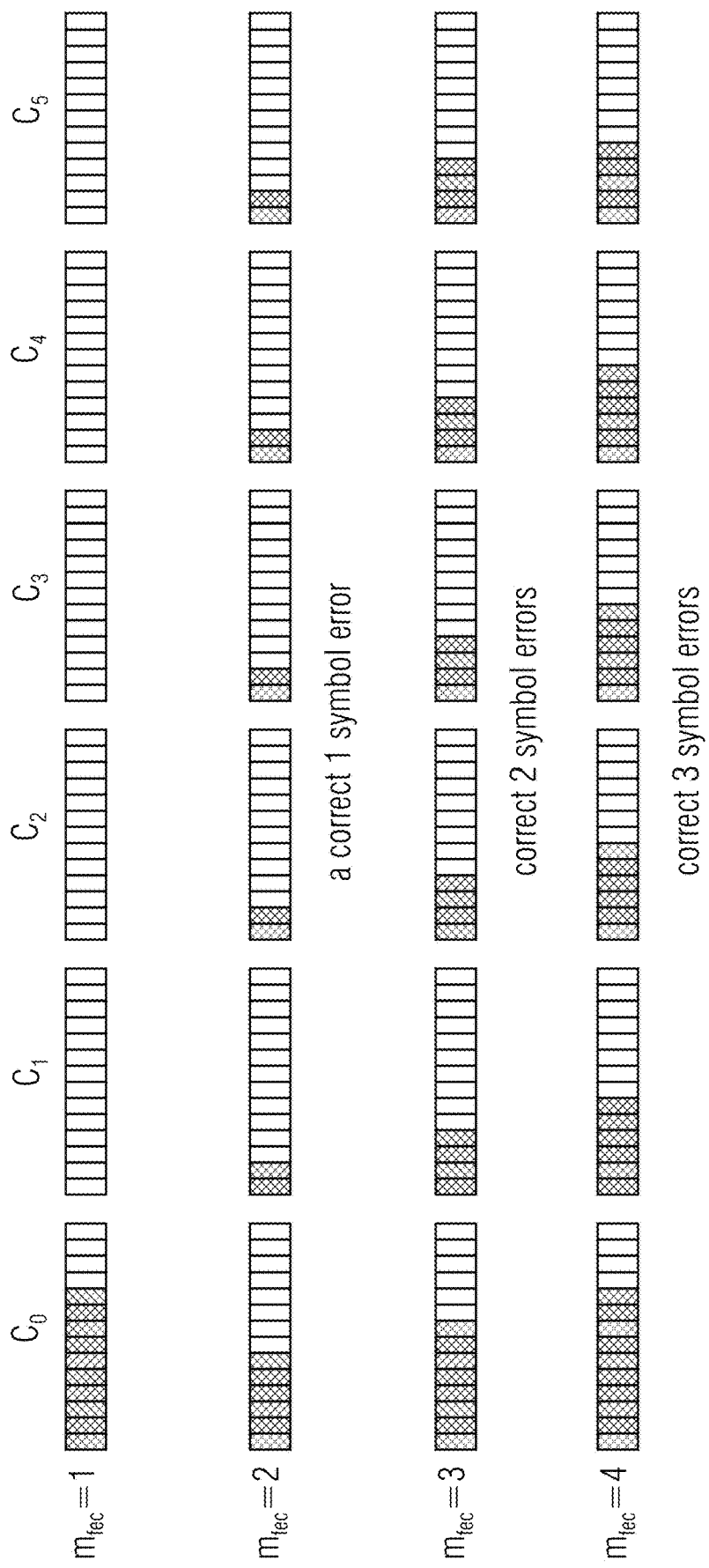
FIG. 13 shows a schematic illustration of an example for frame architecture dependent on an encoding mode according to the embodiments of the present application.

FIG. 13 is a schematic illustration of an example for frame architecture dependent on an encoding mode. FIG. 13 shows a relationship between the data to be transmitted and redundancy arrangement when the target size is 40. For example, when the code words encoded using $m_{fec}=1$, no error is expected, when the code words encoded using $m_{fec}=2$, one symbol error per code word may occur, when the code words encoded using $m_{fec}=3$, two symbol errors per code word may occur, and when the code words encoded using $m_{fec}=4$, three symbol errors per code word may occur. The channel decoder 20 is informed about the data to be transmitted and the redundancy arrangement, since decoding involves knowledge of the mode in order to extent encoded data.

In the next step, mode signaling is performed by coloration of code words according to $$\tilde{C}_i(k) := \begin{cases} bitxor(C_i(k), sig_{m_{fec}}(k)) & i < 6, \\ C_i(k) & \text{else,} \end{cases} \quad (26)$$

for k=0, 1, . . . $L_i$, where $sig_k$ is one of the following sequences:

$sig_1(\cdot) = (0,0,0,0,0,0,0,0,0,0,0,0,0,0,0)$
$sig_2(\cdot) = (7,15,5,6,14,9,1,3,12,10,13,3,2,0,0)$
$sig_3(\cdot) = (7,11,14,1,2,3,12,11,6,15,7,6,12,0,0)$
$sig_4(\cdot) = (6,15,12,2,9,15,2,8,12,3,10,5,4,0,0)$ In this embodiment, the number of code words (data words) is 6 if $N_s=40$. If the number of code words is large, it is not necessary to color all code words in order to robustly signal the FEC mode. In this case, coloration can be limited to a pre-defined subset of code words, e.g., the first 6 code words as indicated above by i<6. However, the number of code words may be changed dependent on parameters, i.e., target size, code word index, length of the code word and so on. Furthermore, figures of the coloration sequence are not limited to the above-mentioned examples and may be different figures.

The function bitxor(n,m) is defined on natural numbers and denotes the outcome of a bit-wise XOR on the binary representations of n and m, i.e.

$$bitxor(n,m) := \Sigma_{k=0}^{\infty} c_k 2^k, \quad (27)$$

TABLE 1

The probability that $c_i \oplus v_i \oplus v_j$ is decodable with d symbols in $C_j(15)$ when $c_i$ is drawn random uniformly from $C_i(15)$.

| d: | 0 | 1 | 2 | 3 | not decodable |
|---|---|---|---|---|---|
| $c_1 \oplus v_1 \oplus v_2$ | 0 | 0 | — | — | 1 |
| $c_1 \oplus v_1 \oplus v_3$ | 0 | 0 | $78 \times 2^{-8}$ | — | 0.695 . . . |

TABLE 1-continued

The probability that $c_i \oplus v_i \oplus v_j$ is decodable with d symbols in $C_j(15)$ when $c_i$ is drawn random uniformly from $C_i(15)$.

| d: | 0 | 1 | 2 | 3 | not decodable |
|---|---|---|---|---|---|
| $c_1 \oplus v_1 \oplus v_4$ | 0 | 0 | $55 \times 2^{-16}$ | $5445 \times 2^{-16}$ | 0.916... |
| $c_2 \oplus v_2 \oplus v_3$ | 0 | 0 | $78 \times 2^{-8}$ | — | 0.695... |
| $c_2 \oplus v_2 \oplus v_4$ | 0 | 0 | $55 \times 2^{-16}$ | $5445 \times 2^{-16}$ | 0.916... |
| $c_3 \oplus v_3 \oplus v_4$ | 0 | 0 | 0 | 0 | 1 | where $$c_k := \begin{cases} 0 & \text{bit}_k(n) = \text{bit}_k(m) \\ 1 & \text{else.} \end{cases} \quad (28)$$

The sequences are chosen to maximize separation of the different codes with respect to Hamming distance. Denoting by $$v_k := ([\text{sig}_k(0)], [\text{sig}_k(1)], \ldots, [\text{sig}_k(L_i-1)])$$

the corresponding vectors in $GF(16)^{L_i}$ and setting $\mathcal{C}_1(L_i) := \mathcal{C}_2(L_i) := RS(L_i, L_i-2)$, $\mathcal{C}_3 := RS(L_i, L_i-4)$ and $\mathcal{C}_4 := RS(L_i, L_i-6)$ the code word coloring corresponds to the vector addition $\mathcal{C}_k \oplus v_k$ in $GF(16)^{L_i}$. For deterministic mode detection in the absence of transmission errors the condition $\mathcal{C}_k(L_i) \oplus v_k \cap \mathcal{C}_l(L_i) \oplus v_l = \emptyset$ for $k \neq l$ is sufficient since this allows for unique determination of the signaled mode. The signaling sequences satisfy the following even stronger conditions, which are designed to limit the risk of mode ambiguities when transmission errors occur.

For $k>1$ and $c_k \in \mathcal{C}_k(L_i)$ the word $c_k \oplus v_k \oplus v_l$ is not decodable in $\mathcal{C}_l(L_i)$, meaning its Hamming distance to $\mathcal{C}_l(L_i)$ exceeds the error correction capability of the code.

For $k<1$ and $c_k \in \mathcal{C}_k(L_i)$ the word $c_k \oplus v_k \oplus v_l$ may be decodable in $\mathcal{C}_1$ but involves at least correction of two symbols.

The probabilities of $c_k \oplus v_k \oplus v_l$ being decodable in $\mathcal{C}_l(15)$ with a prescribed number of symbol corrections when $c_k$ is drawn random uniformly from $\mathcal{C}_k(15)$ are given in Table 1. They provide an upper boundary for the corresponding probabilities for smaller values of $L_i$.

The colored code words are shown in FIG. 12. To the code words encoded by using the encoding mode $m_{fec}=1$, the coloration sequence $\text{sig}_1$ is applied, i.e., the coloration is bypassed, since the coloration sequence is a zero sequence. To the code words encoded by using the encoding mode $m_{fec}=2$, the coloration sequence $\text{sig}_2$ is applied, to code words encoded by using the encoding mode $m_{fec}=3$, the coloration sequence $\text{sig}_3$ is applied, and to code words encoded by using the encoding mode $m_{fec}=4$, the coloration sequence $\text{sig}_4$ is applied. It is noted that not all code words need to be colored, i.e., the coloration sequence may only be applied to a predetermined subset of the code words in a frame.

Code Word Multiplexing

The colored code words are interleaved by the multiplexer 14. That is, a bit from a colored code word is placed in a different code word in a further bit of at least one different code word to obtain a frame.

That is, the code word lengths $L_i$ are chosen such that the elements of the colored code words $\tilde{C}_i$ can be fully interleaved, defining a multiplexed code word $$c(k) := \tilde{C}_{\text{rem}(k, N_{cw})}(\lfloor k/N_{cw} \rfloor) \quad (29)$$

for $k=0, 1, \ldots, 2N_s-1$, which is converted to the output sequence $$a_{out}(k) := c(2k) + 16 c(2k+1) \quad (30)$$

for $k=0, 1, \ldots, N_s-1$. Interleaving increases the protection strength if bit errors are not equally distributed over the frame, e.g., when error bursts occur. Note that code word coloration could have also been described at this stage by calculating the bit-wise XOR of the final output and the corresponding sequences derived from $\text{sig}_m$.

Figure 14:
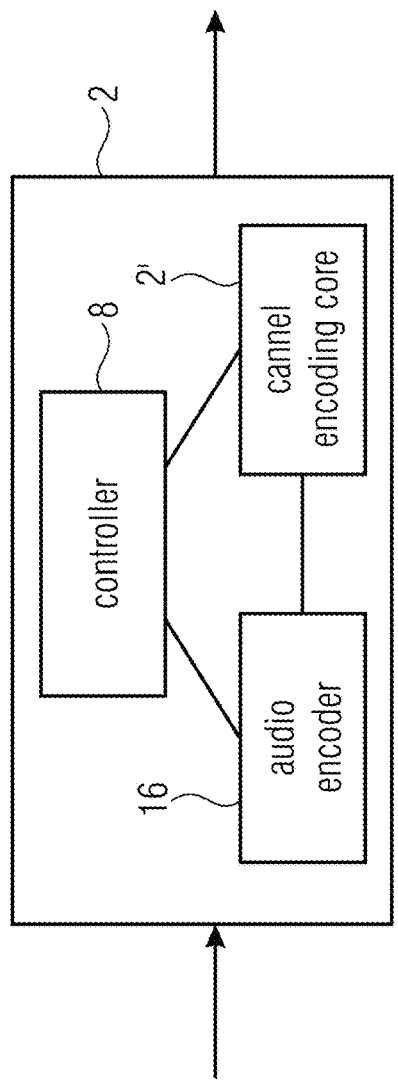
FIG. 14 shows a block diagram illustrating a further example of a channel encoder for encoding a frame to be transmitted according to the embodiments of the present application.

FIG. 14 shows a block diagram illustrating a further example of a channel encoder for encoding a frame to be transmitted. The channel encoder 2 shown in FIG. 14 comprises a controller 8, a channel encoding core 2' and an audio encoder 16, i.e., this channel encoder is used for encoding an audio frame to be transmitted. In case of encoding a video frame to be transmitted, the channel encoder 2 comprises a video encoder instead of the audio encoder 16.

Channel Decoder

Figure 15:
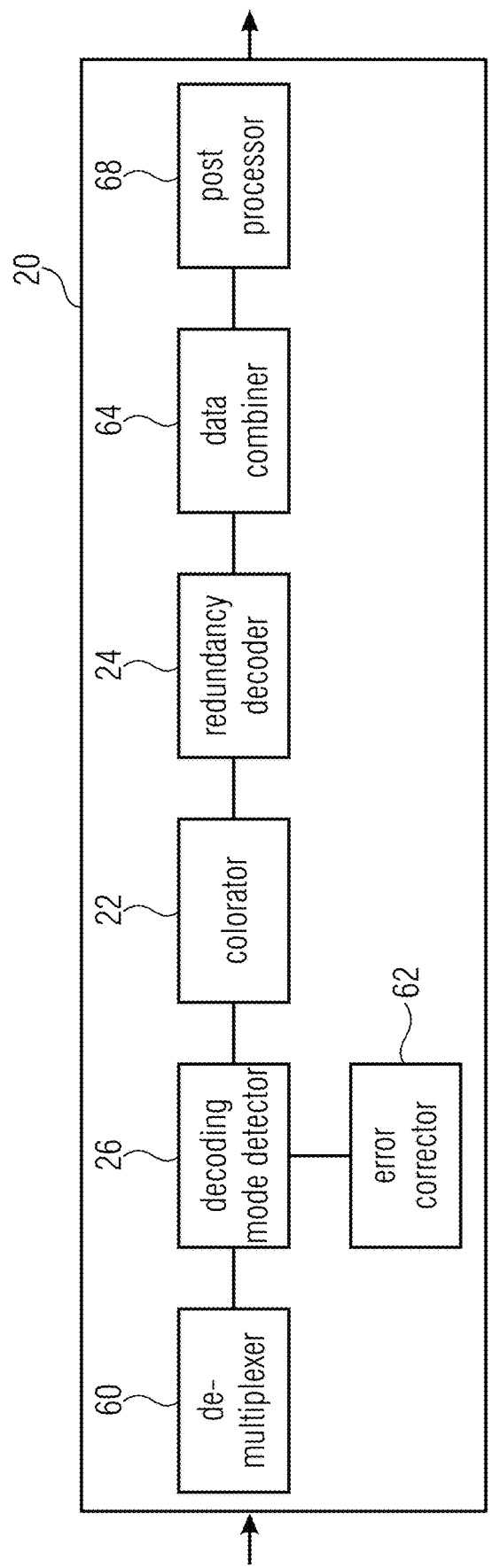
FIG. 15 shows a block diagram illustrating a further example of the channel decoder for channel decoding at least one transmitted code word according to embodiments of the present application.

FIG. 15 shows a further example of the channel decoder 20. The channel decoder 20 comprises a de-multiplexer 60, a decoding mode detector 26, an error corrector 62, a colorator 22, a redundancy decoder 24, data combiner 64 and a post processor 68. The error corrector 62 is connected to the decoding mode detector 26 in FIG. 15. However, the error corrector 62 may be included in the redundancy decoder 24, e.g., as shown in FIG. 5A, or located between the decoding mode detector 26 and the colorator 22, or the colorator 22 and the redundancy decoder 24. In addition, it is not shown in FIG. 15, however, that the channel decoder 20 may further comprise a controller and/or a memory/storage for storing a candidate list of the decoding modes.

Figure 20:
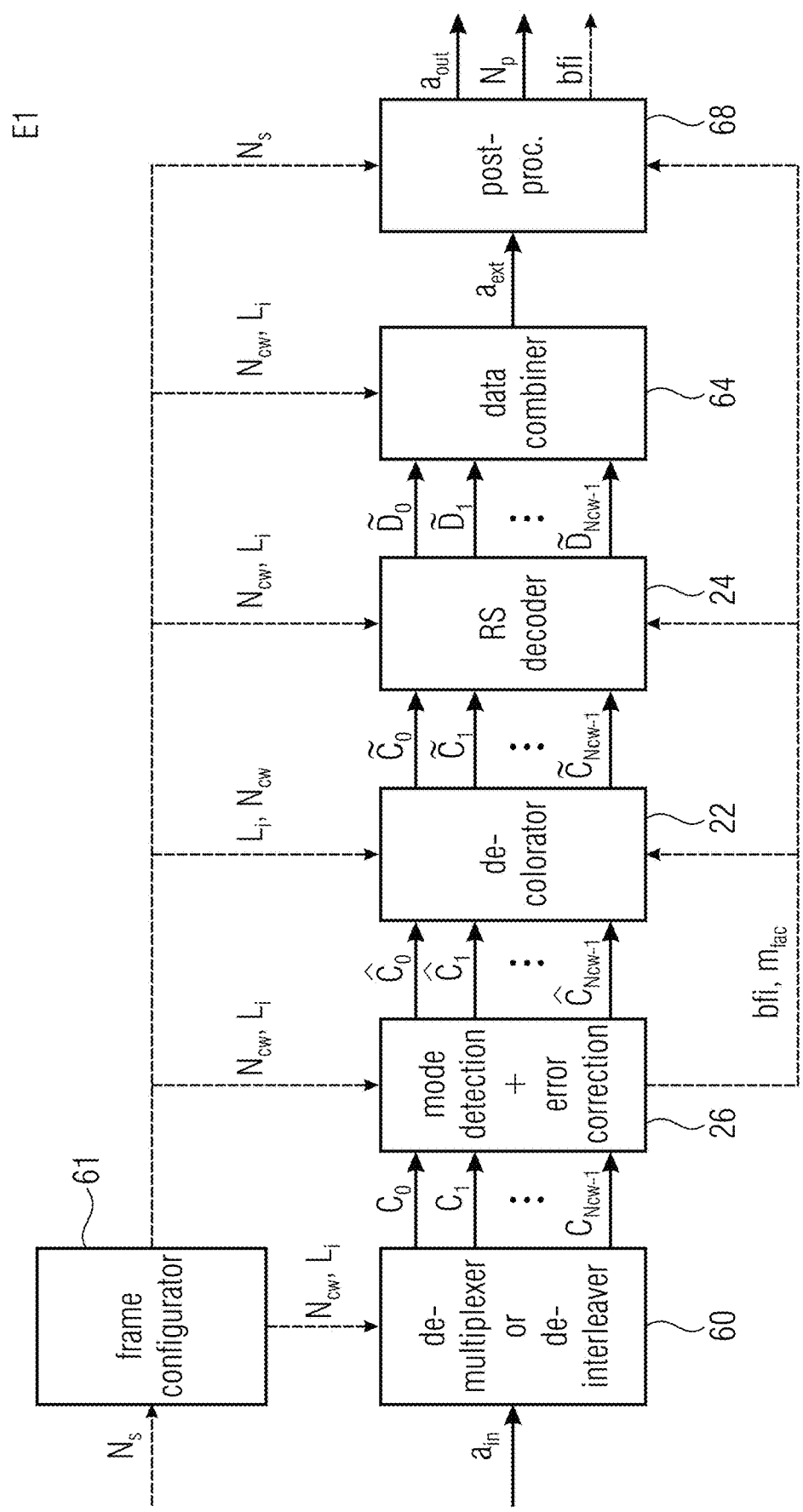
FIG. 20 shows a block diagram illustrating a variation of the channel decoder for channel decoding at least one transmitted code word according to embodiments of the present application shown in FIG. 15.

FIG. 20 shows a variation of the channel decoder 20 shown in FIG. 15. FIG. 20 depicts the channel decoder 20 in line with its operation in a similar manner as FIG. 11. The channel decoder 20 further includes a frame configurator 61 which provides the number of code words, $N_{cw}$, and the code word lengths, $L_i$ to the de-multiplexer 60, the mode detector 26 which including an error corrector, the de-colorator (colorator) 22, the RS decoder 24 and the data combiner 64. Also, the frame configurator 61 provides a frame target size, i.e., the slot size $N_s$ to the post processor 68. The de-multiplexer 60 extracts interleaved code words. The mode detector 26 detects the certain decoding mode and generates the decoding mode indicator. The decoding mode indicator includes at least information to indicate the certain decoding mode, and may include additional information, e.g., number of the corrected symbols. The decoding mode indicator is provided from the mode detector 26 to the de-colorator 22, RS decoder 24 and the post processor 68. The de-colorator 22 decolorates according to the certain decoding mode by applying XOR to a predetermined number of first coding words, e.g., first 6 code words with a coloration sequence associated to the certain decoding mode. The RS decoder 24 only extracts data parts of code words, i.e., error correction performed earlier on colored code words. The amount of redundancy is indicated by the decoding mode indicator. The data combiner 64 concatenates input, i.e., combine the data words to obtain output data. The post processor 68 validates output data using the hash value if the certain decoding mode is not mode 1. The detailed operation is explained below.

The channel decoder 20 receives as input a sequence of bytes $a_{in}$ and the slot size $N_s$ in bytes. Again, bytes are interpreted as numbers between 0 and 255.

Code Word De-Multiplexing

The de-multiplexer 60 extracts interleaved code words at the decoder 20, i.e., the frame configurator 61 computes the number of code words, $N_{cw}$, and the code word lengths, $L_i$, from the input size $N_s$ as specified in the section of "Reed-Solomon Encoding" and extracts the code words $C_i$ according to the arrangements described in the section "Code Word Multiplexing".

Mode Detection

Straight forward mode detection according to the channel decoder 20 shown in FIG. 5A and the associated description in the above could be done by passing from $C_i$ to $$C_{i,m}(k) := \begin{cases} \text{bitxor}(C_i(k), \text{sig}_m(k)) & i < 6, \\ C_i(k) & \text{else,} \end{cases} \quad (31)$$

using trial decoding for all possible modes, and, on success, validate the decoded data by re-calculating the hashes of the transmitted code words (i.e., decoded frame) as explained above (data pre-processing). If this procedure succeeds for multiple modes, then a risk value can be attached to the mode classes as follows: let $n_m(i)$, $i=0, 1, \ldots, N_{cw}-1$ denote the number of symbols that have been corrected in code word $C_{i,m}$ during RS-decoding. For the Reed-Solomon codes $RS(L_i, L_i-2t)$ in question (the Hamming distance being $2t+1$ and thus the number of correctable symbols being t), the probability to pick a random word w of n symbols in $GF(16)^n$ that can be corrected into a $RS(n,n-2t)$ code word by modifying $\tau \leq t$ symbols, is given by $$r(n,t,\tau) := 16^{-2t} \binom{n}{\tau} 15^\tau. \quad (32)$$

Consequently, the risk value for mode m may be taken to be $$\rho_m := 2^{-8N_{hash}(N_s,m)} \prod_{i=0}^{N_{cw}-1} r\left(L_i, \frac{\delta_i(m)-1}{2}, n_m(i)\right) \quad (33)$$

and $m_{fec}$ would be chosen such that $\rho_{m_{fec}}$ is minimal.

The proposed mode decision takes a slightly different path. Instead of aiming for a full decoding for all possible modes, the mode detector takes a parallel approach, narrowing down the list of candidate modes step by step and reaching a final decision after processing the first 6 code words. This approach has the advantage of being less computationally complex on average.

Figure 16:
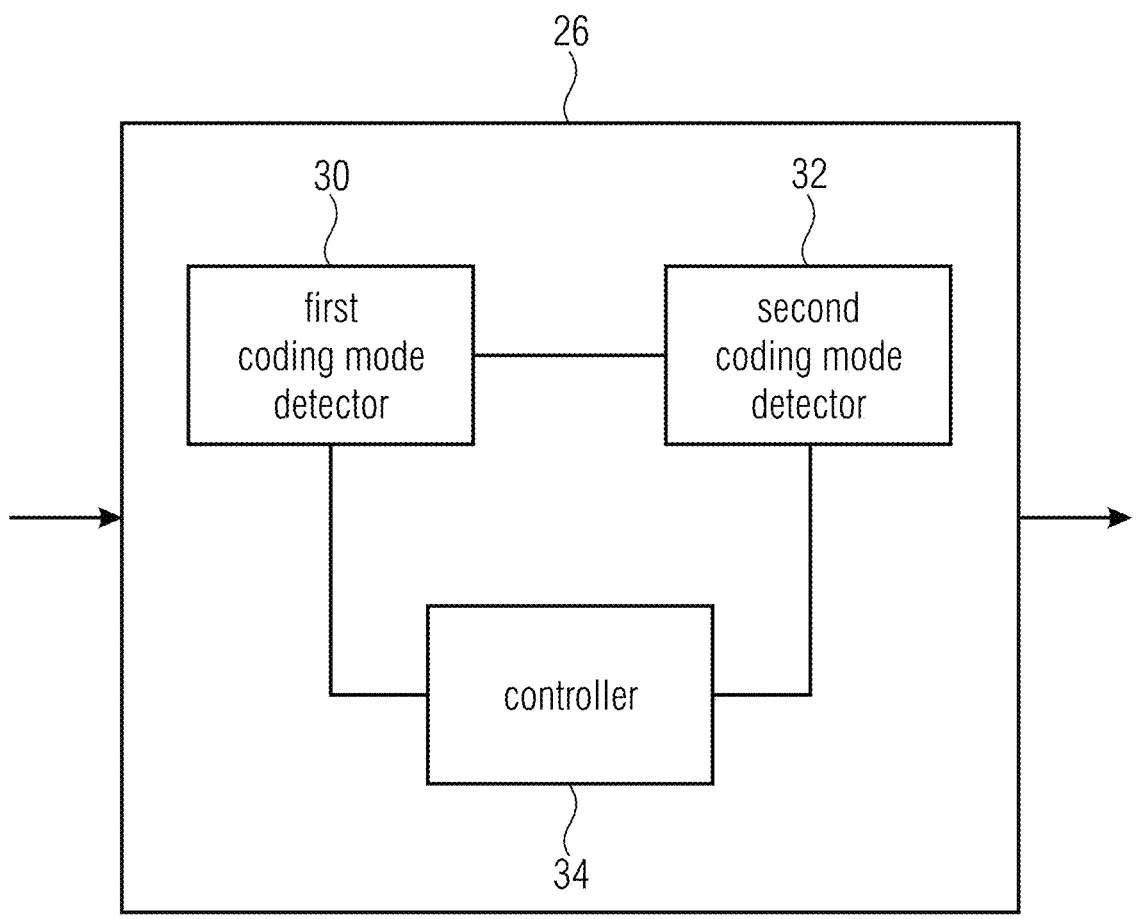
FIG. 16 shows a block diagram illustrating an example of a decoding mode detector of the channel decoder located in the channel decoder shown in FIG. 15 according to the embodiments of the present application.

FIG. 16 shows a block diagram illustrating an example of a decoding mode detector 26 of the channel decoder located in the channel decoder 20 shown in FIG. 15. The decoding mode detector 26 comprises a first decoding mode detector 30, a second decoding mode detector 32 and a controller 34. The decoding mode detector 26 is configured to perform a first decoding mode operation at the first decoding mode detector 30 and a second decoding mode operation at the second decoding mode detector 32. The controller 34 may include a memory/storage for storing the candidate list of the decoding mode.

Figure 17:
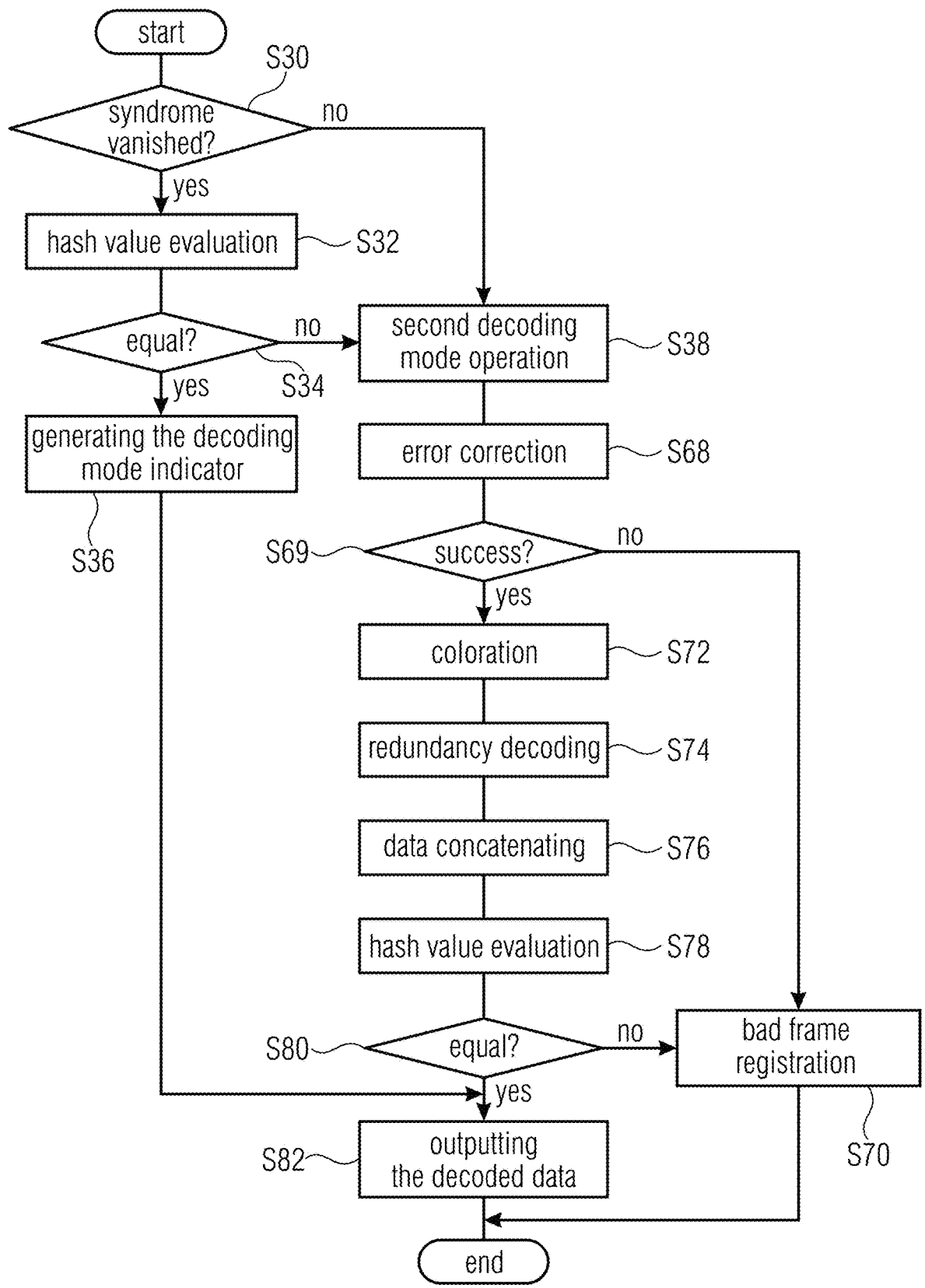
FIG. 17 shows a flowchart for an example of decoding mode detection operations of the decoding mode detector implemented by the decoding mode detector shown in FIG. 16 and an example of the decoding operation of the channel decoder implemented by the channel decoder shown in FIG. 15 according to the embodiments of the present application.

FIG. 17 shows a flowchart for an example of decoding mode detection operations of the decoding mode detector implemented by the decoding mode detector shown in FIG. 16 and an example of the decoding operation of the channel decoder implemented by the channel decoder shown in FIG. 15.

The first decoding mode operation is performed by testing whether the certain decoding mode is mode 1. At first, syndromes of the code word are calculated and when the calculated syndromes vanish, i.e., calculated syndrome without value, (S30), a hash value is calculated and evaluated (S31). That is, if the decoding mode is mode 1, there should be no error and therefore, the syndrome has value zero. When the calculated syndrome has a value, the first decoding mode operation is terminated and proceeds to the second coding mode operation (S38). When calculated hash value is not equal to the included hash value (received hash value) in the code word (S34), the first decoding mode operation is terminated and proceeds to the second decoding mode operation (S38). When the hash values are the same (S34), the first decoding mode detector 30 generates the decoding mode indicator (S36) and the controller 34 performs to precede further steps to output the decoding data (S82).

Figure 18:
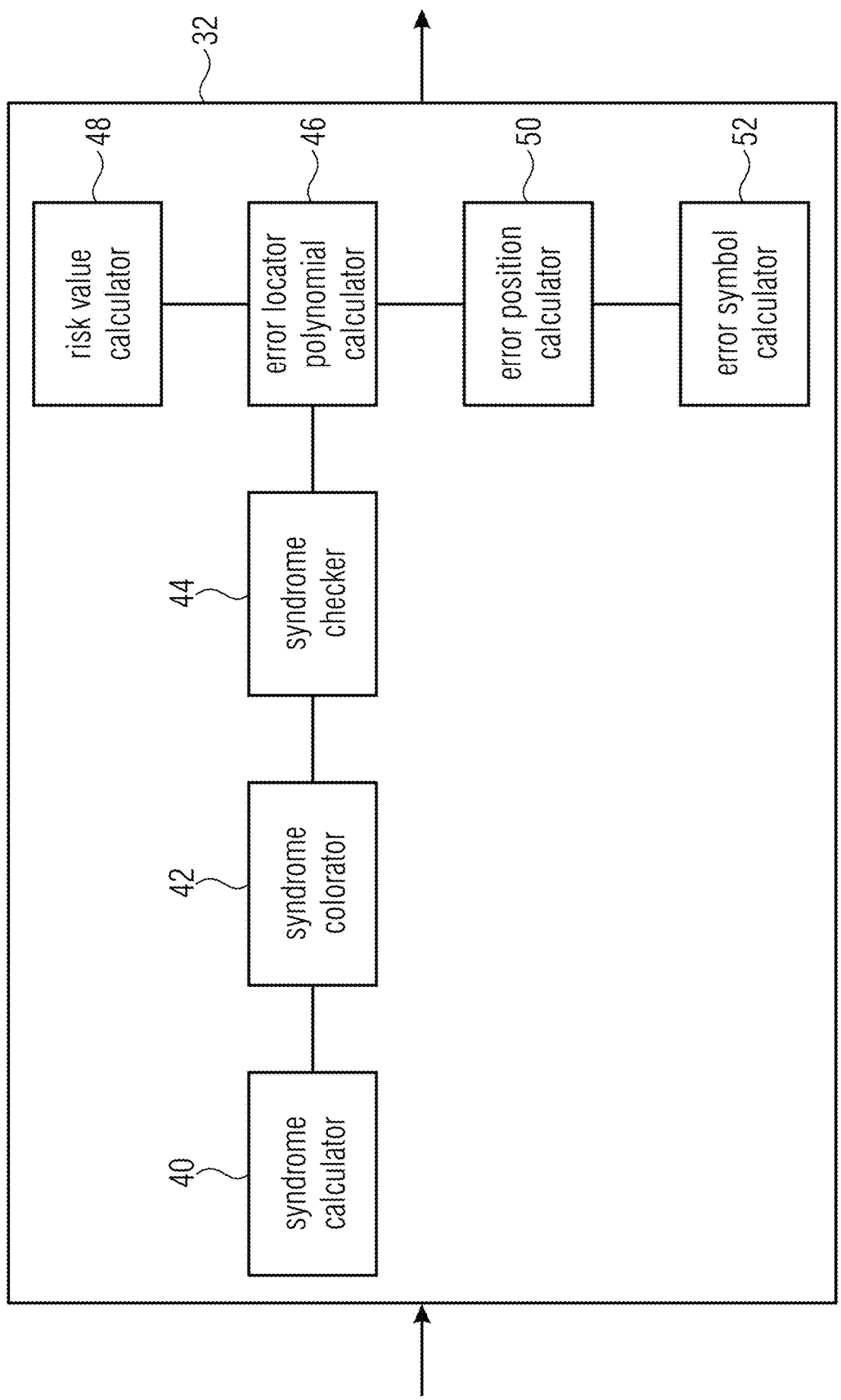
FIG. 18 shows a block diagram illustrating an example of a second decoding mode operation of the decoding mode detector implemented by the decoding mode detector shown in FIG. 16 according to the embodiments of the present application.

FIG. 18 shows a block diagram illustrating an example of a second decoding mode detector 32 of the decoding mode detector implemented by the decoding mode detector shown in FIG. 16. The second decoding mode detector 32 comprises a syndrome calculator 40, a syndrome colorator 42, a syndrome checker 44, an error locator polynomial calculator 46, a risk value calculator 48, an error position calculator 50 and an error symbol calculator 52. In the second decoding mode operation, the syndrome colorator 42 applies a coloration sequence for decoloring the calculated syndrome, since performing coloration on code words or syndromes is basically the same thing.

Figure 19:
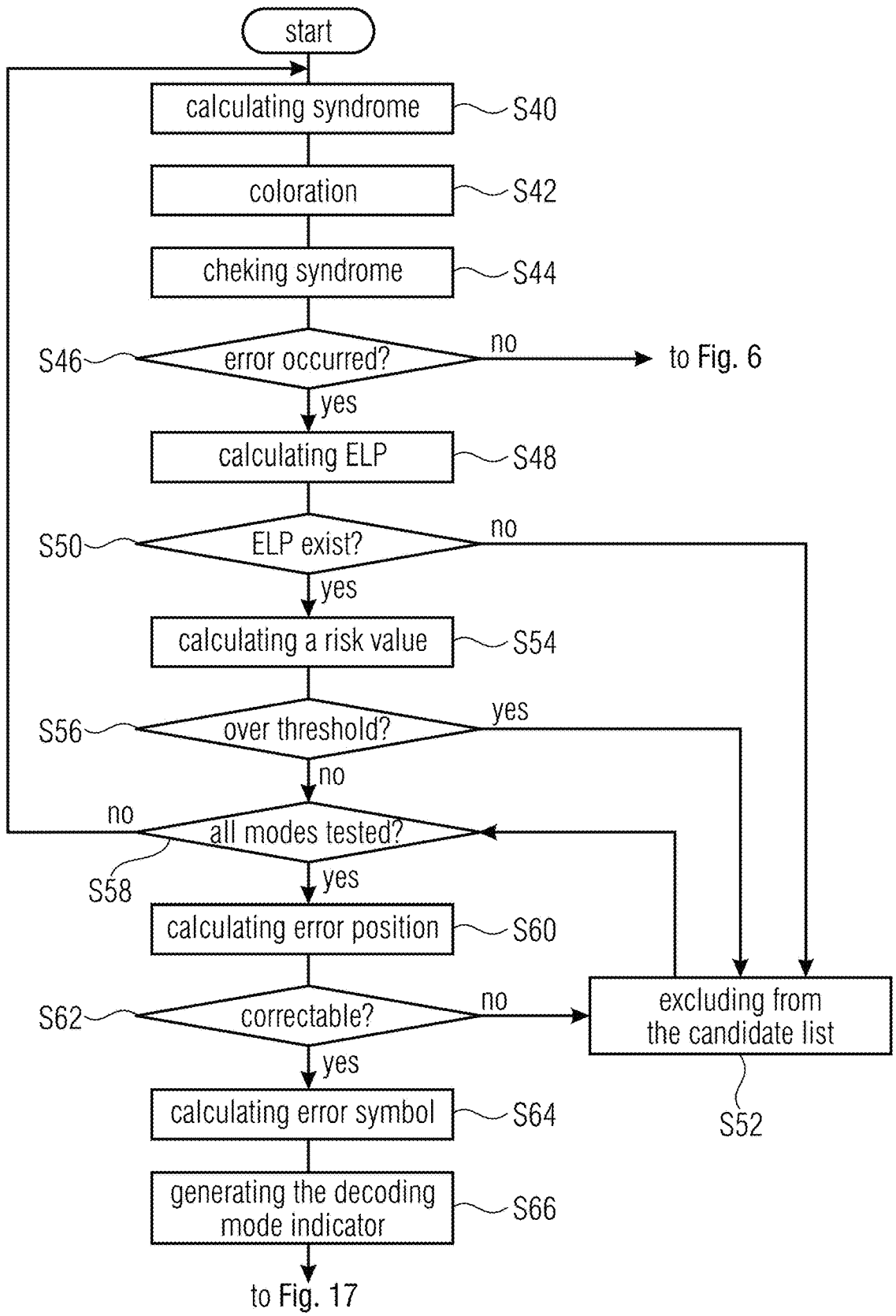
FIG. 19 shows a flowchart for an example of a procedure of the second decoding mode operation implemented by the second decoding mode detector shown in FIG. 18 according to the embodiments of the present application.

FIG. 19 shows a flowchart for an example of a procedure of the second decoding mode operation implemented by the second decoding mode detector 32 shown in FIG. 18. As shown FIG. 19, a syndrome is calculated at the syndrome calculator 40 (S40) and the syndrome is colorated at the syndrome colorator 42 (S42). For example, the syndromes are colorated with the syndromes of the coloration sequence associated to the next candidate mode in the candidate list, e.g., coloration sequence $\text{sig}_2$ associated with mode 2. Coloring the syndromes of a code word with the syndromes of a coloration sequence produces the same output as coloring the code word prior to calculating its syndromes but it is computationally less complex. The de-colorated syndrome is checked, i.e., the value of the syndrome is checked, at the syndrome checker 44 (S44). If all syndromes vanish for one mode, then this mode is selected directly without checking further modes. When the de-colorated syndrome has a value, the error occurred (S46) and therefore, error locator polynomials (ELPs) are calculated at the error locator polynomial calculator 46 (S48). In case the ELP does not exist (S50), i.e., the ELP is not able to be calculated, the decoding mode is excluded from the candidate list (S52), and if there is any mode which is not yet tested (S58), return to step S40. For example, ELP for the de-colorated syndrome applied the coloration sequence $\text{sig}_2$ is not existed, and then the decoding mode 2 is excluded from the candidate list. When the ELP exists (S50), the risk value is calculated at the risk value calculator 48 (S54). When the calculated risk value is larger than a predetermined threshold (S56), the mode is excluded from the candidate list (S52). When the risk value is less than the predetermined threshold (S56), it is checked whether there are any modes which have not yet been tested in the candidate list (S58). When there are any modes which have not yet been tested in the candidate list (S58), then the process returns to step S40. When all modes in the candidate list have been tested (S58), an error position is calculated by the error position calculator 50 (S60). When the error is not correctable based on the calculated error position (S62), the decoding mode is excluded from the candidate list (S52). When the error is correctable (S62), an error symbol is calculated by the error symbol calculator 52 (S64), and the decoding mode indicator is generated (S66).

Then, as depicted in FIG. 17, the error is corrected by the error corrector 62 (S68). When the error correction is not successful, the frame including the code word having an uncorrectable error is registered as a bad frame (S70). When the error correction succeeds, code words are colorated based on the decoding mode indicator by the colorator 22 (S72). Then, the colored (de-colorated) code words are decoded based on the decoding mode indicator by the redundancy decoder 24 (S74) and the data words are concatenated by the data combiner 64 (S76). The hash value of the concatenated data is calculated and compared to the included hash value for evaluating the hash value (S78). When the hash values match (S80), the decoded data is output. When the hash values do not match (S80), the decoded frame is registered as the bad frame (S70).

Figure 21:
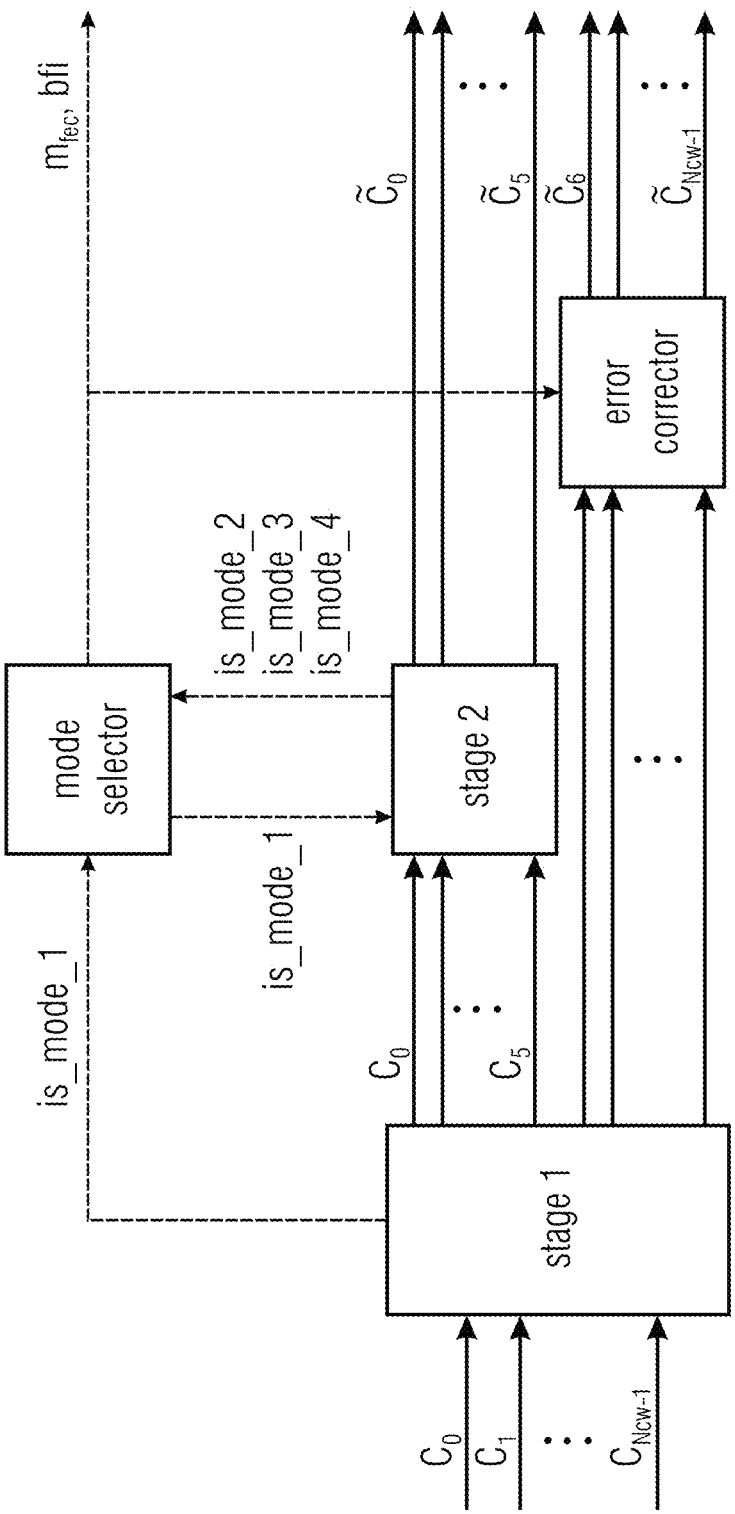
FIG. 21 shows a block diagram illustrating a variation of a decoding mode detector of the channel decoder located in the channel decoder shown in FIG. 20 according to the embodiments of the present application.

FIG. 21 shows a block diagram illustrating a variation of a decoding mode detector of the channel decoder located in the channel decoder shown in FIG. 20. FIG. 21 shows a schematic block diagram which depicts the operation performed by the mode detector 26 in FIG. 20. That is, the mode detector 26 in FIG. 20 comprises a first decoding mode detector performing a stage 1 (the first decoding mode operation), a second decoding mode detector performing a stage 2 (the second decoding mode operation), a mode selector and an error corrector.

First Mode Detection Operation (Stage 1)

Figure 22:
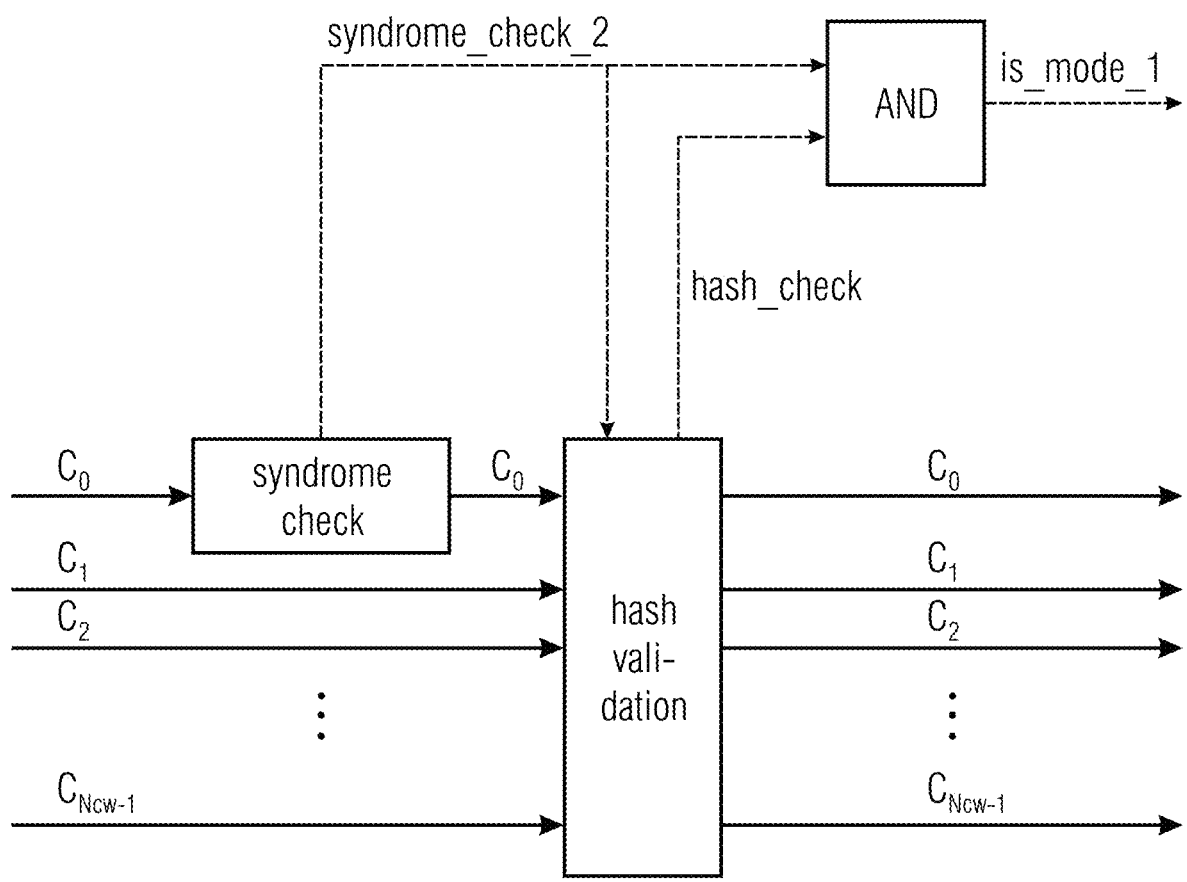
FIG. 22 shows a schematic illustration of an operation of a first decoding mode operation implemented by the mode detector shown in FIG. 20.

FIG. 22 shows a chart of the stage 1 performance. As shown in FIG. 22, the first stage mode detection is performed to test, whether the FEC mode $m_{fec}$ is 1. The following notation is used to denote the i-th code polynomial in GF(16)[x] corresponding to the i-th code word:

$$[C_i](x) := \Sigma_{k=0}^{L\sigma-1}[C_i(k)]x^k \quad (34)$$

Selection of FEC mode 1 depends on two conditions. Firstly, the first two syndromes need to vanish, i.e.

$$[C_0](\alpha) = [C_0](\alpha^2) = 0, \quad (35)$$

and secondly, the re-calculated hash value needs to match the received hash value. If both conditions are satisfied, the decoding indicator is generated to indicate that the mode 1 is the certain decoding mode and the data is decoded according to the data arrangements at the encoder. If at least one of these conditions is violated, mode 1 is excluded from the list of candidate modes and mode detection enters stage 2.

That is, as shown in FIG. 22, if both conditions are satisfied, the first decoding mode detector notices that the certain decoding mode is mode 1 (as indicated "is_mode_1" in FIG. 21). In this case, further procedures, i.e., the stage 2 and the error correction are skipped.

Second Mode Detection Operation (Stage 2)

Figure 23A:
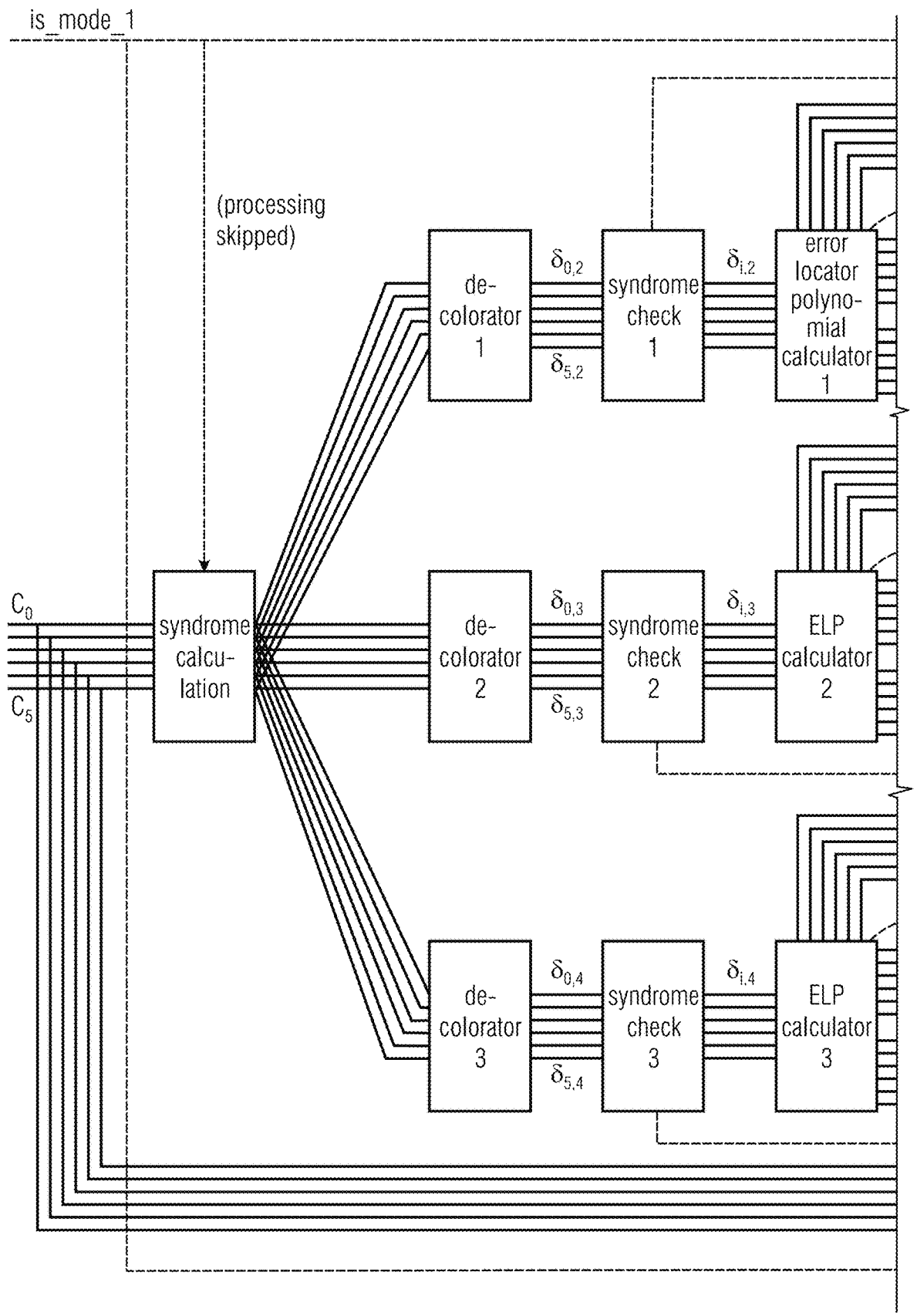
FIG. 23 shows a schematic illustration of an operation of a second decoding mode operation implemented by the second decoding mode detector shown in FIG. 18.
Figure 23B:
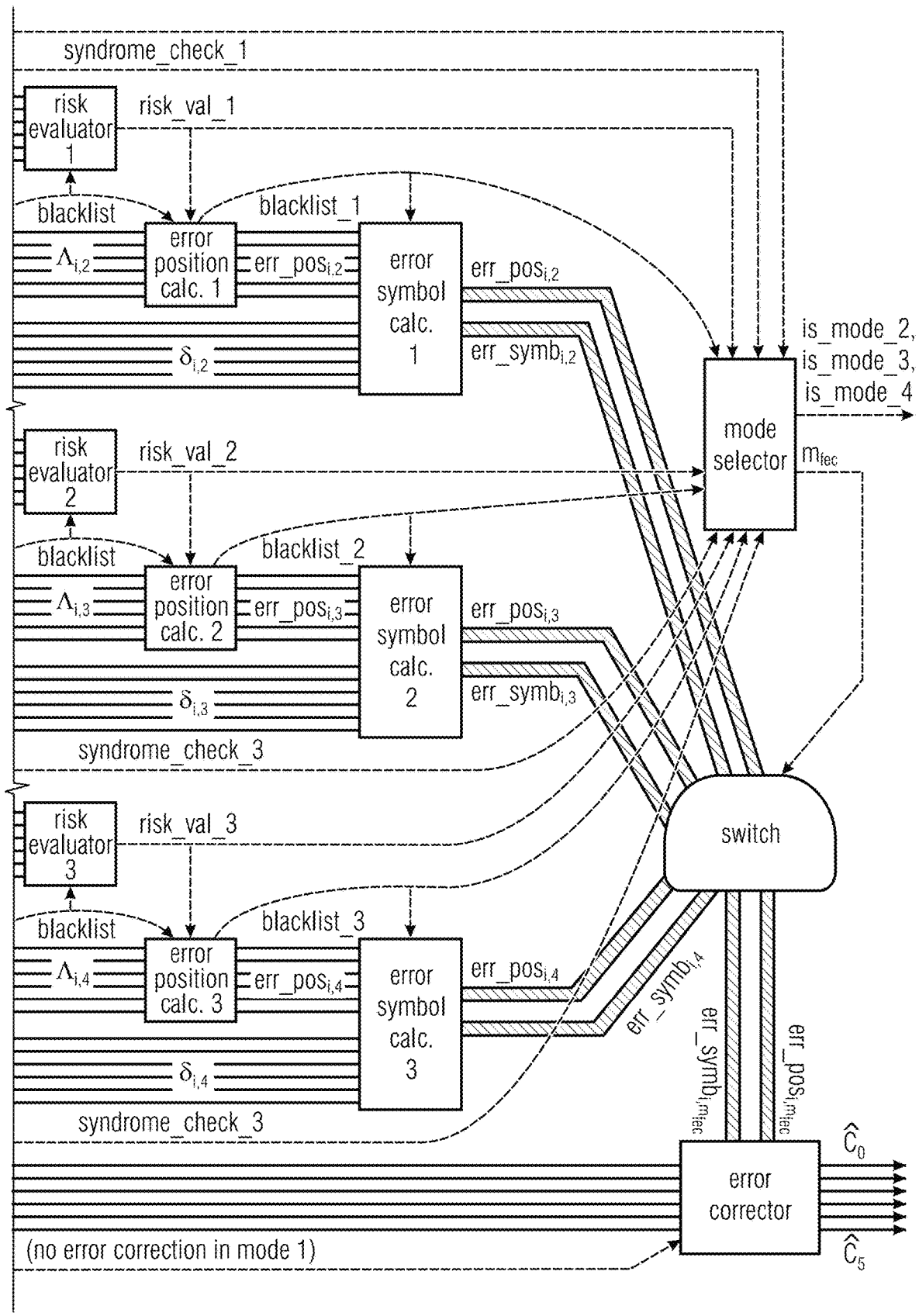

FIG. 23 shows a chart of stage 2 performed by the second decoding mode detector. As shown in FIG. 23, when the certain decoding mode is already selected in stage 1, the process in the stage 2 is skipped. In addition, if the certain decoding mode is mode 1, it is assumed that no errors have occurred, and therefore, no error correction is performed. In FIG. 23, three processes are depicted, i.e., the syndrome of 6 code words are calculated, the decoding mode detection operation for mode 2, for mode 3 and for mode 4 are depicted. That is, syndromes for a predetermined number of code words are calculated, e.g., for six code words $C_0$ to $C_5$, six syndromes for every code words are calculated, i.e., $\sigma_k = \Sigma_{j=0}^{L_i-1}[C_i(j)]^{\alpha \cdot k \cdot j}$. The operation for mode 2 is performed by a de-colorator 1, a syndrome checker 1, an error locator polynomial calculator 1, a risk evaluator 1, an error position calculator 1 and an error symbol calculator 1. The operation for mode 3 is performed by a de-colorator 2, a syndrome checker 2, an error locator polynomial calculator 2, a risk evaluator 2, an error position calculator 2 and an error symbol calculator 2. The operation for mode 4 is performed by a de-colorator 3, a syndrome checker 3, an error locator polynomial calculator 3, a risk evaluator 3, an error position calculator 3 and an error symbol calculator 3.

Figure 24:
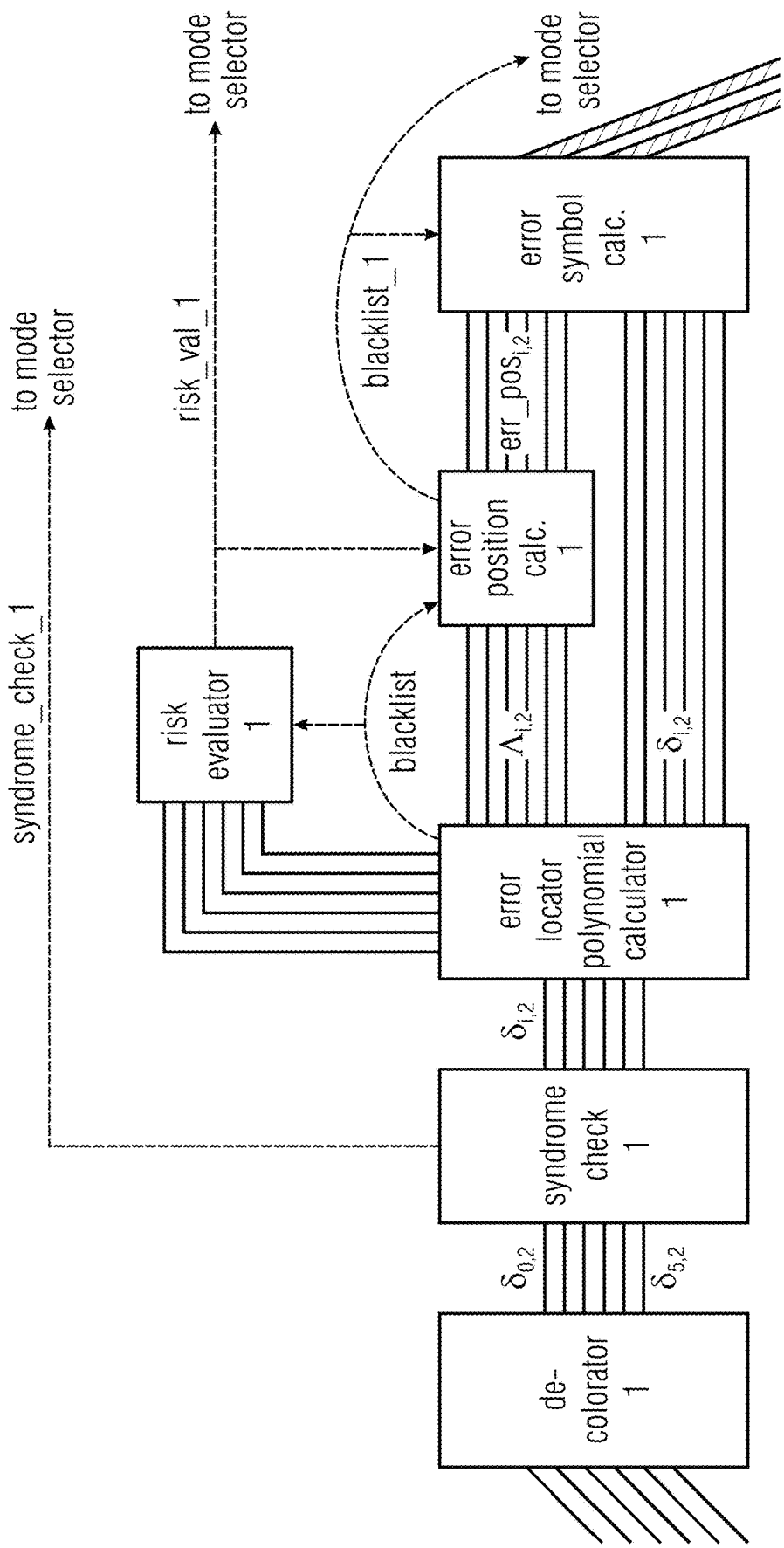
FIG. 24 shows an enlarged schematic illustration of the operation of the second decoding mode operation shown in FIG. 23.

FIG. 24 shows an enlarged part of FIG. 23 indicating the operation for mode 2. At the operation for mode n+1, i.e., for mode 2, the de-colorator n, i.e. the de-colorator 1 de-colorates calculated syndrome according to mode 2: $\sigma_{k,n+1} = \sigma_k + \Sigma_{j=0}^{L_i-1}[\text{sig}_{n+1}]\alpha^{k \cdot j}$. The syndrome check 1 tests if $\sigma_{k,n+1} = 0$ for $k=1, 2, \ldots, 2 \cdot n$. The result of the test is sent to the mode selector as syndrome_check_1. The error location polynomial (ELP) $\Lambda_{i,n+1}$ is calculated at the ELP calculator n, i.e., ELP calculator 1 for mode 2. The mode 2 (mode n+1) is excluded from the candidate list (blacklisted in the candidate list), if $\Lambda_{i,n+1}$ does not exist for one i∈ {0, 1, 2, 3, 4, 5}. The risk evaluator n, i.e., the risk evaluator 1 for mode 2, calculates risk value from degrees of $\Lambda_{i,n+1}$ according to $$\rho_{n+1} := \prod_{i=0}^{N_{cw}-1} r\left(14, \frac{\delta_i(n+1)-1}{2}, d_{i,n+1}\right).$$

The calculated risk value is sent to the mode selector and the error position calculator 1 as risk_value_1. The error position calculator n, i.e., the error position calculator 1 for mode 2, calculates error positions in mode n+1, i.e., mode 2 by factorizing $\Lambda_{i,n+1}$. If factorization fails, or if an error position is out of bounds, or if the risk value is above the predetermined threshold, the mode 2 is excluded from the candidate list (blacklisted). The error symbol calculator n, i.e., the error symbol calculator 1 for mode 2, calculates error symbols in mode 2 (n+1) from $\sigma_{i,n+1}$ and error position err_pos$_{i,n+1}$.

As shown in FIG. 23, the same operation performed for mode 2 is also performed for mode 3 and mode 4. Then, the data indicating the error position, err_pos$_{i,2}$ and the data indication the error symbol err_symb$_{i,2}$, are sent from the error symbol calculator 1 to the switch. Also, err_pos$_{i,3}$ and err_symb$_{i,3}$ are sent from the error symbol calculator 2 to the switch, and err_pos$_{i,4}$ and err_symb$_{i,4}$ are sent from the error symbol calculator 2 to the switch. The mode selector selects the certain decoding mode according to following steps:

1. If it is indicated "is_mode_1", then mode 1, if it fails, then check "is_mode_n", n=2, 3, 4; exit,
2. If syndrome_check=true for an n, then $m_{fec}$=n+1 (no errors) is selected,
3. If all modes are blacklisted, no mode is selected, i.e., is_mode_n<0, and
4. From modes which remain in the candidate list (not blacklisted) select $m_{fec}$ for which risk_val_($m_{fec}$−1) is minimal.

Then, the switch switches between inputs according to $m_{fec}$ (output is irrelevant if no mode is selected). At the error corrector, if is_mode_1, i.e., $m_{fec}$=1 then output=input, since no error occurs. Otherwise the error corrector corrects symbols indicated by err_pos$_{i,mfec}$ by XORing with err_symb$_{i,mfec}$. Detailed processes are explained as below.

In the stage 2, the list of candidate modes is further reduced in several steps. The procedure to select the certain decoding mode terminates as soon as a valid mode has been found or if no valid mode remains on the candidate list. In the latter case decoding is stopped and the frame is marked as a bad frame.

Stage 2 only considers the code words $C_0$ to $C_5$ for mode detection. In this embodiment, the number of the code words is six, however, this number may be different, for example, dependent on circumstances of transmitting channel, transmitting environments, useful protection strength, and/or performance of codec.

First, the syndromes $$\sigma_{i,m}(k):=[C_{i,m}](\alpha^k) \qquad (36)$$

of the colored code words are calculated for $i=0, 1, \ldots, 5$, $m=2, 3, 4$ and $k=1, 2, \ldots, \delta_i(m)-1$, i.e., for the first at least six transmitted code words. It is noteworthy that $$[C_{i,m}](\alpha^k)=[C_i](\alpha^k)+\text{sig}_k(\alpha^k) \qquad (37)$$

where $\text{sig}_k(a^k)$ may be tabulated. That is, the syndromes of the colored code words $C_{i,m}$ may be computed efficiently by coloring the syndromes of the code words $C_i$. So considering all modes does not increase worst case complexity of syndrome calculation.

If an m exists, such that $\sigma_{i,m}(k)=0$ for $k=1, 2, \ldots, \delta_i(m)-1$, then mode m is selected. Note that this is typically the case if no transmission errors occurred and that by the selection of $\text{sig}_k$ such an m is typically unique.

Otherwise, transmission errors have occurred and mode detection proceeds to calculating error locator polynomials for the remaining modes. At this stage, these are polynomials $$\Lambda_{i,m}(x):=1+\lambda_{i,m}(1)x+\ldots+\lambda_{i,m}(d_{i,m})x^{d_{i,m}}, \qquad (38)$$

where $$d_{i,m} \leq \frac{\delta_i(m)-1}{2}$$

and where the coefficients are a unique solution to $$\sigma_{i,m}(n)+\Sigma_{k=1}^{d_{i,m}}\lambda_{i,m}(k)\sigma_{i,m}(n-k)=0 \qquad (39)$$

for $n=d_{i,m}+1, d_{i,m}+2, \ldots, \delta_i(m)-1$. Such a polynomial does not necessarily exist if code word i is not correctable in mode m and if a code word is encountered for which no such $\Lambda_{i,m}$ can be found, mode m is excluded from the list of candidate modes.

Otherwise, i.e., such $\Lambda_{i,m}$ is found, a risk value is calculated for all remaining modes m according to $$\rho_m := \prod_{i=0}^{N_{cw}-1} r\left(14, \frac{\delta_i(m)-1}{2}, d_{i,m}\right) \qquad (40)$$

The code word length 14 is hereby used as an estimate for the real risk $$r\left(L_i, \frac{\delta_i(m)-1}{2}, d_{i,m}\right)$$

since $L_i$ varies from 13 to 15 for the slot sizes in question. The modes for which $\rho_m$ is larger than a given threshold are excluded from further processing. It is noted that the threshold is, for example, $6\times10^{-8}$, however, this value may be varied dependent on the useful transmitting quality and other useful criteria.

For the remaining modes (at this stage usually only one mode remains) the error locator polynomials are factorized in $GF(16)[x]$. Factorization is said to be successful if the polynomial splits into distinct linear factors of the following kind:

$$\Lambda_{i,m_k}(x)=\Pi_{j=1}^{d_{i,mk}}(x+\alpha^{-n_{mk,i,j}}), \text{ where } 0 \leq n_{m_k,i,j} < L_i,$$
$$\text{and } n_{m_k,i,j} \neq n_{m_k,i,k} \text{ for } j \neq k. \qquad (41)$$

If this is the case, then $C_{i,m_k}$ is correctable into a valid $RS(L_1, L_i-\delta_i(m_k)+1)$ code word by modifying $C_{i,m_k}(n_{m_k,i,j})$ for $j=1, 2, \ldots, d_{i,m_k}$. All modes for which at least one error locator polynomial does not split according to the formula (41) are excluded from the list of candidate modes. If multiple modes remain in the candidate list the certain decoding mode $m_{fec}$ is chosen such that the decoding risk $\rho_{m_{fec}}$ is minimal.

On successful mode detection, error correction of the code words $C_{i,m_{fec}}$ is performed. If correction fails, the frame is marked as a bad frame and decoding is terminated. Otherwise, the data is decoded after performing de-coloration according to the selected mode at the redundancy decoder 24 according to the data arrangements of the encoder in FEC mode $m_{fec}$.

If $m_{fec}>1$ the decoded data is validated by re-calculating the hash value and compared to the hash value included in the transmitted code words at the post processor 68. If validation is successful, the decoded data is output according to the data arrangement at the encoder. Otherwise, a bad frame is signaled to the channel encoder 2.

When the decoding mode is selected, the decoding mode indicator indicating the certain decoding mode is generated and sent to the de-colorator 22, the RS decoder 24 and the post processor 68 as shown in FIG. 20. Also as shown in FIG. 20, the de-colorator 22 de-colorates according to mode $m_{fec}$ by XORing the first 6 code words with $\text{sig}_{m_{fec}}(k)$. The RS decoder 24 only extracts data parts of code words, i.e., error correction is performed earlier on colored code words. The decoding mode indicator is also sent to the RS decoder 24, because it is useful to know the certain decoding mode to identify the amount of redundancy. The decoding process of decoding according to the certain decoding mode in a way as disclosed in "*Error Correction Coding: Mathematical Methods and Algorithms*", Todd K. Moon, 2005. The data combiner 64 concatenates input to obtain output, and the post processor 68 validates data if $m_{fec}>1$ and removes hash data.

In accordance with the embodiments of the present application, the channel encoder indicates the coding mode by applying the coloration sequence to the code word of the frame. Therefore, it is not necessary to separately transmit the data to indicate the certain coding mode and useful parameters, and hence, data transmission rate is improved. In addition, the information/indication of the coding mode is included in the code word by applying the coloration sequence which is selected in accordance with the coding mode, and hence, it is possible to provide error resilient mode signaling. Furthermore, the information/indication of the coding mode is distributed in the code word by applying the coloration sequence, and therefore, the information/indication of the coding mode is received at the channel decoder in an error resilient way. In addition, the channel decoder is able to determine the decoding mode without separately receiving specific information about the decoding mode and parameters to determine the decoding mode. Hence, data transmission ratio of the channel is effectively improved.

In accordance with the embodiments of the present application, the channel decoder performs a test decoding to examine whether an error has occurred or not for detecting the decoding mode. Therefore, in case no transmission error has occurred, a reliable decoding mode is determined in a simple calculation.

In accordance with the embodiments of the present application, in case the transmission error has occurred, the channel decoder performs error correction for a predetermined number of code words as a test and calculates the risk value of errors (reliability measure). Therefore, without receiving specific information and parameters from the channel encoder, it is possible to determine appropriate decoding mode by testing the predetermined number of code words and considering the reliability measure.

In accordance with the embodiments of the present application, the decoding mode indicator comprises a decoding mode detector for detecting the decoding mode by testing the predetermined number of code words to deduce the candidate of the decoding mode in the decoding mode candidate list. The candidates in the candidate list is excluded or blacklisted based on occurred errors, and the certain decoding mode is finally selected from the remaining decoding mode candidates in the candidate list considering the reliability measure (risk value). Then the decoding mode indicator includes risk value of the selected decoding mode and in case the risk of error is larger than a predetermined threshold, the frame is registered as a bad frame. Therefore, it is possible to select reliable and appropriate decoding mode by testing only the predetermined number of code words.

Further embodiments are subsequently described.
Application Layer Forward Error Correction
1. Channel Coder
1.1 Functions and Definitions
1.2 General Channel Coder Parameters
1.2.1 FEC Mode The FEC mode m is a number from 1 to 4, where m=1 provides only basic error protection and m=2, 3, 4 provides increasing error correction capability. At the channel encoder the FEC mode is denoted by $m_{fec}$ and at the channel decoder it is denoted $n_{fec}$.

1.2.2 Slot Size

The slot size $N_s$ specifies the size of the channel encoded frame in octets. $N_s$ may take all integer values from 40 to 300, covering nominal bitrates from 32 to 240 kbps at a frame rate of 100 Hz.

1.2.3 CMR

The coding mode request CMR is a two-bit symbol represented by numbers from 0 to 3.

1.2.4 Joint Channel Coding Flag

The joint channel coding flag jcc_flag takes values 0 and 1 and indicates that the input data contains data from multiple audio channels.

1.3 Derived Channel Coder Parameters
1.3.1 Number of Code Words

The parameter $N_{cw}$ specifies the number of code words that are used to encode the data frame. It is derived from the slot size by $$N_{cw} := \left\lceil \frac{2N_s}{15} \right\rceil.$$

1.3.2 Code Word Lengths

The parameter $L_i$ is defined for $i=0 \ldots N_{cw}-1$ and specifies the length of the ith code word in semi-octets. It is derived from the slot size $N_s$ as $$L_i := \left\lfloor \frac{2N_s - i - 1}{N_{cw}} \right\rfloor + 1.$$

1.3.3 Hamming Distances

The parameter $d_{i,m}$ specifies the hamming distance of code word i in FEC mode m. It is given by $$d_{i,1} := \begin{cases} 1, & i = 0 \\ 0, & i > 0 \end{cases}$$

and for m>1 by $d_{i,m} := 2m-1$ for $i=0 \ldots N_{cw}-1$.

1.3.4 Number of Partial Concealment Code Words

The parameter $N_{pccw}$ specifies the number of partial concealment code words and is derived from slot size $N_s$ and FEC mode m by $$N_{pccw} := \begin{cases} \left\lfloor \frac{0.080447761194030 \cdot N_s -}{1.791044776119394 + 0.5} \right\rfloor, & m = 3 \text{ and } N_s \geq 80 \text{ and } \\ & \text{jcc\_flag} = 0 \\ \left\lfloor \frac{0.066492537313433 \cdot N_s -}{1.970149253731338 + 0.5} \right\rfloor, & m = 4 \text{ and } N_s \geq 80 \text{ and } \\ & \text{jcc\_flag} = 0 \\ 0, & \text{else.} \end{cases}$$

1.3.5 Size of Partial Concealment Block

The parameter $N_{pc}$ specifies the size of the partial concealment block in semi-octets and is derived from slot size $N_s$ and FEC mode m by $$N_{pc} := \sum_{i=N_{cw}-N_{pccw}}^{N_{cw}-1} L_i - d_{i,m} + 1.$$

1.3.6 CRC Hash Sizes

The numbers $N_{CRC1}$ and $N_{CRC2}$, which correspond to sizes of CRC hash values, are derived from slot size and FEC mode m by $$N_{CRC1} := \begin{cases} 2, & m \geq 3 \text{ and } N_s = 40 \\ 3, & \text{else} \end{cases}$$

and $$N_{CRC2} := \begin{cases} 0, & m \leq 2 \text{ or } N_s < 80 \text{ or } \text{jcc\_flag} = 1 \\ 2, & \text{else.} \end{cases}$$

1.3.7 Payload Size

The payload size $N_p$ specifies the data size in a channel encoded frame of size $N_s$ encoded in FEC mode m in octets, which is given by $$N_p := N_s - N_{CRC1} - N_{CRC2} - \sum_{i=0}^{N_{cw}-1} \frac{d_{i,m} - 1}{2}.$$

1.4 Algorithmic Description of the Channel Encoder
1.4.1 Input/Output

The channel encoder takes as input the slot size $N_s$, the FEC mode $m_{fec}$, the coding mode request CMR, a data sequence, for example, $a_{dat}(0 \ldots N_p-1)$ of octets and a joint channel coding flag jcc_flag and returns a sequence of octets $a_{cc}(0 \ldots N_s-1)$. Octets are interpreted as numbers from 0 to 255 according to the specified endianness.

1.4.2 Data Pre-Processing

The data sequence is first split into a sequence $a_n(0 \ldots 2N_p-1)$ of semi-octets with reversed ordering, where $a_n(2k)$ holds the upper half of $a_{dat}(N_p-1-k)$ and $a_n(2k+1)$ holds the lower half. In formulas this is $$a_n(2k) := \left\lfloor \frac{a_{dat}(N_p-1-k)}{16} \right\rfloor$$

and $$a_n(2k+1) := rem(a_{dat}(N_p-1-k), 16)$$

Next, CRC hash values are calculated on the bit-expansions of the sequences $$a_{n1}(0 \ldots 2N_p-N_{pc}-1):=a_n(0 \ldots 2N_p-N_{pc}-1)$$

and $$a_{n2}(0 \ldots N_{pc}-1):=a_n(2N_p-N_{pc} \ldots 2N_p-1).$$

Note that $N_{pc}$ might be zero in which case $a_{n2}$ is the empty sequence. The bit-expansion of a semi-octet sequence a $(0 \ldots N-1)$ is defined by the sequence $b(0 \ldots 4N-1)$, where $$b(4k+j):=\text{bit}_j(a(k))),$$

with k ranging from 0 to $N-1$ and j ranging from 0 to 3 and $\text{bit}_j$ is the function returning the jth bit according to the specified endianness.

The first CRC hash sequence, calculated on an extension of $a_{n1}$, has length $8N_{CRC1}-2$ and the binary generator polynomials are given by $$p_{14}(x)=1+x^2+x^6+x^9+x^{10}+x^{14}$$

and $$p_{22}(x)=1+x^3+x^5+x^8+x^9+x^{10}+x^{11}+x^{16}+x^{19}+x^{22}.$$

The second CRC hash sequence, calculated on $a_{n2}$, has length $8N_{CRC2}$ and the binary generator polynomial is given by $$p_{16}(x)=1+x+x^3+x^5+x^6+x^7+x^9+x^{13}+x^{15}+x^{16}.$$

The CRC hash sequence of length k on a binary data sequence $b(0 \ldots N-1)$ for a given binary generator polynomial $p(x)$ of degree k is defined as usual to be the binary sequence $r(0 \ldots k-1)$ such that the binary polynomial $$f(x) = \sum_{i=0}^{k-1} r(i)x^i + \sum_{i=0}^{N-1} b(i)x^{i+k}$$

is divisible by $p(x)$.

Let $b_{n1}$ denote the bit-expansion of $a_{n1}$ and let $b_{n2}$ denote the bit-expansion of $a_{n2}$. Then the sequence $r_{n1}(0 \ldots 8N_{CRC1}-3)$ is set to be the hash sequence of length $8N_{CRC1}-2$ calculated on the concatenated sequence $$b_{n1ext}=(\text{bit}_0(CMR),\text{bit}_1(CMR),b_{n1}(0) \ldots b_{n1}(8N_p-4N_{pc}-1)).$$

Furthermore, $r_{n2}(0 \ldots 8N_{CRC2}-1)$ is set to be the second hash sequence of length $8N_{CRC2}$ calculated on $b_{n2}$. Note that $r_{n2}$ is the empty sequence if $N_{CRC2}=0$.

The first pre-processed data sequence $b_{pp0}(0 \ldots 8(N_p+N_{CRC1}+N_{CRC2})-1)$ is then defined by $$b_{pp0}(0 \ldots 8N_{CRC1}-3):=r_{n1}(0 \ldots 8N_{CRC1}-3)$$

$$b_{pp0}(8N_{CRC1}-2):=\text{bit}_0(CMR)$$

$$b_{pp0}(8N_{CRC1}-1):=\text{bit}_1(CMR)$$

$$b_{pp0}(8N_{CRC1} \ldots 8(N_{CRC1}+N_{CRC2})-1):=r_{n2}(0 \ldots 8N_{CRC2}-1)$$

$$b_{pp0}(8(N_{CRC1}+N_{CRC2}) \ldots 8(N_p+N_{CRC1}+N_{CRC2})-4N_{pc}-1):=b_{n1}(0 \ldots 8N_p-4N_{pc}-1)$$

and $$b_{pp0}(8(N_{CRC1}+N_{CRC2}+N_p)-4N_{pc} \ldots 8(N_{CRC1}+N_{CRC2}+N_p)-1):=b_{n2}(0 \ldots 4N_{pc}-1).$$

The final pre-processed data sequence is given by swapping the CMR bits at positions $8N_{CRC1}-2$ and $8N_{CRC1}-1$ with bits at positions $k:=4(7-d_{0,m_{fec}}+1)+2$ and $k+2$, i.e.

$$b_{pp}(N_{CRC1}-2):=b_{pp0}(k)$$

$$b_{pp}(N_{CRC1}-1):=b_{pp0}(k+2)$$

$$b_{pp}(k):=b_{pp0}(N_{CRC1}-2)$$

$$b_{pp}(k+2):=b_{pp0}(N_{CRC1}-1)$$

and $$b_{pp}(n):=b_{pp0}(n)$$

for n different from $8N_{CRC1}-2$, $8N_{CRC1}-1$, k, and $k+2$. Swapping of these bits ensures that the CMR bits are stored in an FEC mode independent bit positions located in the middle of the channel encoded bitstream.

The bit-sequence $b_{pp}$ is converted into a semi-octet sequence $a_{pp}(0 \ldots 2(N_{CRC1}+N_{CRC2}+N_p))$ by reversing the bit-expansion, i.e.

$$a_{pp}(k):=b_{pp}(4k)+2b_{pp}(4k+1)+4b_{pp}(4k+2)+8b_{pp}(4k+3).$$

Note that it is not necessary to actually carry out the bit-expansions described in this clause as CRC hashes can be computed efficiently on data blocks.

1.4.3 Reed-Solomon Encoding

For Reed-Solomon (RS) encoding the pre-processed data sequence $a_{pp}$ from clause 1.4.2 is split into $N_{cw}$ sequences $D_i$, also referred to as data words, according to $$D_i(0 \ldots L_i-d_{i,m_{fec}})=a_{pp}(S_i \ldots S_i+L_i-d_{i,m_{fec}}),$$

where i ranges from 0 to $N_{cw}-1$ and where the split points $S_i$ are inductively defined by $S_0=0$ and $S_{i+1}=S_i+L_i-d_{i,m_{fec}}+1$.

The RS codes are constructed over $GF(16)=GF(2)/(x^4+x+1)$, where the residue class of x in $GF(2)/(x^4+x+1)$ is chosen as unit group generator, denoted as usual by $\alpha$. Semi-octets are mapped to elements of $GF(16)$ using the data-to-symbol mapping $$n \to [n]:=\text{bit}_0(n)\alpha^0+\text{bit}_1(n)\alpha^1+\text{bit}_2(n)\alpha^2+\text{bit}_3(n)\alpha^3.$$

The mapping is one-to-one and the inverse mapping is denoted $\beta \to \mathcal{C}\beta\rangle$, such that $[\mathcal{C}\beta\rangle]=\beta$.

With this notation the Reed-Solomon generator polynomials for Hamming distances 3, 5, and 7 are given by $$q_3(y):=[8]+[6]y+[1]y^2,$$

$$q_5(y):=[7]+[8]y+[12]y^2+[13]y^3+[1]y^4,$$

and $$q_7(Y):=[12]+[10]y+[12]y^2+[3]y^3+[9]y^4+[7]y^5+[1]y^6.$$

For i ranging from 0 to $N_{cw}-1$ the RS redundancy sequences $R_i(0 \ldots d_{i,m_{fec}}-2)$ for the data words $D_i$ are calculated. These are the (uniquely determined) sequences of semi-octets such that the polynomial $$f(y) := \sum_{k=0}^{d_{i,m_{fec}}-2} [R_i(k)]y^k + \sum_{k=0}^{L_i-d_{i,m_{fec}}} [D_i(k)]y^{k+d_{i,m_{fec}}-1}$$

is divisible by $q_{d_{i,m_{fec}}}(y)$. The ith code word $C_i$ is then defined to be the sequence of $L_i$ semi-octets given by $$C_i(0 \ldots d_{i,m_{fec}}-2) := R_i(0 \ldots d_{i,m_{fec}}-2)$$

and $$C_i(d_{i,m_{fec}}-1 \ldots L_i-1) := D_i(0 \ldots L_i-d_{i,m_{fec}}).$$

Note that if $d_{i,m_{fec}}=1$ the RS redundancy sequence is empty and $C_i$ simply equals $D_i$.

1.4.4 Mode Signaling

The FEC mode $m_{fec}$ is not explicitly transmitted but rather signalled implicitly by coloring the first 6 code words by mode dependent coloration sequences, i.e.

$$CC_i(k) := \begin{cases} bitxor(C_i(k), sig_{m_{fec}}(k)) & i < 6 \\ C_i(k) & \text{else,} \end{cases}$$

where bitxor(a, b) denotes the bit-wise XOR operation on two semi-octets. The signaling sequences $sig_m$ are given by $sig_1(0 \ldots 14) = (0,0,0,0,0,0,0,0,0,0,0,0,0,0,0)$
$sig_2(0 \ldots 14) = (7,15,5,6,14,9,1,3,12,10,13,3,2,0,0)$
$sig_3(0 \ldots 14) = (7,11,14,1,2,3,12,11,6,15,7,6,12,0,0)$
$sig_4(0 \ldots 14) = (6,15,12,2,9,15,2,8,12,3,10,5,4,0,0)$ Note that code word coloration leaves the CMR bits at bit positions 30 and 32 of $C_0$ unchanged.

1.4.5 Code Word Multiplexing

The sequences $CC_i$ are multiplexed into a sequence of octets first by interleaving the semi-octets according to $$a_{il}(N_{cw}k+i) := CC_i(k),$$

where i ranges from 0 to $N_{cw}-1$ and k ranges from 0 to $L_i-1$, and then by pairing consecutive semi-octets according to $$a_{cc}(k) := a_{il}(2k) + 16 a_{il}(2k+1)$$

where k ranges from 0 to $N_s-1$.

1.5 Algorithmic Description of the Channel Decoder

1.5.1 Input/Output

The channel decoder takes as input the slot size $N_s$ and a sequence $z_{cc}(0 \ldots N_s-1)$ of octets and a joint channel coding flag jcc_flag and returns the payload size $N_p$, a sequence of decoded octets $z_{dat}(0 \ldots N_p-1)$, a bad frame indicator bfi taking values 0, 1, and 2, a CMR estimate XNI taking values from 0 to 11, a number error_report taking values from −1 to 480 (indicating the number of corrected bits if bfi=0), and a bit position indicator fbcwbp for partial concealment.

The values $N_p$ and $z_{dat}(0 \ldots N_p-1)$ are only specified if bfi≠1, and the value of the bit position indicator fbcwbp is only specified if bfi=2.

1.5.2 Code Word De-Multiplexing

From the slot size $N_s$ the derived parameters $N_{cw}$ and $L_i$ are calculated according to clauses 1.3.1 and 1.3.2. The input sequence $z_{cc}(0 \ldots N_s-1)$ is then split into a sequence $z_{il}(0 \ldots 2N_s-1)$ of semi-octets according to $$z_{il}(2k) := rem(z_{cc}(k), 16)$$

and $$z_{il}(2k+1) := \left\lfloor \frac{z_{cc}(k)}{16} \right\rfloor$$

for k=0 ... $N_s-1$, and code words $XX_i$ are extracted according to the data arrangements of clause 1.4.5, i.e.

$$XX_i(k) := z_{il}(k N_{cw}+i),$$

where i ranges from 0 to $N_{cw}-1$ and k ranges from 0 to $L_i-1$.

1.5.3 Mode Detection

Mode detection aims at recovering the FEC mode $m_{fec}$ by analysing the code words $XX_i$, where i ranges from 0 to 5. The detected mode is denoted $n_{fec}$ and takes values from 0 to 4, where 0 indicates that no mode has been detected. Once a mode has been detected all derived codec parameters such as the payload size, number of partial concealment code words, etc. are defined according to this mode. The mode is chosen from a list of candidate modes, initially containing FEC modes 1 to 4, which is then narrowed down step by step.

1.5.3.1 Stage 1

Stage 1 tries to determine whether the frame was encoded in FEC mode 1. To this end, the first two syndromes of code word 0 are calculated, where the kth syndrome of code word $XX_i$ is defined to be the GF(16) symbol defined by $$S_k^{(i)} := \sum_{n=0}^{L_i-1} [XX_i(n)]\alpha^{kn}.$$

Mode 1 is selected if the following two conditions are satisfied:
1. $S_1^{(0)}=[0]$ and $S_2^{(0)}=[0]$.
2. The data, extracted according to the frame arrangement of $m_{fec}=1$, passes the first cyclic redundancy check as outlined in clause 1.5.7 with $z_{pp}(0 \ldots 2N_s-2)=(XX_0(2 \ldots Li-1), XX_1, \ldots, XX_{N_{cw}-1})$.

If these conditions are satisfied, error_report and bfi are set to 0 and the channel decoder outputs the data $z_{dat}(0 \ldots N_p-1)$ as generated in clause 1.5.7. Otherwise, mode detection enters stage 2 and mode 1 is removed from the candidate list.

1.5.3.2 Stage 2

Stage 2 tries to determine whether the frame was encoded in FEC modes 2, 3, or 4. To this end, the syndromes $S_k^{(i)}$ are calculated for i=0 ... 5 and k=1 ... 6.

If for one m∈{2,3,4} the conditions $$S_k^{(i)} + \sum_{n=0}^{13}[sig_m(n)]\alpha^{kn} = 0$$

are satisfied for i=0 ... 5 and k=1 ... $d_{i,m}-1$, that is all syndromes colored according to mode m vanish, then $n_{fec}:=m$ is selected and the channel coder proceeds to clause 1.5.6. Note that such an m is typically unique so the modes may be tested in any order.

If no such m can be found then mode detection calculates the error locator polynomials $\Lambda_{i,m}(y)$ for i=0 ... 5 and m=2 ... 4. This is done according to clause 1.5.5.1.1 with $$t = \frac{(d_{i,m}-1)}{2}$$

and $$\sigma_k = S_k^{(i)} + \sum_{n=0}^{13}[sig_m(n)]\alpha^{kn},$$

the colored syndromes according to mode m, for k=1 ... 2t.

All modes m for which $\Lambda_{i,m}(y)=[0]$ for at least one i from 0 to 5 are excluded from further consideration.

For the remaining modes a risk value is computed. The risk value rsk(m) for mode m is based on the degrees of the error locator polynomials $\Lambda_{i,m}$ (y) and is computed as mantissa exponent pair $$(\mu_m, \in_m) := ((((\mu_{0,m}, \in_{0,m})*(\mu_{1,m}, \in_{1,m}))*(\mu_{2,m}, \in_{2,m}))* \\ (\mu_{3,m}, \in_{3,m})*(\mu_{4,m}, \in_{4,m}))*(\mu_{5,m}, \in_{5,m}),$$

where the mantissa exponent pairs $(\mu_{i,m}, \in_{i,m})$ are specified in Table 2, and where the multiplication of two mantissa exponent pairs is defined as follows: Given two pairs $(\mu, \in)$ and $(\mu', \in')$, where $0 \leq \mu, \mu' < 2^{15}$, the product $(\mu, \in)*(\mu', \in')$ is defined to be the pair $(\mu'', \in'')$ given by $$\mu'' := \begin{cases} \lfloor \mu\mu' 2^{-14} \rfloor, & \mu\mu' < 2^{29} \\ \lfloor \mu\mu' 2^{-15} \rfloor, & \text{else} \end{cases}$$

and $$\epsilon'' := \begin{cases} \epsilon + \epsilon', & \mu\mu' < 2^{29} \\ \epsilon + \epsilon' + 1, & \text{else}. \end{cases}$$

Such a mantissa exponent pair $(\mu, \in)$ corresponds to the number $\mu * 2^{\in -14}$.

TABLE 2

| m\δ := deg($\Lambda_{i,m}$) | 0 | 1 | 2 | 3 |
|---|---|---|---|---|
| 1 (only for i = 0) | (16384, −8) | (26880, −1) | NA | NA |
| 2 | (16384, −8) | (26880, −1) | NA | NA |
| 3 | (16384, −16) | (26880, −9) | (20475, −2) | NA |
| 4 | (16384, −24) | (26880, −17) | (20475, −10) | (19195, −4) |

All modes m for which the corresponding risk value rks(m) lies above a slot size dependent threshold risk_thresh are removed from the list of candidate modes. The risk threshold is defined to be $$\text{risk\_thresh} := \begin{cases} 21990 * 2^{-37}, & N_s = 40 \\ 25166 * 2^{-24}, & N_s > 40 \end{cases}$$

The remaining modes with risk value smaller than or equal to risk_thresh are enumerated as $m_j$, j=1 ... n, such that for every j=1 ... n−1 either $rsk(m_j) < rsk(m_{j+1})$, or $rsk(m_j) = rsk(m_{j+1})$ and $m_j < m_{j+1}$ holds.

Starting from mode $m_1$, the error positions $n_{m_j,i,k}$ in code words $XX_i$ are determined according to clause 1.5.5.2 with $\Lambda(y) = \Lambda_{i,m_j}(y)$ for i=0 ... 5. If calculation of error position is successful for all code words then $n_{fec} = m_j$ is selected and the channel decoder proceeds to clause 1.5.5. Otherwise, if error positions cannot be determined for one index, the same procedure is carried out for mode $m_{j+1}$ while j<n. Otherwise, $n_{fec}$ is set to 0 indicating that no mode has been detected.

In case no mode is detected, i.e. $n_{fec}$=0, error_report is set to −1, CMR detection is carried out according to clause 1.5.4 with M={1, 2, 3, 4} before the channel decoder exits with bfi=1.

1.5.4 CMR Estimation when Frame is not Decodable

In case the frame is not decodable the CMR is estimated by analyzing the first code word $XX_0$ and the corresponding error locator polynomials $\Lambda_{0,m}$ for all modes m∈ M, where M is a given set of candidate modes.

First all modes are removed from M for which either
- the error locator polynomial $\Lambda_{0,m}$ is not valid, or
- the risk value exponent $\in_{0,m}$ as specified in Table 2 is larger than −8.

The set of remaining modes is denoted $M_1$.

If $M_1$ is empty the CMR estimate XNI is set to $$XNI = \text{bit}_2(XX_0(7)) + 2\ \text{bit}_0(XX_0(8)) + 8,$$

where the summand 8 indicates that this value is not validated.

If $M_1$ is not empty then let m denote the element of $M_1$ for which the risk value exponent $\in_{0,m}$ is minimal (note that such a mode typically exists since $\in_{0,1}$ and $\in_{0,2}$ cannot both have value −8 by design of the signalling sequences). Then, error correction is performed on $XX_0$ according to clause 1.5.5 with $n_{fec}$=m and the CMR estimate is derived from the corrected code word $XX_0^c$ as either $$XNI = \text{bit}_2(XX_0^c(7)) + 2\ \text{bit}_0(XX_0^c(8)) + 4$$

if $\in_{0,m} \geq -16$, where the summand 4 indicates that the CMR was validated with medium high confidence, or $$XNI = \text{bit}_2(XX_0^c(7)) + 2\ \text{bit}_0(XX_0^c(8))$$

if $\in_{0,m} \leq -16$ indicating that the CMR value was validated with high confidence.

1.5.5 Error Correction

Full error correction is carried out only upon successful mode detection. In this case the error positions for $n_{n_{fec},i,k}$ for the first 6 codewords were already computed in clause 1.5.3.2. Error correction may also be carried out only for the first code word for CMR recovery. In this case the following steps are only carried out for i=0.

The code words $XX_i$ with i≤5 are corrected by calculating the error symbols $\in_{i,k}$ according to clause 1.5.5.3 with $$d = \deg(\Lambda_{i,n_{fec}})$$

$$\sigma_k = S_k^{(i)} + \sum_{l=0}^{13}\left[sig_{n_{fec}}(l)\right]\alpha^{kl},$$

$S_k^{(i)}$ being defined as in clause 1.5.3.2, and $$v_k = n_{n_{fec},i,k}.$$

The corrected code words are then defined by $$XX_i^c(k) = \begin{cases} bitxor(XX_i(k), <\varepsilon_{i,l}>) & k = v_l \text{ for some } l \\ XX_i(k) & \text{else,} \end{cases}$$

where <.> is the inverse data-to-symbol mapping specified in clause 1.4.3.

For the remaining code words with index i>5 error correction is performed by carrying out the usual steps:

1. syndromes are calculated according to $$\sigma_k = \sum_{l=0}^{L_i-1} [XX_i(l)] \, \alpha^{kl} \quad k=1..2tt := \frac{d_{i,n_{fec}}-1}{2} \quad k=1..2tt := \frac{d_{i,n_{fec}}-1}{2}$$

for with.

$$k=1..2tt := \frac{d_{i,n_{fec}}-1}{2}$$

2. If all syndromes are zero, the code word is presumed error free, and thus the corrected code word $XX_i^c$ is set to $XX_i$.
3. Otherwise, the error locator polynomial $\Lambda(y)$ is calculated according to clause 1.5.5.1.1.
4. Upon success (i.e. $\Lambda(y) \ne [0]$), error positions $v_k$, $k=0 \ldots d_i-1$ with $d_i:=\deg(\Lambda(y))$, are calculated according to clause 1.5.5.2.
5. Upon success, error symbols $\in_{i,k}$, $k=0 \ldots d_i-1$, are calculated according to clause 1.5.5.3 and error correction is performed according to $$XX_i^c(k) = \begin{cases} bitxor(XX_i(k), \langle \varepsilon_{i,l} \rangle) & k = v_l \text{ for some } l \\ XX_i(k) & \text{else.} \end{cases}$$

If error correction fails for an index $i < N_{cw} - N_{pccw}$, i.e. one of the steps 3, 4 or 5 failed, the bad frame indicator bfi is set to 1, error_report is calculated as specified below and channel decoding is terminated.

For indices $i \ge N_{cw} - N_{pccw}$ a sequence $T(N_{cw} - N_{pccw} \ldots N_{cw}-1)$ is defined as follows. If error correction fails for an index $i \ge N_{cw} - N_{pccw}$ or if the risk value exponent $\in_{i,m}$ as specified in Table is larger than $-16$ the value $T(i)$ is set to 0, indicating that the data in code word $XX_i$ is not reliable without further validation. If error correction fails, the corrected code word $XX_i^c$ is nevertheless defined to be $XX_i$ but the first bad frame indicator $bfi_0$ is set to 2.

The value of error_report is set as follows. If error correction failed for an index $i < N_{cw} - N_{pccw}$ then let $i_1$ denote the smalles index for which it failed and set $I = \{0, \ldots, i_1-1\}$. Otherwise let I denote the set of all indices $0 < i < N_{cw}$ for which error correction succeeded. The value of error_report is then calculated as $$\sum_{i \in I} \sum_{j=0}^{d_i} bit_0(\langle \varepsilon_{i,j} \rangle) + bit_1(\langle \varepsilon_{i,j} \rangle) + bit_2(\langle \varepsilon_{i,j} \rangle) + bit_3(\langle \varepsilon_{i,j} \rangle)$$

that is the total number of bits corrected in code words $XX_i$ with $i \in I$.

If $N_s=40$ the number of bit correction is artificially reduced to increase error detection. If all code words have been corrected successfully first bad frame indicator is set depending on a mode dependent error threshold $emax_m$ given by $$emax_m := \begin{cases} 3 & m=1 \\ 9 & m=2 \\ 18 & m=3 \end{cases}.$$

If error_report $\le emax_{n_{fec}}$ the first bad frame indicator $bfi_0$ is set to 0 and otherwise it is set to 1.

If $N_s > 40$ and all code words have been corrected successfully, then first bad frame indicator $bfi_0$ is set to 0.

1.5.5.1.1 Calculation of Error Locator Polynomials

The error locator polynomial is calculated from a sequence $\sigma_k$, $k=1 \ldots 2t$, of symbols in GF(16), where t is a number from 1 to 3.

If $\sigma_k=[0]$ for $k=1 \ldots 2t$, the error locator polynomial $\Lambda(y)$ is set to [1].

Otherwise, the determinants of matrices $M_l$ are calculated for $l=1 \ldots t$, where $$M_1 := (\sigma_1)$$

$$M_2 := \begin{pmatrix} \sigma_1 & \sigma_2 \\ \sigma_2 & \sigma_3 \end{pmatrix}$$

$$M_3 := \begin{pmatrix} \sigma_1 & \sigma_2 & \sigma_3 \\ \sigma_2 & \sigma_3 & \sigma_4 \\ \sigma_3 & \sigma_4 & \sigma_5 \end{pmatrix}$$

and $\det(M_1) = \sigma_1$ $\det(M_2) = \sigma_1 \sigma_3 + \sigma_2^2$ $\det(M_3) = \sigma_1 \sigma_3 \sigma_5 + \sigma_1 \sigma_4^2 + \sigma_2^2 \sigma_5 + \sigma_3^3.$ If all determinants are [0] for $l=1 \ldots t$ the error locator polynomial $\Lambda(y)$ is set to [0], which is a non-valid error locator polynomial in the sense of 1.5.5.2.

Otherwise, take $\tau$ to be the largest index from 1 to t such that $\det(M_\tau) \ne 0$. Then the coefficients of the error locator polynomial are computed as $$\begin{pmatrix} \lambda_\tau \\ \vdots \\ \lambda_1 \end{pmatrix} := M_\tau^{-1} \begin{pmatrix} \sigma_{\tau+1} \\ \vdots \\ \sigma_{2\tau} \end{pmatrix},$$

where the inverse matrices are given by $$M_1^{-1} := (\sigma_1^{-1})$$

$$M_2^{-1} := \det(M_2)^{-1} \begin{pmatrix} \sigma_1 & \sigma_2 \\ \sigma_2 & \sigma_3 \end{pmatrix}$$

$$M_3^{-1} := \det(M_3)^{-1} \begin{pmatrix} \sigma_3 \sigma_5 + \sigma_4^2 & \sigma_2 \sigma_5 + \sigma_3 \sigma_4 & \sigma_2 \sigma_4 + \sigma_3^2 \\ \sigma_3 \sigma_4 + \sigma_2 \sigma_5 & \sigma_1 \sigma_5 + \sigma_3^2 & \sigma_1 \sigma_4 + \sigma_2 \sigma_3 \\ \sigma_2 \sigma_4 + \sigma_3^2 & \sigma_2 \sigma_5 + \sigma_3 \sigma_4 & \sigma_1 \sigma_3 + \sigma_2^2 \end{pmatrix}.$$

If $\Lambda_\tau=[0]$, the error locator polynomial is set to [0]. Otherwise, if $\tau=t$, the error locator polynomial is set to $\Lambda(y)[1]+\lambda_1 y + \ldots + \lambda_\tau y^\tau$ and if $\tau < t$ it is further tested whether $$\sum_{l=1}^{\tau} \sigma_{\tau+k+n} \, \lambda_{\tau-k+1} = \sigma_{2\tau+n+1}$$

holds for n=0 ... 2(t−τ)−1. If all these equalities hold, then the error locator polynomial is set to $$\Lambda(y):=[1]+\lambda_1 y+\ldots+\lambda_\tau y^\tau.$$

Otherwise, it is set to [0].

1.5.5.2 Calculation of Error Positions

Error positions are calculated from the error locator polynomial $$\Lambda(y):=[1]+\lambda_1 y+\ldots+\Lambda_d y^d.$$

The error locator polynomial is said to be valid, if it admits a representation $$\Lambda(y)=\prod_{k=0}^{t-1}(y+\alpha^{-n_k}), \text{ where } 0\le n_k<L_i \text{ and } n_k\ne n_l \text{ for } k\ne l,$$

in which case the error positions are given by $n_k$ for k=0 ... d−1. Otherwise, the list of error positions is empty.

The values $n_k$ can be determined by testing $\Lambda(\alpha^{-n})=0$ for n=0 ... $L_i$−1. Alternatively, tabulation of error locations indexed by $\lambda_i$ is possible and might be considerably faster.

1.5.5.3 Calculation of Error Symbols

Error symbols are calculated from syndromes $\sigma_1,\ldots,\sigma_d$ and error positions $v_0,\ldots,v_{d-1}$ by solving the linear system $$A_d(v_0,\ldots,v_{d-1})\begin{pmatrix}\varepsilon_0\\\vdots\\\varepsilon_{d-1}\end{pmatrix}=\begin{pmatrix}\sigma_1\\\vdots\\\sigma_d\end{pmatrix}$$

over GF(16), where $A_d(v_0,\ldots,v_{d-1})$ are the Vandermonde matrices $$A_1(v_0):=(\alpha^{v_0}),$$

$$A_2(v_0,v_1):=\begin{pmatrix}\alpha^{v_0}&\alpha^{v_1}\\\alpha^{2v_0}&\alpha^{2v_1}\end{pmatrix},$$

and $$A_3(v_0,v_1,v_2):=\begin{pmatrix}\alpha^{v_0}&\alpha^{v_1}&\alpha^{v_2}\\\alpha^{2v_0}&\alpha^{2v_1}&\alpha^{2v_2}\\\alpha^{3v_0}&\alpha^{3v_1}&\alpha^{3v_2}\end{pmatrix}.$$

The matrix inverses are given by $$A_1^{-1}(v_0)=(\alpha^{-v_0})$$

$$A_2^{-1}(v_0,v_1)=\det(A_2(v_0,v_1))^{-1}\begin{pmatrix}\alpha^{v_1}&\alpha^{v_1}\\\alpha^{2v_0}&\alpha^{v_0}\end{pmatrix},$$

and $$A_3^{-1}(v_0,v_1,v_2)=\det(A_3(v_0,v_1,v_2))^{-1}$$

$$\begin{pmatrix}\alpha^{2v_1+3v_2}+\alpha^{2v_2+3v_1}&\alpha^{v_1+3v_2}+\alpha^{v_2+3v_1}&\alpha^{v_1+2v_2}+\alpha^{v_2+2v_1}\\\alpha^{2v_0+3v_2}+\alpha^{2v_2+3v_0}&\alpha^{v_0+3v_2}+\alpha^{v_2+3v_0}&\alpha^{v_0+2v_2}+\alpha^{v_2+2v_0}\\\alpha^{2v_0+3v_1}+\alpha^{2v_1+3v_0}&\alpha^{v_0+3v_1}+\alpha^{v_1+3v_0}&\alpha^{v_0+2v_1}+\alpha^{v_1+2v_0}\end{pmatrix}$$

with $$\det(A_2(v_0,v_1))=\alpha^{v_0+2v_1}+\alpha^{v_1+2v_0}$$

and $$\det(A_3(v_0,v_1,v_2))=\alpha^{v_0+2v_1+3v_2}+\alpha^{v_1+2v_2+3v_0}+$$
$$\alpha^{v_2+2v_0+3v_1}+\alpha^{v_0+2v_2+3v_1}+\alpha^{v_1+2v_0+3v_2}+\alpha^{v_2+2v_1+3v_0}.$$

1.5.6 De-Coloration and RS Decoding

De-coloration according to the detected FEC mode $n_{fec}$ is done by applying the corresponding signaling sequence from clause 1.4.4, giving rise to de-colorated code words $$X_i(k):=\begin{cases}bitxor\left(XX_i^c(k),sig_{n_{fec}}(k)\right)&i<6\\XX_i^c(k)&\text{else.}\end{cases}$$

Then, redundancy decoding is applied according to mode $n_{fec}$ producing the data words $$W_i(0\ldots L_i-d_{i,n_{fec}}):=X_i(d_{i,n_{fec}}-1\ldots L_i-1)$$

which are combined into the data sequence $z_{pp}(0\ldots N_p-1)$, with $N_p$ as specified in clause 1.3.7 with m=$n_{fec}$, according to $$z_{pp}(S_i\ldots S_i+L_i-d_{i,n_{fec}}):=W_i(0\ldots L_i-d_{i,n_{fec}})$$

for i=0 ... $N_{cw}$−1, where the split points $S_i$ are as defined in clause 1.4.3. This yields a sequence of length 2($N_p$+$N_{CRC1}$+$N_{CRC2}$). After RS redundancy decoding the FEC decoder proceeds to clause 1.5.7 Data Post-Processing.

1.5.7 Data Post-Processing

Data post-processing consists of hash removal and validation, and CMR extraction. The sequence $z_{pp}$ from clause 1.5.6 is expanded into the corresponding bit sequence $y_{pp}$ from which the sequence $y_{pp0}$ is derived by reversing the bit swap from clause 1.4.2, i.e. swapping bits at positions $8N_{CRC1}$−2 and k:=4(7−$d_{0,n_{fec}}$+1)+2 and bits at positions $8N_{CRC1}$−2 and k+2.

The sequence $y_{pp0}$ is then split into sequences $i_{n1}$, $i_{n2}$, $Y_{n1ext}$, and $y_{n2}$, corresponding to sequences $r_{n1}$, $r_{n2}$, $b_{n1ext}$, and $b_{n2}$ from clause 1.4.2, given by $$i_{n1}(0\ldots 8N_{CRC1}-3):=y_{pp0}(0\ldots 8N_{CRC1}-3),$$

$$i_{n2}(0\ldots 8N_{CRC2}-1):=y_{pp0}(8N_{CRC1}\ldots 8(N_{CRC1}+N_{CRC2})-1),$$

$$y_{n1ext}(0\ldots 1):=y_{pp0}(8N_{CRC1}-3\ldots 8N_{CRC1}-1),$$

$$y_{n1ext}(2\ldots 8N_p-4N_{pc}+1):=y_{pp0}(8(N_{CRC1}+N_{CRC2})\ldots 8(N_{CRC1}+N_{CRC2}+N_p)-4N_{pc}-1,$$

and $$y_{n2}(0\ldots 4N_{pc}-1):=y_{pp0}(8(N_{CRC1}+N_{CRC2}+N_p)-4N_{pc}\ldots 8(N_{CRC1}+N_{CRC2}+N_p)).$$

The two cyclic redundancy checks (CRC) are carried out on $y_{n1ext}$ and $y_{n2}$ are carried out by re-calculating the hash sequences specified in clause 1.4.2.

If the calculated $8N_{CRC1}$−2 bit redundancy sequence for $y_{n1ext}$ specified in clause 1.4.2 does not match $i_{n1}$ the bad frame indicator bfi is set to one and the CMR is estimated according to clause 1.5.4 with M={$n_{fec}$}. Otherwise, the CMR estimate is set to $$XNI=y_{n1ext}(0)+2y_{n1ext}(1).$$

If the first CRC is passed and if $bfi_0 \ne 2$, the second CRC is carried out calculating the $8N_{CRC2}$ hash sequence for $y_{n2}$ as specified in clause 1.4.2. If the result does not match the sequence $in_2$ the bad frame indicator bfi is set to 2, indicating the loss of partial concealment data. If the first CRC is passed and $bfi_0=2$ then bfi is set to 2 without carrying out the second CRC.

If both CRCs are passed, the bad frame indicator bfi is set to 0, indicating that the decoded data is valid.

If bfi=2, the position fbcwbp of the first potentially corrupted bit in the partial concealment block is determined from the sequence $T(N_{cw}-N_{pccw} \ldots N_{cw}-1)$ from clause 1.5.5 in the following way.

If no index i exists such that $N_{cw}-N_{pccw} \leq i < N_{cw}$ and such that $T(i)=1$ or if $T(N_{cw}-1)=0$ then fbcwbp is set to 0. Otherwise, let $i_0$ denote the largest index such that $T(i)=1$ for $i_0 \leq i < N_{cw}$. Then fbcwbp is calculated as $$fbcwbp = 4 \sum_{i=i_0}^{N_{cw}-1} L_i - d_{i,n_{fec}} + 1.$$

If bfi≠1 the output data is $z_{dat}$ is generated by reversing the pre-processing steps from clause 1.4.2 by setting $$y_{n1}(0 \ldots 8N_p-4N_{pc}-1) y_{n1ext}(2 \ldots 8N_p-4N_{pc}+1),$$

$$z_{n1}(k)=y_{n1}(4k)+2y_{n1}(4k+1)+4y_{n1}(4k+2)+8y_{n1}(4k+2)$$

for $k=0 \ldots 2N_p-N_{pc}-1$, $$z_{n2}(k)=y_{n2}(4k)+2y_{n2}(4k+1)+4y_{n2}(4k+2)+8y_{n2}(4k+2)$$

for $k=0 \ldots N_{pc}-1$, $$z_n(0 \ldots 2N_p-N_{pc}-1):=z_{n1},$$

$$z_n(2N_p-N_{pc} \ldots 2N_p-1):=z_{n2},$$

and $$z_{dat}(k):=z_n(2N_p-2k-1)+16z_n(2N_p-2k-2)$$

for $k=0 \ldots N_p-1$.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, one or more of the most important method steps may be executed by such an apparatus.

The inventive data stream can be stored on a digital storage medium or can be transmitted on a transmission medium such as a wireless transmission medium or a wired transmission medium such as the Internet.

Depending on certain implementation requirements, embodiments of the application can be implemented in hardware or in software. The implementation can be performed using a digital storage medium, for example a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present application can be implemented as a computer program product with a program code, the program code being operative for performing one of the methods when the computer program product runs on a computer. The program code may, for example, be stored on a machine readable carrier.

Other embodiments comprise a computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further embodiment of the inventive method is, therefore, a data stream or a sequence of signals representing the computer program for performing one of the methods described herein. The data stream or the sequence of signals may, for example, be configured to be transferred via a data communication connection, for example via the internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are advantageously performed by any hardware apparatus.

The apparatus described herein may be implemented using a hardware apparatus, or using a computer, or using a combination of a hardware apparatus and a computer.

The apparatus described herein, or any components of the apparatus described herein, may be implemented at least partially in hardware and/or in software.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. Channel decoder for channel decoding at least one transmitted code word, comprising:
    a colorator for applying at least one coloration sequence
       to the at least one transmitted code word or to an error corrected at least one transmitted code word to acquire at least one colored code word, wherein the coloration sequence is such that at least one bit of the code word is changed by the application of the at least one coloration sequence, and wherein the at least one coloration sequence is associated to a certain decoding mode as a specific coloration sequence;

a redundancy decoder for redundancy decoding the at least one colored code word to acquire a decoded output code word; and a decoding mode detector for generating a decoding mode indicator indicating the certain decoding mode to be used by the redundancy decoder to acquire the decoded output code word, wherein the decoding mode indicator is associated to the at least one coloration sequence as the specific coloration sequence used for the coloration of the transmitted code word, wherein the decoding mode detector is configured to store a candidate list indicating a predetermined number of candidate decoding modes, wherein one candidate decoding mode is indicated without any coloration sequence and the other respective candidate decoding modes are indicated in association with a coloration sequence, and to select one candidate decoding mode as a certain decoding mode to be used by the redundancy decoder to acquire the decoded output code word to be used, wherein the decoding mode detector is configured to perform a first decoding mode operation and a second decoding mode operation, wherein the decoding mode detector for performing the first decoding mode operation is configured to estimate the certain decoding mode being the candidate decoding mode without coloration sequence, to calculate syndromes of the code word, to check whether the calculated syndromes comprise value zero, when the calculated syndromes comprise value zero, to calculate a hash value of the transmitted code word, to compare the calculated hash value and a hash value comprised by the transmitted code word, and when the calculated hash value is equal to the comprised hash value, to generate the decoding mode indicator to indicate the candidate coding mode without coloration sequence as the certain decoding mode, or when the calculated hash value is different from the comprised hash value, to exclude the candidate decoding mode without coloration sequence from the candidate list, and to proceed further with the second decoding mode operation.

2. Channel decoder according to claim 1, wherein the decoding mode detector comprises, for performing the second decoding mode operation:

a syndrome calculator for calculating a syndrome for the at least transmitted code word, a syndrome colorator for applying a coloration sequence in association with the candidate decoding modes on the candidate list to acquire colored syndromes, wherein the syndrome colorator is configured to apply coloration sequences association with every candidate decoding mode on the candidate list to the syndrome, and a syndrome checker for testing whether colored syndromes comprise value zero to acquire a result of the syndrome check, wherein the decoding mode detector is configured to generate the decoding mode indicator based on the result of the syndrome check.

3. Channel decoder according to claim 2, wherein the decoding mode detector comprises, for performing the second decoding mode operation:

an error locator polynomial calculator for calculating an error locator polynomial based on the syndrome in every candidate decoding modes on the candidate list; and a risk value calculator for calculating a risk value of the transmitted code word in every candidate decoding mode on the candidate list based on the syndrome and the error locator polynomial, wherein the decoding mode detector is configured to generate the decoding mode indicator based on the risk value.

4. Channel decoder according to claim 3, wherein the decoding mode detector is configured to evaluate the risk value of the transmitted code word in every candidate decoding mode on the candidate list to compare to a predetermined threshold, and to exclude the candidate decoding mode from the candidate list, when the candidate decoding mode corresponding risk value is larger than the threshold.

5. Channel decoder according to claim 2, wherein the decoding mode detector is configured to select the candidate decoding mode as the certain decoding mode, the candidate decoding mode corresponds to the risk value comprising the smallest value, and to generate the decoding mode indicator indicating the certain decoding mode to be used by the redundancy decoder to acquire the decoded output code word.

6. Channel decoder according to claim 3, wherein the decoding mode detector comprises, for performing the second decoding mode operation:

an error position calculator for calculating an error position in the candidate decoding mode by factorizing the error location polynomial, wherein the decoding mode detector is configured to receive a result of the error location polynomial factorization and to generate the decoding mode indicator based on the result of the error location polynomial factorization.

7. Channel decoder according to claim 6, wherein the decoding mode detector is configured to exclude the candidate decoding mode from the candidate list, when a result of the error location polynomial factorization in the candidate decoding mode is not acquired.

8. Channel decoder according to claim 6, wherein the decoding mode detector is configured to generate the decoding mode indicator to instruct to select the candidate decoding mode in association with a result of the error location polynomial factorization.

9. Channel decoder according to claim 6, wherein the decoding mode detector comprises, for performing the second decoding mode operation:

an error symbol calculator for calculating an error symbol in the every candidate decoding mode based on the syndrome in the candidate decoding mode and the calculated error position in the same candidate decoding mode, wherein the decoding mode detector is configured to receive the error symbol of the transmitted code word in the selected candidate decoding mode, and to generate the decoding mode indicator comprising the error symbol of the transmitted code word.

10. Channel decoder according to claim 9, comprising:
an error corrector for correcting an error of the transmitted code word,
wherein the error corrector is configured to correct the error symbol indicated by the error symbol calculator.

11. Channel decoder according to claim 9, wherein
the decoding mode detector is configured to generate the decoding mode indicator indicating to mark a frame as a bad frame,
when all the candidate decoding modes are excluded from the candidate list, or
when an error symbol in the transmitted code word is not correctable.

12. Channel decoder according to claim 1, wherein the decoding mode detector is configured to provide the decoding mode indicator to the colorator and the redundancy decoder,
wherein the colorator is configured to select a coloration sequence indicated by the decoding mode indicator,
wherein the redundancy decoder is configured to select the certain decoding mode indicated by the decoding mode indicator.

13. Channel decoder according to claim 12, further comprising:
a de-multiplexer or de-interleaver for de-multiplexing or de-interleaving a received code word to acquire the at least one transmitted code word.

14. Channel decoder according to claim 12, further comprising:
a data combiner for combining a plurality of the decoded output code words to acquire an audio/video frame data.

15. Channel decoder according to claim 14, further comprising:
a post processer for determining a frame data to be outputted by re-calculating a hash value of the acquired audio/video frame to compare with a hash value comprised by the frame data.

16. Method for channel decoding at least one transmitted code word, comprising:
applying at least one coloration sequence to the at least one transmitted code word to acquire at least one colored code word, wherein the coloration sequence is such that at least one bit of the code word is changed by the application of the at least one coloration sequence, wherein the at least one coloration sequence is associated to a certain decoding mode,
redundancy decoding the at least one colored code word to acquire a decoded output code word,
generating a decoding mode indicator indicating a certain decoding mode to be used by the redundancy decoder to acquire the decoded output code word, wherein the decoding mode indicator is associated to the at least one coloration sequence used for the coloration of the colored code word,
storing a candidate list indicating a predetermined number of candidate decoding modes, wherein one candidate decoding mode is indicated without any coloration sequence and the other respective candidate decoding modes are indicated in association with a coloration sequence, and to select one candidate decoding mode as a certain decoding mode to be used by the redundancy decoder to acquire the decoded output code word to be used,
wherein determining process comprises a first decoding mode operation and a second decoding mode operation, wherein a first decoding mode operation comprises:
estimating the certain decoding mode being the candidate decoding mode without coloration sequence, calculating syndromes of the code word, checking whether the calculated syndromes comprise value zero, and when the calculated syndromes comprise value zero, calculating a hash value of the transmitted code word, comparing the calculated hash value and a hash value comprised by the transmitted code word,
wherein the determining process comprises:
receiving a result of the comparison between the calculated hash value and the comprised hash value,
when the calculated hash value is equal to the comprised hash value, generating the decoding mode indicator to indicate the candidate coding mode without coloration sequence as the certain decoding mode, or
when the calculated hash value is different from the comprised hash value, excluding the candidate decoding mode without coloration sequence from the candidate list, and to proceed further with the second decoding mode operation.

17. Method according to claim 16, wherein the second decoding mode operation comprises:
calculating a syndrome for the at least one transmitted code word,
applying a coloration sequence in association with the candidate decoding modes on the candidate list to acquire colored syndromes,
wherein the syndrome colorator is configured to apply colorator sequence association with every candidate decoding mode on the candidate list to the syndrome, and
testing whether colored syndromes comprise value zero to acquire a result of the syndrome check,
wherein the determining process comprises:
generating the decoding mode indicator based on the result of the syndrome check.

18. Non-transitory digital storage medium having a computer program stored thereon to perform the method for channel decoding at least one transmitted code word, said method comprising:
applying at least one coloration sequence to the at least one transmitted code word to acquire at least one colored code word, wherein the coloration sequence is such that at least one bit of the code word is changed by the application of the at least one coloration sequence, wherein the at least one coloration sequence is associated to a certain decoding mode,
redundancy decoding the at least one colored code word to acquire a decoded output code word,
generating a decoding mode indicator indicating a certain decoding mode to be used by the redundancy decoder to acquire the decoded output code word, wherein the decoding mode indicator is associated to the at least one coloration sequence used for the coloration of the colored code word,
storing a candidate list indicating a predetermined number of candidate decoding modes, wherein one candidate decoding mode is indicated without any coloration sequence and the other respective candidate decoding modes are indicated in association with a coloration sequence, and to select one candidate decoding mode as a certain decoding mode to be used by the redundancy decoder to acquire the decoded output code word to be used, wherein determining process comprises a first decoding mode operation and a second decoding mode operation, wherein a first decoding mode operation comprises:

estimating the certain decoding mode being the candidate decoding mode without coloration sequence, calculating syndromes of the code word, checking whether the calculated syndromes comprise value zero, and when the calculated syndromes comprise value zero, calculating a hash value of the transmitted code word, comparing the calculated hash value and a hash value comprised by the transmitted code word, wherein the determining process comprises:

receiving a result of the comparison between the calculated hash value and the comprised hash value, when the calculated hash value is equal to the comprised hash value, generating the decoding mode indicator to indicate the candidate coding mode without coloration sequence as the certain decoding mode, or when the calculated hash value is different from the comprised hash value, excluding the candidate decoding mode without coloration sequence from the candidate list, and to proceed further with the second decoding mode operation, when said computer program is run by a computer.

19. Data stream generated by a method for channel decoding at least one transmitted code word, said method comprising:

applying at least one coloration sequence to the at least one transmitted code word to acquire at least one colored code word, wherein the coloration sequence is such that at least one bit of the code word is changed by the application of the at least one coloration sequence, wherein the at least one coloration sequence is associated to a certain decoding mode, redundancy decoding the at least one colored code word to acquire a decoded output code word, generating a decoding mode indicator indicating a certain decoding mode to be used by the redundancy decoder to acquire the decoded output code word, wherein the decoding mode indicator is associated to the at least one coloration sequence used for the coloration of the colored code word, storing a candidate list indicating a predetermined number of candidate decoding modes, wherein one candidate decoding mode is indicated without any coloration sequence and the other respective candidate decoding modes are indicated in association with a coloration sequence, and to select one candidate decoding mode as a certain decoding mode to be used by the redundancy decoder to acquire the decoded output code word to be used, wherein determining process comprises a first decoding mode operation and a second decoding mode operation, wherein a first decoding mode operation comprises:

estimating the certain decoding mode being the candidate decoding mode without coloration sequence, calculating syndromes of the code word, checking whether the calculated syndromes comprise value zero, and when the calculated syndromes comprise value zero, calculating a hash value of the transmitted code word, comparing the calculated hash value and a hash value comprised by the transmitted code word, wherein the determining process comprises:

receiving a result of the comparison between the calculated hash value and the comprised hash value, when the calculated hash value is equal to the comprised hash value, generating the decoding mode indicator to indicate the candidate coding mode without coloration sequence as the certain decoding mode, or when the calculated hash value is different from the comprised hash value, excluding the candidate decoding mode without coloration sequence from the candidate list, and to proceed further with the second decoding mode operation.

* * * * *